(12) United States Patent
Shukuri

(10) Patent No.: US 7,067,875 B2
(45) Date of Patent: Jun. 27, 2006

(54) SEMICONDUCTOR INTEGRATED CIRCUIT DEVICE AND ITS MANUFACTURING METHOD

(75) Inventor: Shoji Shukuri, Koganei (JP)

(73) Assignee: Renesas Technology Corp., Tokyo (JP)

( * ) Notice: Subject to any disclaimer, the term of this patent is extended or adjusted under 35 U.S.C. 154(b) by 169 days.

(21) Appl. No.: 10/487,336

(22) PCT Filed: Apr. 24, 2002

(86) PCT No.: PCT/JP02/04080

§ 371 (c)(1),
(2), (4) Date: Feb. 20, 2004

(87) PCT Pub. No.: WO03/028112

PCT Pub. Date: Apr. 3, 2003

(65) Prior Publication Data

US 2004/0232471 A1    Nov. 25, 2004

(30) Foreign Application Priority Data

Sep. 20, 2001    (JP) .............................. 2001-287917

(51) Int. Cl.
*H01L 29/76* (2006.01)
*H01L 21/336* (2006.01)
(52) U.S. Cl. ...................... 257/332; 438/259; 438/267
(58) Field of Classification Search .................... None
See application file for complete search history.

(56) References Cited

U.S. PATENT DOCUMENTS 5,768,192 A    6/1998    Eitan ..................... 365/185.24

(Continued)

FOREIGN PATENT DOCUMENTS

JP    63-285966    11/1988

(Continued)

OTHER PUBLICATIONS

H. Takato et al., "High Performance CMOS Surrounding Gate Transistor (SGT) for Ultra High Density LSIs," ULSO Research Center, Toshiba Corp., Komukai, Saiwai-ku, Kawasaki Japan; 222-IEDM 88, pp. 222-225; 1988 IEEE, USA.

(Continued)

*Primary Examiner*—Chandra Chaudhari
(74) *Attorney, Agent, or Firm*—Antonelli, Terry, Stout and Kraus, LLP.

(57) ABSTRACT

A semiconductor integrated circuit device has a plurality of rows of pillars, each row being composed of semiconductor pillars and insulator pillars alternately arranged in one direction with no gap therebetween, a plurality of nonvolatile memory elements provided individually in the plurality of semiconductor pillars, the plurality of nonvolatile memory elements having control gate electrodes provided over side surfaces of said semiconductor pillars along the one direction via gate insulating films, drain regions provided in upper surface portions of the semiconductor pillars, and source regions provided in bottom surface portions of the semiconductor pillars, and lines including the respective control gate electrodes of the plurality of nonvolatile memory elements and provided along the one direction over the side surfaces of the rows of pillars along the one direction.

26 Claims, 45 Drawing Sheets

U.S. PATENT DOCUMENTS

| | | | |
|---|---|---|---|
| 5,882,994 A | 3/1999 | Araki et al. | 438/593 |
| 5,888,868 A | 3/1999 | Yamazaki et al. | 438/258 |
| 5,959,322 A | 9/1999 | Lee | 257/298 |
| 5,966,603 A | 10/1999 | Eitan | 438/258 |
| 6,011,725 A | 1/2000 | Eitan | 365/185.33 |
| 6,150,687 A * | 11/2000 | Noble et al. | 257/302 |
| 6,180,538 B1 | 1/2001 | Halliyal et al. | 438/769 |

FOREIGN PATENT DOCUMENTS

| | | |
|---|---|---|
| JP | 2-117175 | 5/1990 |
| JP | 6-13628 | 1/1994 |
| JP | 7-122653 | 5/1995 |
| JP | 9-97850 | 4/1997 |
| JP | 9-205187 | 8/1997 |
| JP | 10-229177 | 8/1998 |
| JP | 2001-24075 | 1/2001 |

OTHER PUBLICATIONS

Eitan, et al., "Can NROM, a 2 Bit, Trapping Storage NVM Cell, Give a Real Challenge to Floating Gate Cells", Extended Abstracts of the 1999 International Conference on Solid State Device and Materials, Tokyo, 1999, pp. 522-523.

Pein, et al., "A 3-D Sidewall Flash EPROM Cell and Memory Array", IEEE Electron Device Letters, vol. 14, No. 8, Aug. 1993, pp. 415-417.

* cited by examiner

FIG. 36
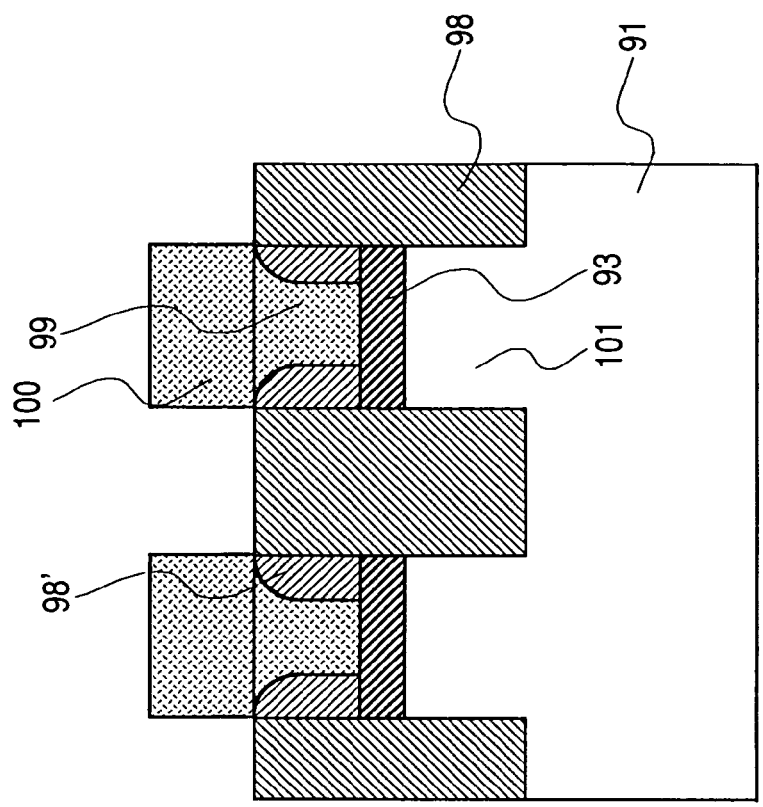
(a) C-C' CROSS SECTION
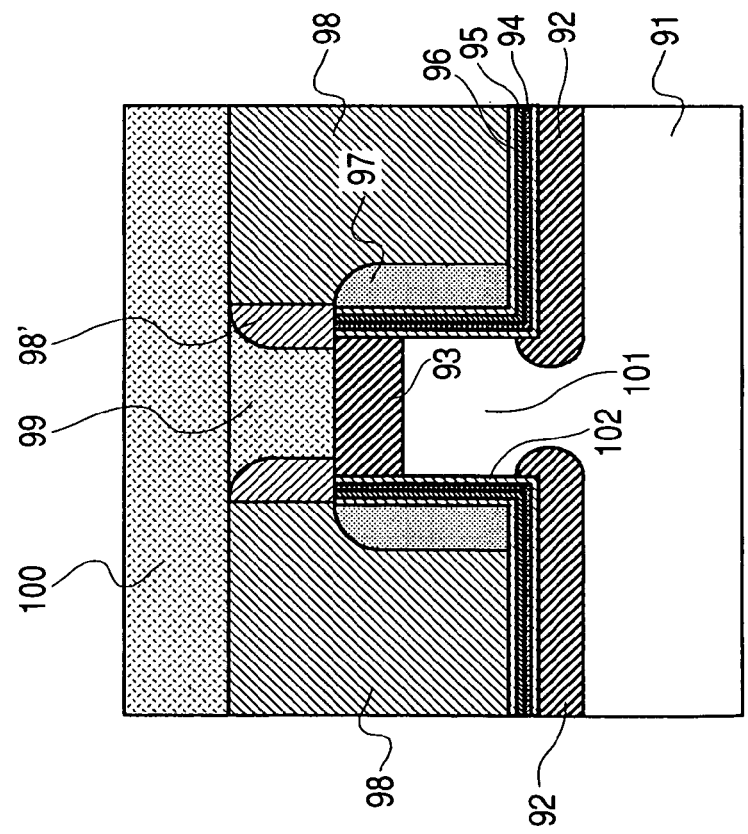
(b) D-D' CROSS SECTION

SEMICONDUCTOR INTEGRATED CIRCUIT DEVICE AND ITS MANUFACTURING METHOD

TECHNICAL FIELD

The present invention relates to a semiconductor integrated circuit device and its manufacture; and, more particularly, the present invention relates to a technique which is effective when applied to a semiconductor integrated circuit device having a nonvolatile memory element to which electrical erasing and writing of data can be performed.

BACKGROUND OF THE INVENTION

In recent years, a nonvolatile memory device called a flash EEPROM (Electrically Erasable Programmable Read Only Memory), in which data stored therein can be erased electrically simultaneously in specified units and in which data can be written electrically, has drawn increased attention as a memory device for storing data and data for program composition. The flash EEPROM (hereinafter referred to as a flash memory) has a memory cell composed of an electrically erasable and writable nonvolatile memory element, so that it is possible to erase data or data for program composition once written in the memory cell therefrom and rewrite (program) new data or data for program composition in the memory cell.

Conventionally, the accumulation of a charge in a flash memory has been performed by accumulating electrons in a floating gate electrode (floating gate electrode) that is composed of a polysilicon film and is electrically insulated from surrounding elements. This electron accumulating operation, i.e., a so-called write operation, is performed normally by injecting hot electrons, while an erase operation which releases the accumulated electrons to the outside of the floating gate electrode is performed by using a tunnel current passing through a gate oxide film. When the writing and erasing are repeated, a charge trap is formed in the gate oxide film so that the density of the surface states increases at the interface between the substrate and the gate oxide film. In particular, the former has the essential problem of degrading the charge retention property, i.e., the retention property after the rewriting.

As a method of eliminating the foregoing problem, a system has been proposed which uses a nonconductive charge trap film for charge accumulation in an EEPROM. Examples of such a system are disclosed in U.S. Pat. Nos. 5,768,192, 5,966,603, 6,011,725, and 6,180,538 and in "Can NROM, a 2-bit, Trapping Storage NVM Cell, Give a Real Challenge to Floating Gate Cell", B. Eitan et al., International Conference On Solid State Devices and Materials, Tokyo, 1999.

As shown in FIG. 39 (diagrammatic cross-sectional view of a cell), e.g., the system disclosed in U.S. Pat. No. 5,768,192 uses, as a gate insulating film, a multilayer film having a so-called ONO (Oxide/Nitride/Oxide) structure in which a silicon nitride film 113 is interposed between insulating films 112 and 114 each composed of a silicon oxide film or the like. The transistor is turned ON by applying 0 V to a source 117 and a proper positive voltage to each of a drain 116 and a control gate 115, whereby hot electrons generated in the vicinity of the drain 116 are injected such that the electrons are trapped in the silicon nitride film 113, and writing is performed. In this charge accumulating system, electron traps in the silicon nitride film 113 are discontinuous and discrete compared with those in a system which accumulates a charge in a polysilicon film which is a continuous conductive film. Accordingly, there is no situation in which the accumulated charge will entirely dissipate even when a charge leakage path, such as a pinhole, occurs in a part of the oxide film 112, so that the system features an inherently reliable retention property.

On the other hand, U.S. Pat. No. 6,011,725 discloses a so-called multi-valued cell technique which independently controls charge accumulation in two places in the vicinity of the drain 116 and in the vicinity of the source 117 by using the locality of hot electron injection and thereby implements 2-bit information in one cell, as shown in FIG. 40 (diagrammatic cross-sectional view of a cell).

A method of forming an ONO film is also disclosed in U.S. Pat. No. 5,966,603, which forms an ONO structure by, e.g., forming an ON multilayer film on a substrate, and then oxidizing an upper portion of a silicon nitride film, or, by forming an ONO multilayer film on a substrate, and then adding an oxidation step to introduce oxygen into the silicon nitride film, thereby improving the retention property of the memory cell.

A method of forming an ONO film by RTCVP (Rapid Thermal Chemical Vapor Deposition) is also claimed in U.S. Pat. No. 6,180,538, in which the temperature for the deposition of an oxide film is 700 to 800° C. and the thickness of the oxide film is 5 to 15 nm.

SUMMARY OF THE INVENTION

In the foregoing well-known example, such as disclosed in U.S. Pat. No. 5,966,603 or "Can NROM, a 2-bit, Trapping Storage NVM Cell, Give a Real Challenge to Floating Gate Cell", B. Eitan et al., International Conference on Solid State Devices and Materials, Tokyo, 1999, a cell mode of the virtual ground type is disclosed. In the arrangement of cells shown in each of FIG. 41 (diagrammatic plan view of a memory cell array portion), FIG. 42 (diagrammatic cross-sectional view along the direction of the gate length of a cell), and FIG. 43 (diagrammatic cross-sectional view along the direction of the gate width of a cell), diffusion layer regions composing the drain 116 and the sources 117 are arranged in stripes and oxide films 118 for retaining insulation from the control gate electrodes 115 are provided on the upper portions thereof, and the control gate electrode 115 are disposed in an orthogonal relation to the source/drain direction. The oxide films 112, the nitride films 113, and the oxide films 114 are disposed between the channel regions of a semiconductor substrate 111 interposed between the drain 116 and the sources 117 and the control gate electrodes 115. As shown in FIG. 41, the current path in write and read operations causes the adjacent diffusion layers to operate as the sources 117 and the drain 116, and a channel current in each of the cells flows in a direction parallel to the control gate electrodes 115. The area of the cell is designed such that the pitch of the sources/drain is double the minimum dimension F, and the pitch of the control gates is also double the minimum dimension F, i.e., $2F \times 2F = 4F^2$ is satisfied. For example, a 0.2-μm technology allows the implementation of an extremely small cell area of $4F^2 = 0.16$ μm$^2$.

However, the foregoing memory cells have several problems.

A first problem is that each of the conventional cells cannot be designed to allow a large read current. As shown in FIG. 41, the channel width W of the cell is defined by the width of each of the control gate electrodes 115, and the channel length L thereof is defined by the distance between the source 117 and the drain 116, so that a structural constant W/L determining the channel current becomes W/L=F/F=1, so that the read current does not increase even when the cell is miniaturized. Accordingly, the read current cannot increase unless other structural constants or the effective thickness of the multilayer film consisting of the oxide film 112, the nitride film 113, and the oxide film 114 is reduced. This causes the problems of deterioration of the access speed and a lowering of the margin for misoperation of a sense amplifier.

A second problem is the problem of so-called read disturb, which occurs when an increase in the read current is intended by increasing the control gate voltage during a read operation in an attempt to solve the first problem. As shown in FIGS. 42 and 43, this phenomenon is caused by the extraction of electrons trapped in the nitride film of a cell in a written state toward the control gate due to the control gate voltage when reading is performed with respect to the cell. This leads to a data inversion failure. The time period of the disturbance resulting from the extraction of the trapped electrons should be determined by assuming continuous reading over ten years at the maximum. By increasing the thickness of the oxide film 114 overlying the nitride film 113, the resistance to the disturbance can be enhanced, but the read current presenting the first problem is further reduced disadvantageously.

A third problem is that it is difficult to adjust the cell area to 4 $F^2$ or less because the control gate electrodes have been formed by patterning a conductive film by using an etching mask. As a result of examining well-known examples associated with this problem, it was found that Japanese Unexamined Patent Publication No. HEI 6(1994)-13628 discloses a technology related to a reduction in cell area. As described in the paragraph number [0020] of this publication, the technology disclosed in the publication "places a channel formation region between a source and a drain, which has been disposed conventionally in a two-dimensional orientation, in a vertical orientation and thereby reduces the area of the portion occupied conventionally. The fundamental of the present invention lies in the formation of a projecting portion on a semiconductor substrate, the use of the side surfaces thereof as channel formation regions, the use of the top portion thereof as one of impurity regions (source or drain), the provision of the other impurity regions at the bottom portions thereof, and the formation of gate electrodes on the side surfaces of the channel formation regions." It is also described in the paragraph number [0067] of this publication that "Thereafter, a coating 309 for forming gate lines (control gates) is formed . . . . After that, the coating 309 is removed by anisotropic etching except for the portion thereof covering the side surfaces of the projecting portion so that gate lines 310 are formed. It is to be noted that the gate lines extend along the side surfaces of the projecting portion. The present invention features the formation of the gate electrodes which does not involve a mask process." Therefore, the cell area can be adjusted to $4F^2$ or less by using the technology disclosed in this publication.

According to the technology disclosed in the above-referenced publication, however, a semiconductor is present in the isolation region of the projecting portion, since the formation of the isolation region of the projecting portion is performed by using an oxide film formed by a thermal oxidation process, and, in addition, the gate lines extend along the side surfaces of the projecting portion. Briefly, the isolation region of the projection has a MOS structure using a semiconductor in the isolation region of the projecting portion as a channel formation region, using the oxide film formed in the isolation region of the projecting portion as a gate insulating film, and using the gate line extending along the side surface of the projecting portion as a gate electrode. Consequently, if a voltage is applied to the gate line, a parasitic channel is formed in the side surface of the semiconductor in the isolation region of the projecting portion, and this causes a situation where electrical connection is provided disadvantageously between the respective channel formation regions of adjacent nonvolatile memory elements. Such a situation serves as a factor which causes a data erase failure, a data write failure, or a data read failure, so that the electric reliability of the flash memory is degraded.

It is therefore an object of the present invention to provide a semiconductor integrated circuit device which allows a significant increase in the read current for a nonvolatile memory using a nonconductive trap film as a charge accumulation region and allows the elimination of a read failure due to data inversion caused by a read disturb condition.

Another object of the present invention is to provide a device structure which allows easy reduction of the cell area of a nonvolatile memory using a nonconductive charge trap film as a charge accumulation region.

Still another object of the present invention is to provide a technology which allows an improvement in the electrical reliability of a semiconductor integrated circuit device having a nonvolatile memory element to which electrical writing and erasing of data can be performed.

The above and other objects and novel features of the present invention will become apparent from the description provided in the present specification and the accompanying drawings. The following is a brief description of representative aspects of the present invention disclosed in the present application.

(1) A semiconductor integrated circuit device comprising: a plurality of rows of pillars, each row being composed of semiconductor pillars and insulator pillars alternately arranged in one direction with no gap therebetween; a plurality of nonvolatile memory elements provided individually in the plurality of semiconductor pillars, the plurality of nonvolatile memory elements having control gate electrodes provided over side surfaces of the semiconductor pillars along the one direction via gate insulating films, drain regions provided in upper surface portions of the semiconductor pillars, and source regions provided in bottom surface portions of the semiconductor pillars; and lines including the respective control gate electrodes of the plurality of nonvolatile memory elements and provided along the one direction over the side surfaces of the rows of pillars along the one direction.

(2) A semiconductor integrated circuit device comprising electrically writable nonvolatile memory elements each having, in a semiconductor region: a source region; a drain region; a channel formation region interposed between the source region and the drain region; and a control gate electrode, wherein two of the channel formation regions are disposed independently over respective opposing side surfaces of each of rectangular-parallelepiped semiconductor pillars, the drain region connected to the two channel formation regions is formed in an upper portion of the rectangular-parallelepiped semiconductor pillar, isolation regions are disposed over side surface portions adjacent to the channel formation regions, a first insulating film is provided between each of the channel formation regions and the control gate electrode, a nonconductive charge trap film is provided over the first insulating film, and a second insulating film is provided over the nonconductive charge trap film.

(3) A semiconductor integrated circuit device as defined in the foregoing paragraph (2), wherein writing is performed by placing the source region at a ground potential, giving a proper positive potential to each of the drain region and the control gate electrode to turn ON the channel formation regions, and injecting hot electrons generated in the vicinity of the drain region such that the electrons are trapped in the nonconductive charge trap film and erasing is performed by giving a proper negative potential and a proper positive potential to the control gate electrode and the drain region, respectively, and thereby extracting the electrons trapped in the nonconductive charge trap film to the semiconductor region by using a tunnel current flowing in the first insulating film.

(4) A semiconductor integrated circuit device as defined in the foregoing paragraph (2), wherein the first insulating film is a silicon oxide film, the nonconductive charge trap film is a silicon nitride film, and the second insulating film is a silicon oxide film.

(5) A semiconductor integrated circuit device as defined in the foregoing paragraph (2), wherein the first insulating film is a silicon oxide film, the nonconductive charge trap film is a metal oxide film, and the second insulating film is a silicon oxide film.

(6) A semiconductor integrated circuit device comprising electrically writable nonvolatile memory elements each having, in a semiconductor region: a source region; a drain region; a channel formation region interposed between the source region and the drain region; and a control gate electrode, wherein two of the channel formation regions are disposed independently over respective opposing side surfaces of each of rectangular-parallelepiped semiconductor pillars, the drain region connected to the two channel formation regions is formed in an upper portion of the rectangular-parallelepiped semiconductor pillar, isolation regions are disposed over side surface portions adjacent to the channel formation regions, a first insulating film is provided between each of the channel formation regions and the control gate electrode, a semiconductor film is provided on the first insulating film, a nonconductive charge trap film is provided over the first insulating film, a second insulating film is provided over the nonconductive charge trap film, and electrons are trapped primarily in a charge trap level at an interface between the semiconductor film and the nonconductive charge trap film.

(7) A semiconductor integrated circuit device as defined in the foregoing paragraph (6), wherein writing is performed by placing the source region at a ground potential, giving a proper positive potential to each of the drain region and the control gate electrode to turn ON the channel formation regions, and injecting hot electrons generated in the vicinity of the drain region such that the electrons are trapped primarily in a charge trap level at an interface between the semiconductor film and the nonconductive charge trap film and erasing is performed by giving a proper negative potential and a proper positive potential to the control gate electrode and the drain region, respectively, and thereby extracting the trapped electrons to the semiconductor region by using a tunnel current flowing in the semiconductor film and the first insulating film.

(8) A semiconductor integrated circuit device as defined in the foregoing paragraph (6), the first insulating film is a silicon oxide film, the semiconductor film is a polysilicon film, the nonconductive charge trap film is a silicon nitride film, and the second insulating film is a silicon oxide film.

(9) A semiconductor integrated circuit device as defined in the foregoing paragraph (6), the first insulating film is a silicon oxide film, the semiconductor film is a polysilicon film, the nonconductive charge trap film is a metal oxide film, and the second insulating film is a silicon oxide film.

(10) A method for manufacturing a semiconductor integrated circuit device, the method comprising at least the steps of: alternately forming, over a semiconductor substrate, trenched isolation regions and semiconductor active regions in stripes, performing etching with respect to the semiconductor active regions and the trenched isolation regions in succession by using, as a mask, resist film patterns formed in stripes in directions orthogonal to the trenched isolation regions and semiconductor active regions in stripes to form rectangular-parallelepiped semiconductor pillars and rectangular-parallelepiped isolation regions; forming channel formation regions in respective side surface portions of each of the rectangular-parallelepiped semiconductor pillars, depositing a multilayer film composed of a first oxide film, a polysilicon film, a nitride film, and a second oxide film over each of the channel formation regions, and forming word lines composed of side spacers each made of a conductive film; and forming a drain region in an upper portion of each of the rectangular-parallelepiped semiconductor pillars.

(11) A method for manufacturing a semiconductor integrated circuit device, the method comprising at least the steps of: alternately forming, over a semiconductor substrate, trenched isolation regions and semiconductor active regions in stripes, performing etching with respect to the semiconductor active regions and the trenched isolation regions in succession by using, as a mask, resist film patterns formed in stripes in directions orthogonal to the trenched isolation regions and semiconductor active regions in stripes to form rectangular-parallelepiped semiconductor pillars and rectangular-parallelepiped isolation regions; forming channel formation regions in respective side surface portions of each of the rectangular-parallelepiped semiconductor pillars, depositing a multilayer film composed of a first oxide film, a polysilicon film, a nitride film, and a second oxide film over each of the channel formation regions, and forming word lines composed of side spacers each made of a conductive film; and forming a drain region in an upper portion of each of the rectangular-parallelepiped semiconductor pillars.

BRIEF DESCRIPTION OF THE DRAWINGS

FIG. 36(a) is a diagrammatic cross-sectional view taken along the line C–C' of FIG. 35, and FIG. 36(b) is a diagrammatic cross-sectional view taken along the line D—D of FIG. 35;

BEST MODE FOR CARRYING OUT THE INVENTION

Figure 1:
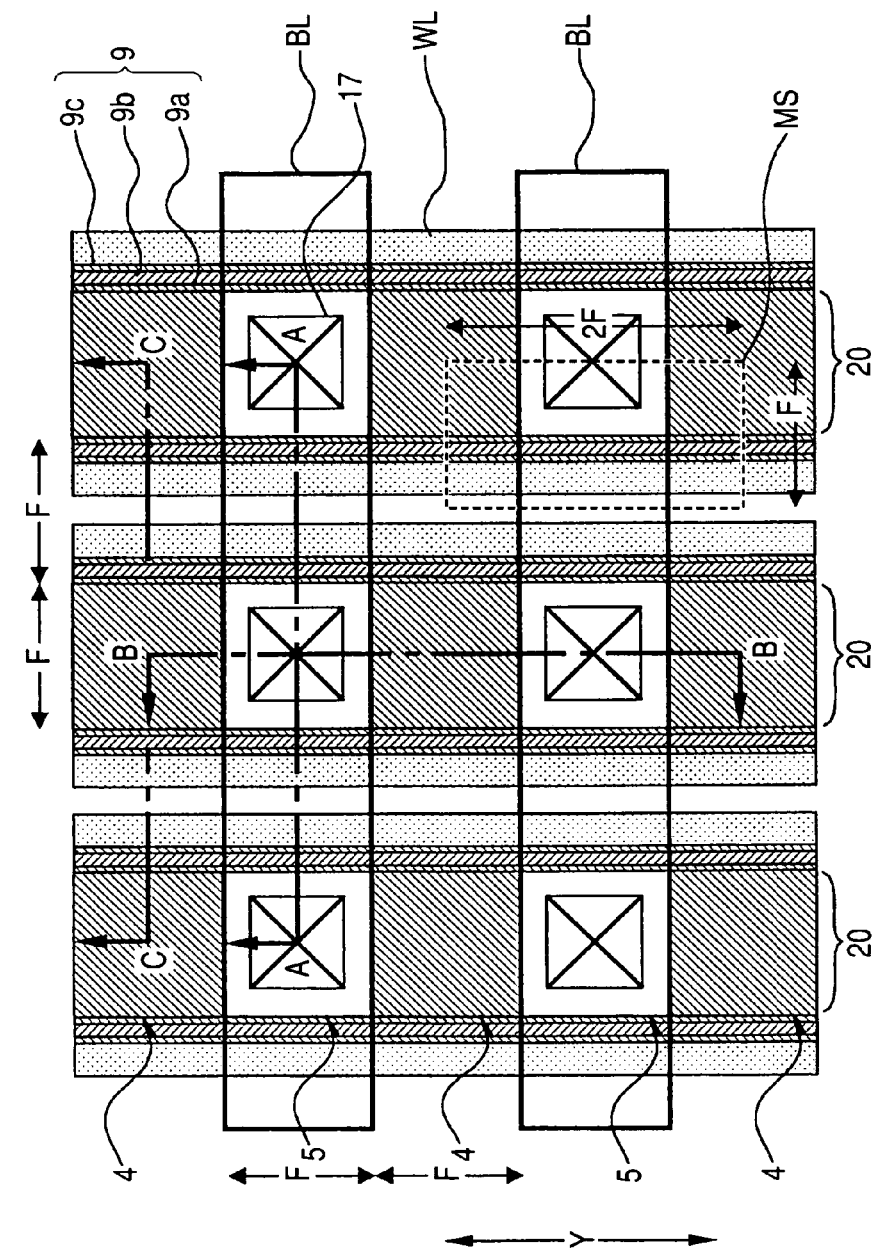
FIG. 1 is a diagrammatic plan view showing the structure of a memory cell array portion in a flash memory representing Embodiment 1 of the present invention.

Referring to the drawings, various embodiments of the present invention will be described in detail below. Throughout all of the drawings, parts having the same function are designated by the same reference numerals, and a repeated description thereof will be omitted.

EMBODIMENT 1

FIG. 1 is a diagrammatic plan view showing the structure of a memory cell array portion in a flash memory representing Embodiment 1 of the present invention.

Figure 2:
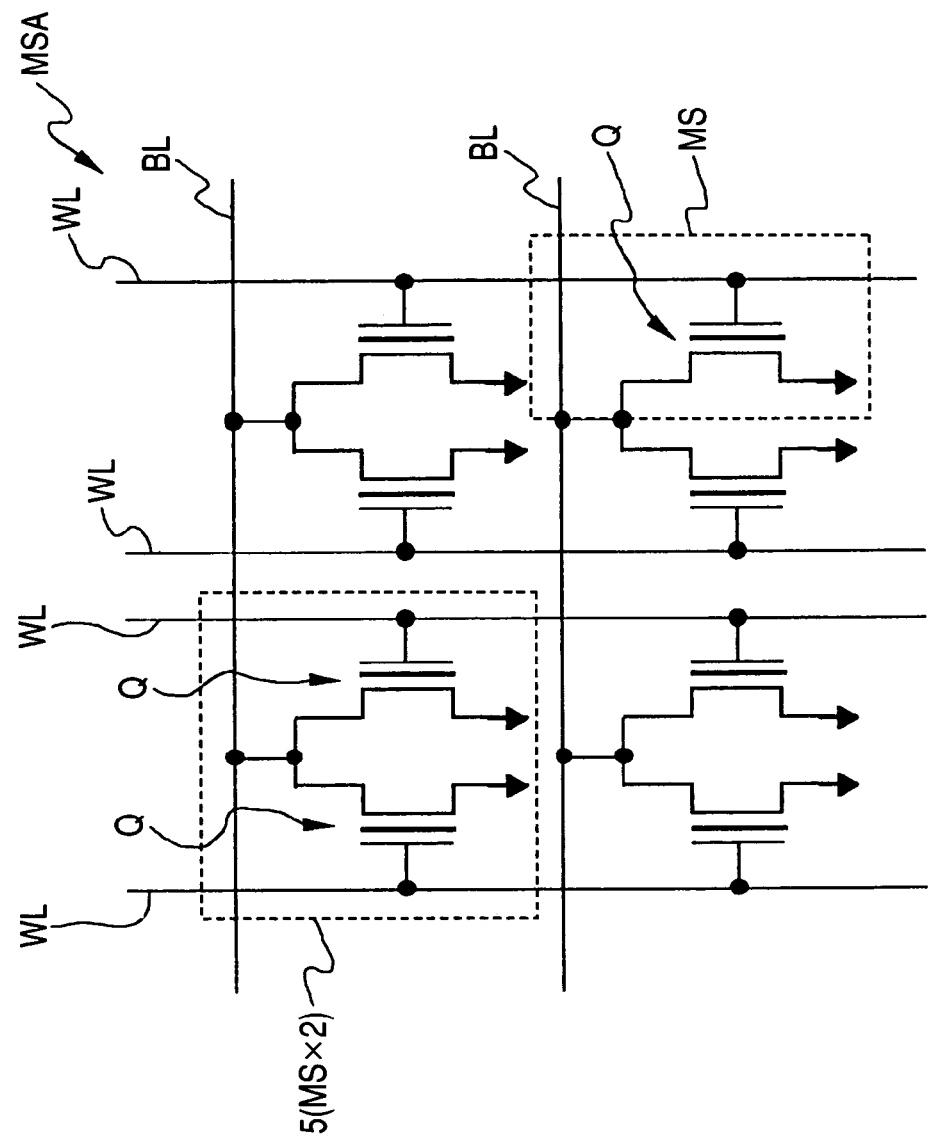
FIG. 2 is an equivalent circuit diagram of the memory cell array portion of FIG. 1.

FIG. 2 is an equivalent circuit diagram of the memory cell array portion of FIG. 1.

Figure 3:
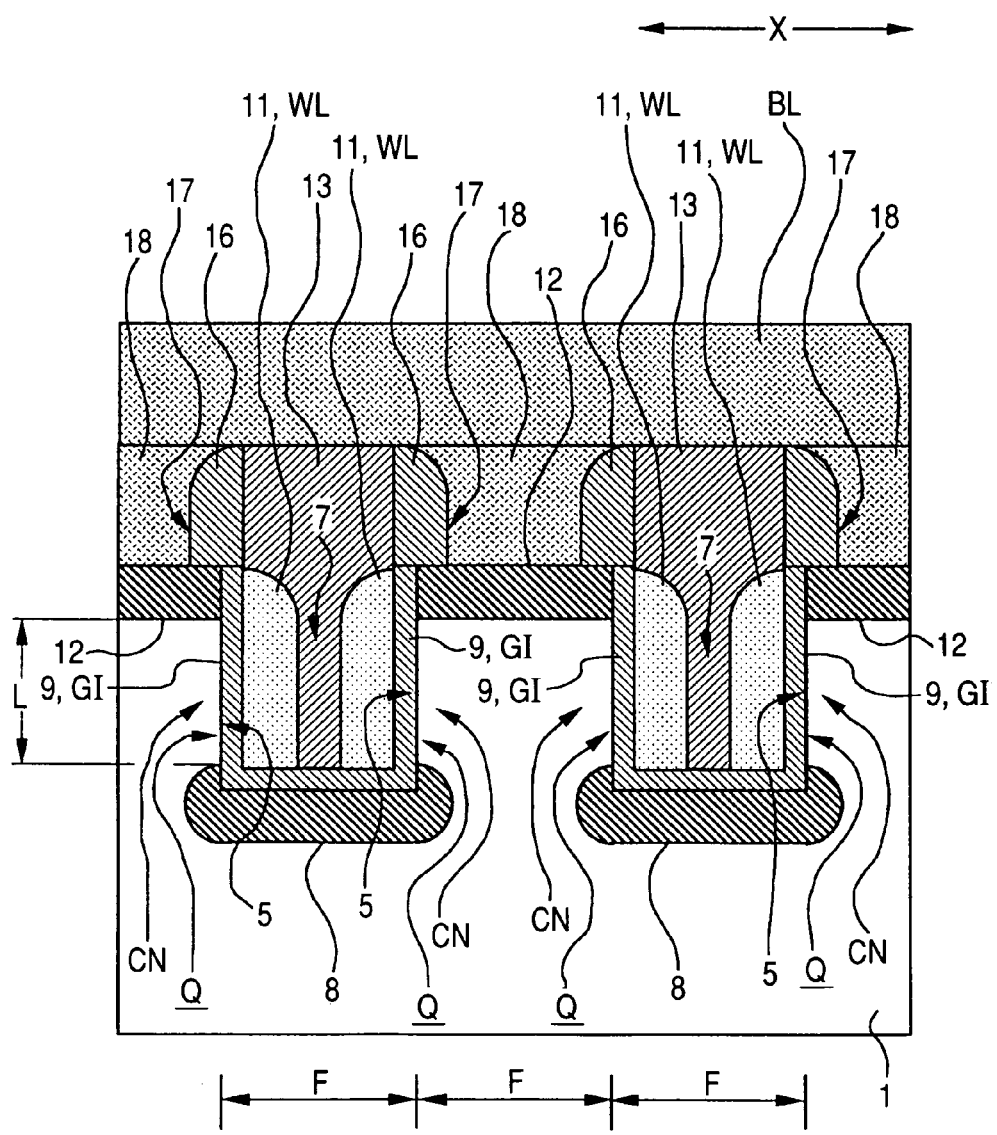
FIG. 3 is a diagrammatic cross-sectional view taken along the line A—A of FIG. 1.

FIG. 3 is a diagrammatic cross-sectional view taken along the line A—A of FIG. 1.

Figure 4:
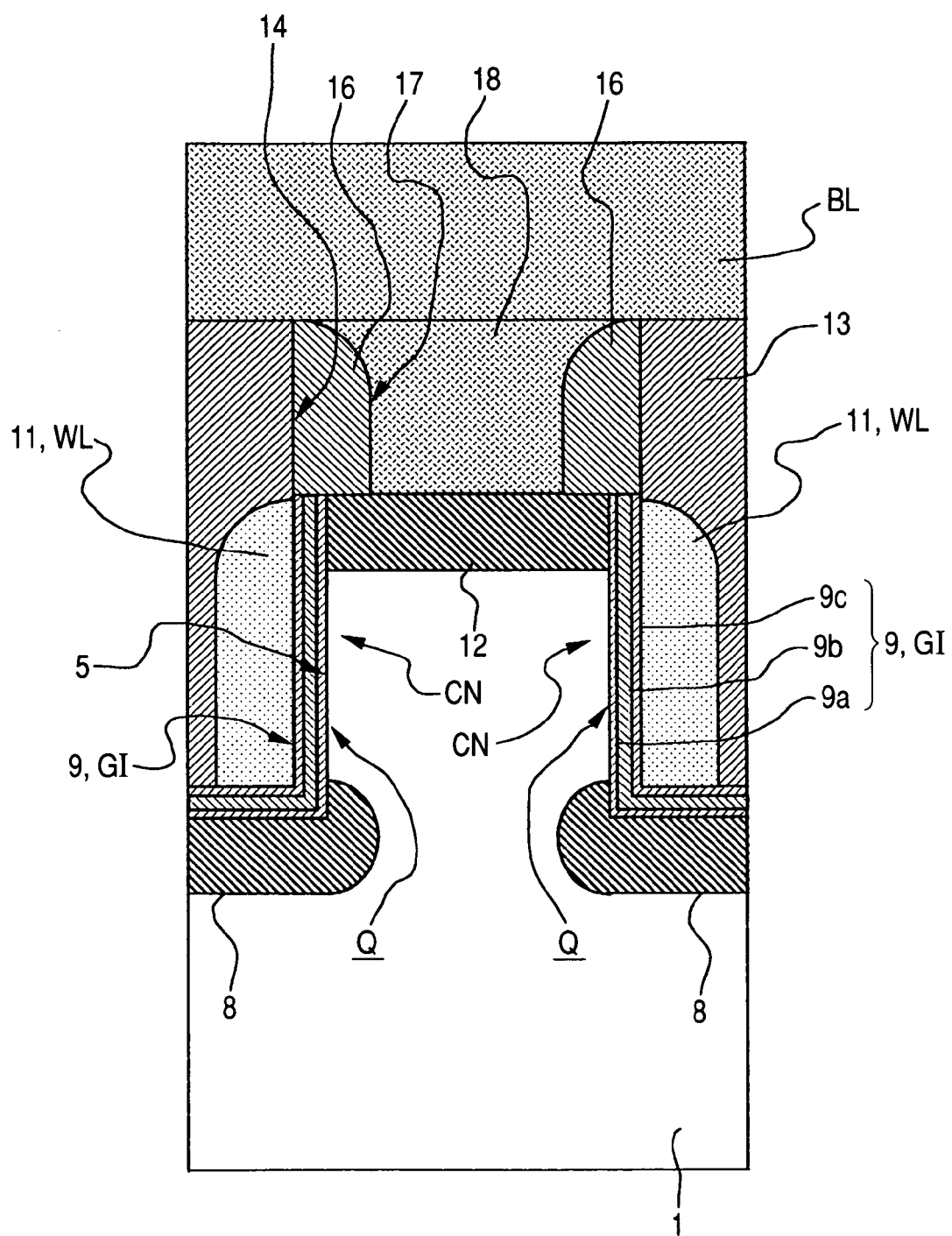
FIG. 4 is a diagrammatic cross-sectional view obtained by enlarging a part of FIG. 1.

FIG. 4 is a diagrammatic cross-sectional view obtained by enlarging a part of FIG. 1.

Figure 5:
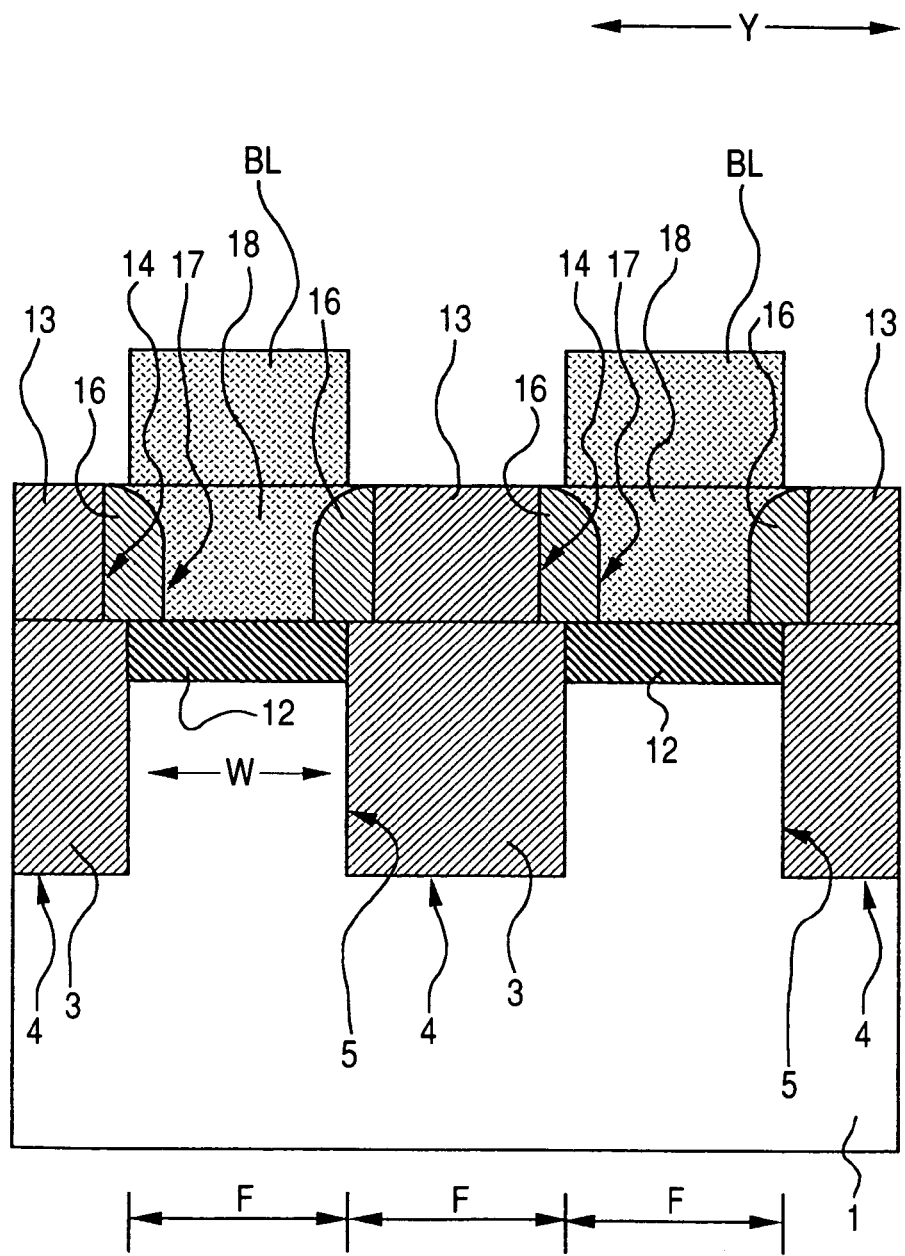
FIG. 5 is a diagrammatic cross-sectional view taken along the line B—B of FIG. 1.

FIG. 5 is a diagrammatic cross-sectional view taken along the line B—B of FIG. 1.

Figure 6:
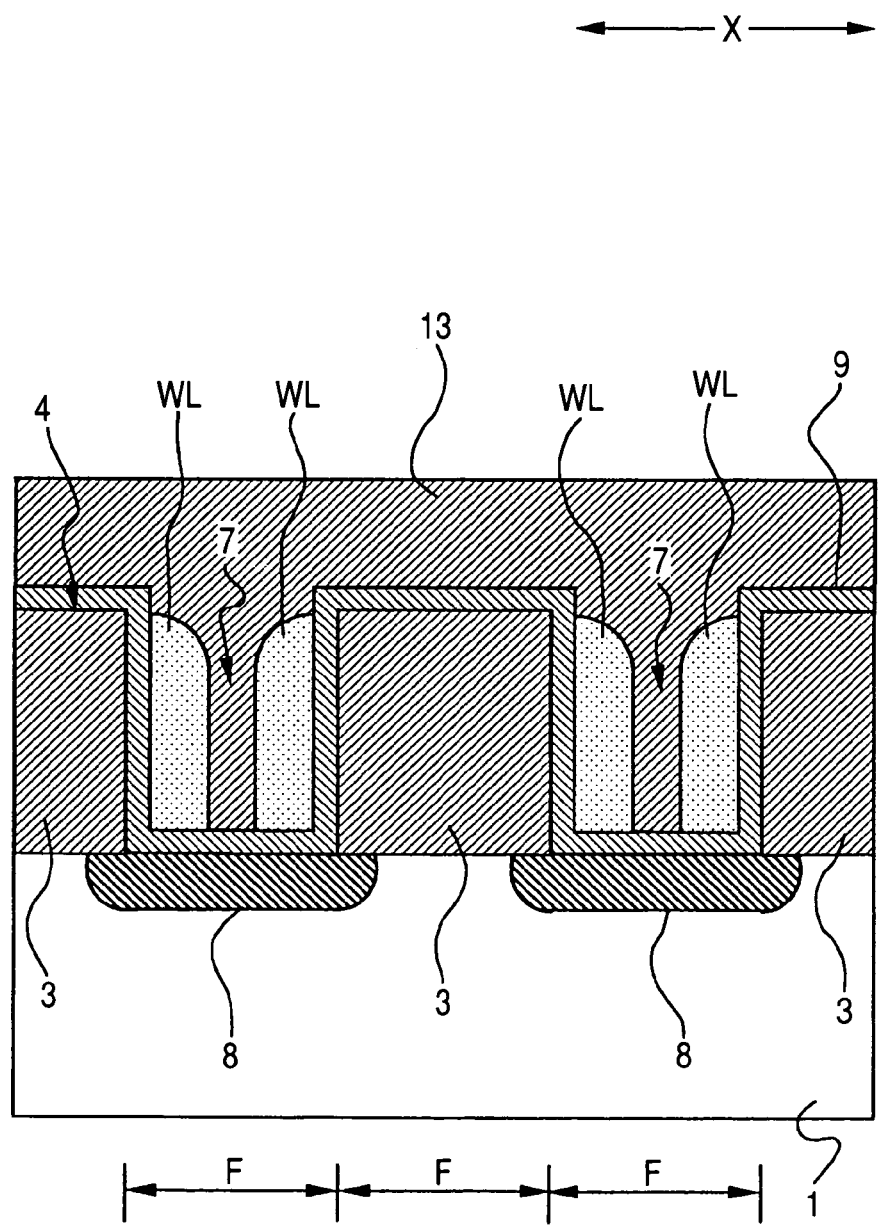
FIG. 6 is a diagrammatic cross-sectional view taken along the line C—C of FIG. 1.

FIG. 6 is a diagrammatic cross-sectional view taken along the line C—C of FIG. 1.

In the memory cell array portion MSA of the flash memory in the present embodiment, a plurality of word lines WL and a plurality of data lines BL extend, as shown in FIGS. 1 and 2. The plurality of word lines WL extend in the Y-direction and are arranged at a given spacing in the X-direction orthogonal to the Y-direction. The plurality of data lines BL extend in the X-direction and are arranged at a given spacing in the Y-direction. In the memory cell array portion, a plurality of memory cells MS, as shown in FIGS. 1 and 2, are arranged as a matrix (in the X- and Y-directions). In the memory cell array portion MSA, a plurality of rows of pillars 20 extending in the Y-direction are arranged at a given spacing in the X-direction.

As shown in FIGS. 1 to 6, the rows of pillars 20 are composed of a plurality of semiconductor pillars 5 and a plurality of insulator pillars 4 which are alternately arranged in the Y-direction with no gap therebetween. The semiconductor pillars 5 and the insulator pillars 4 are provided on a principal surface of a p-type semiconductor substrate 1 that is composed of, e.g., single-crystal silicon. The semiconductor pillars 5 and the insulator pillars 4 are formed primarily by performing a trenching process with respect to the semiconductor substrate 1, which process will be described later in detail. In the present embodiment, each of the semiconductor pillars 5 and the insulator pillars 4 is configured as, e.g., a rectangular parallelepiped. Each of the insulator pillars 4 is formed of, e.g., a silicon oxide film (insulating film) 3.

The memory cells MS are composed of nonvolatile memory elements Q formed in the individual semiconductor pillars 5. As shown in FIGS. 3 and 4, the nonvolatile memory elements Q are principally constructed to have channel formation regions CN, gate insulating films GI, control gate electrodes 11, source regions, and drain regions. The channel formation regions CN are provided in the side surfaces of the semiconductor pillars 5 along the Y-direction. The gate insulating films GI are provided on the channel formation regions CN (on the side surfaces of the semiconductor pillars 5). The control gate electrodes 11 are formed on the gate insulating films GI. The drain regions are provided in the upper surface portions of the semiconductor pillars 5, while the source regions are provided in the bottom surface regions of the semiconductor pillars 5.

Although the gate insulating films GI are not limited thereto, each of them is formed of a multilayer film 9 in which a silicon oxide film 9a, a silicon nitride film 9b, and a silicon oxide film 9c are stacked successively in layers on the side surface of the semiconductor pillar 5. The silicon nitride film 9b is a film for discretely accumulating charge therein. Accordingly, electron traps are formed discontinuously and discretely in the silicon nitride film 9b. Thus, each of the gate insulating films GI is composed of a multilayer film including a film for discretely accumulating a charge therein.

The control gate electrodes 11 are composed of parts of word lines WL extending along the side surfaces of the rows of pillars 20 along the Y-direction. The word lines WL have been formed by self alignment with the rows of pillars 20 and are processed into side spacers. Each of the word lines WL is formed of a polysilicon film into which, e.g., an impurity for reducing the resistance value (such as As) has been introduced.

The drain regions are composed of n-type semiconductor regions 12 provided in the respective upper surface portions of the semiconductor pillars 5, while the source regions are composed of n-type semiconductor regions 8 provided in the bottom surface portions of the semiconductor pillars 5. The n-type semiconductor regions 8 are provided in the bottom surface portions of trenches primarily defining the widths of the rows of pillars 20 in the X-direction to compose the source lines extending continuously along the Y-direction. In short, the source regions are composed of parts of the source lines extending continuously along the rows of pillars 20.

As shown in FIGS. 3 and 4, each of the semiconductor pillars 5 is provided with two nonvolatile memory elements Q. Of the two nonvolatile memory elements Q, one has the channel formation region CN thereof provided on one of the two opposing side surfaces of the semiconductor pillar 5, while the other nonvolatile memory element Q has the channel formation region CN thereof provided on the other of the two side surfaces. Each of the nonvolatile memory elements Q has a channel length L defined by the height (an amount of protrusion) of the semiconductor pillar 5 and a channel width W defined by the width of the semiconductor pillar 5 along the Y-direction.

As shown in FIGS. 5 and 6, each of the semiconductor pillars 5 and the insulator pillars 4 is formed to have substantially the same processing dimensions. In the rows of pillars 20, the plurality of semiconductor pillars 5 are dielectrically isolated from each other by the insulator pillars 4. The insulator pillars 4 are provided to reach the n-type semiconductor regions 8, while the plurality of n-type semiconductor regions 12 provided in the respective upper surface portions of the plurality of semiconductor pillars 5 are dielectrically isolated from each other by the insulator pillars 4 provided between the semiconductor pillars 5.

As shown in FIGS. 1 to 6, the semiconductor pillars 5 and insulator pillars 4 of each of the rows of pillars 20 are covered with an insulating film 13 provided on the principal surface of the semiconductor substrate 1. The portions of the insulating film 13 opposing the upper surface portions of the semiconductor pillars 5 are provided with openings 14. In the openings 14, insulating films 16 each composed of a silicon nitride film are provided as side spacers along the inner wall surfaces of the openings 14. In openings 17 defined by the insulating films 16, contact plugs 18 connected electrically to the n-type semiconductor regions 12 as the drain regions have been buried. To the contact plugs 18, bit lines BL have been connected. Consequently, the n-type semiconductor regions 12 as the drain regions provided in the upper surface portions of the semiconductor pillars 5 are connected electrically to the bit lines BL via the contact plugs 18.

In the present embodiment, the memory cells MS (nonvolatile memory elements Q) have the drain regions disposed in the upper surface regions of the rectangular-parallelepiped semiconductor pillars 5 dielectrically isolated from each other by the rectangular-parallelepiped insulator pillars 4, have the channel formation regions CN and the multilayer films 9 consisting of the silicon oxide films (first oxide films) 9a, the silicon nitride films (nonconductive charge trap films) 9b, and the silicon oxide films (second oxide films) 9c on the side surface portions of the semiconductor pillars 5, have the control gate electrodes (control gate electrodes) 11 composed of the polysilicon films and disposed as side spacers outside the silicon oxide films (second oxide films) 9c, and have the openings (contact holes) 17 to the drain regions and the bit lines BL above the upper surface regions of the rectangular-parallelepiped semiconductor pillars 5, as shown in FIGS. 1 to 6. Each of the memory cells MS is constructed as a nonvolatile memory element which performs writing by giving a proper positive potential to each of the drain region and the control gate electrode 11 so as to turn ON the channel formation region CN and inject hot electrons generated in the vicinity of the drain region such that they are trapped in the nonconductive silicon nitride film (charge trap film) 9b, while performing erasing by giving a proper negative potential and a proper positive potential to the control gate electrode 11 and the drain region, respectively, and thereby extracting the electrons trapped in the nonconductive silicon nitride film (charge trap film) 9b to the drain region by using a tunnel current flowing in the silicon oxide film (first oxide film) 9a.

In the direction along the A—A line (X-direction), the silicon oxide films (first oxide films) 9a, the nonconductive charge trap films 9b, the silicon oxide films (second oxide films) 9c, and the control gate electrodes 11 shaped like side spacers are disposed successively on the side surface portions of the rectangular-parallelepiped semiconductor pillars 5 in such a manner as to cover the outer circumference, while the source regions composed of the n-type semiconductor regions 8 are disposed in the lower portions of the rectangular-parallelepiped semiconductor pillars 5 and the drain regions composed of the n-type semiconductor regions 12 are disposed in the respective upper portions thereof. In the direction along the B—B line (Y-direction), the rectangular-parallelepiped semiconductor pillars 5 are isolated from each other by the insulating films 3 and the drain regions are connected to the bit lines BL via the contact plugs 18.

In the memory cells MS according to the present embodiment, each of the rectangular-parallelepiped semiconductor pillars 5 is disposed to have a minimum dimension F×F, as shown in FIG. 1. The width of the isolation disposed between the adjacent rectangular-parallelepiped semiconductor pillars 5 also has a minimum dimension F. Accordingly, the planar area of each of the rectangular-parallelepiped semiconductor pillars 5 is $2F \times 2F = 4F^2$ Since two cells can be disposed in one semiconductor pillar 5, the memory cell MS according to the present embodiment can be designed to have a small unit cell area of $2F^2$. The channel width W of the memory cell MS according to the present embodiment is equal to the width F of the rectangular-parallelepiped semiconductor pillar 5 and the channel width L thereof is determined by the height of the rectangular-parallelepiped semiconductor pillar 5. When the height of the rectangular-parallelepiped semiconductor pillar 5 is assumed to be F, a structural constant W/L determining the channel current becomes F/F=1. This indicates that the same read current can be retained irrespective of the fact that the cell area of the memory cell MS according to the present embodiment is one half of the cell area of a conventional cell, which is $4F^2$, and therefore the effectiveness of the present embodiment is established.

In the present embodiment, the plurality of semiconductor pillars 5 of the rows of pillars 20 are dielectrically isolated from each other by the insulator pillars 4 provided therebetween. Consequently, no semiconductor is present in the isolation regions of the rows of pillars 20, so that no parasitic channel is formed in the isolation regions even when the word lines WL extending continuously along the side surfaces of the rows of pillars 20 in the Y-direction are formed on the side surfaces. This allows the suppression of a data erase failure, a data write failure, and a data read failure resulting from the formation of a parasitic channel and an improvement in the electrical reliability of the flash memory. Even when the memory size is reduced through miniaturization, a failure resulting from the formation of a parasitic channel does not occur and the reliability can be improved.

A description will be given next of the manufacture of the flash memory with reference to FIGS. 7 to 22.

Figure 7:
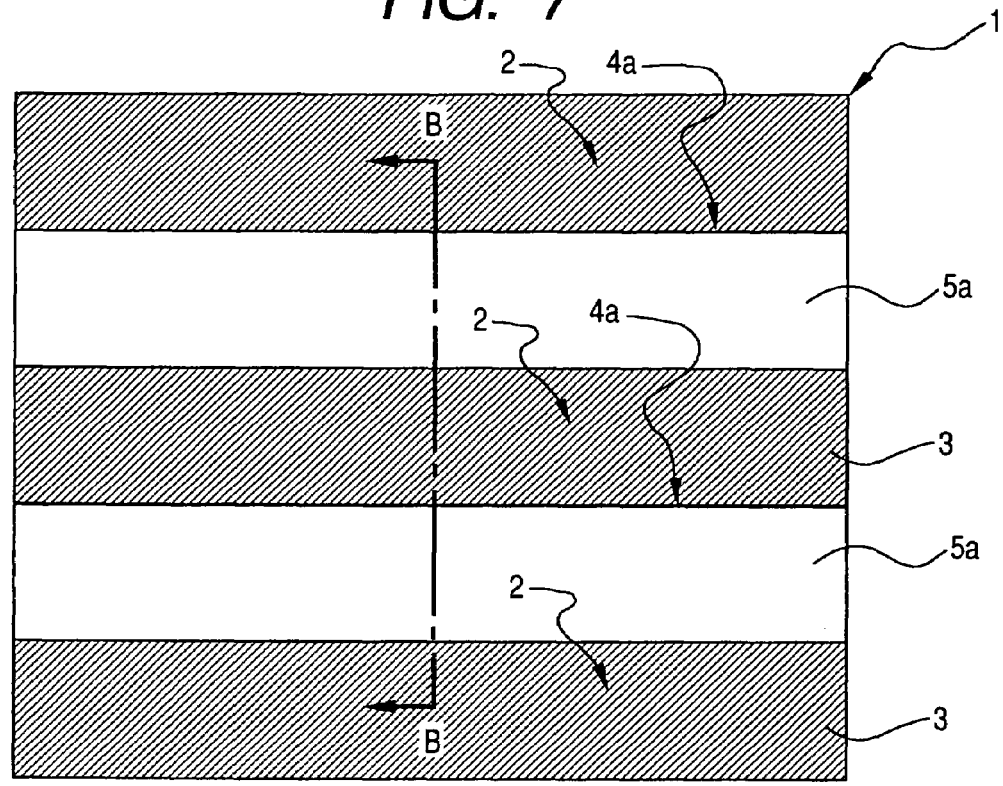
FIG. 7 is a diagrammatic plan view of the flash memory representing Embodiment 1 of the present invention as seen in a manufacturing process step therefor.
Figure 8:
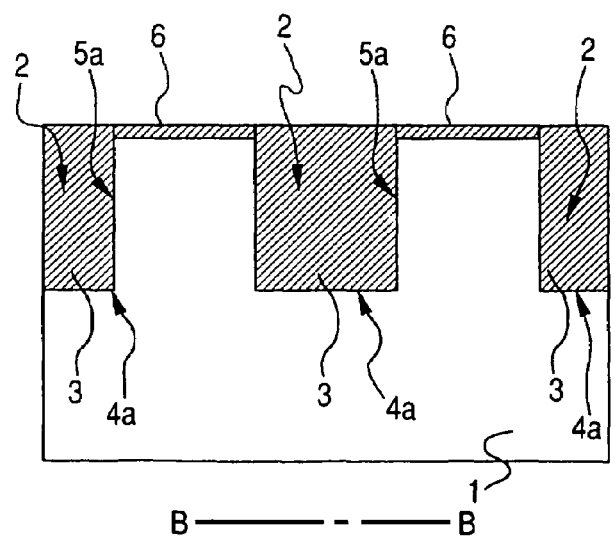
FIG. 8 is a diagrammatic cross-sectional view taken along the line B—B of FIG. 7.

First, as shown in FIGS. 7 and 8, active regions 5a and trenched isolation regions 4a are formed in stripes on the semiconductor substrate 1. At this time, the active regions 5a are isolated from each other by the trenched isolation regions 4a and surface oxide films 6 have been grown on the upper portions of the active regions 5a. The trenched isolation regions 4a are formed by forming trenches 2 in the semiconductor substrate 1, forming the insulating film 3 in such a manner as to fill in the trenches 2, and then planarizing the surface of the insulating film 3 by CMP.

In short, trenched patterns 4a in stripes having, e.g., widths and spacings of the minimum dimension F in the Y-direction and extending in the X-direction are formed on the semiconductor substrate 1. Then, an insulating film composed of, e.g., a silicon oxide film is deposited by CVD on the principal surface of the semiconductor substrate 1 including the inside of each of the trenched patterns 4a. Then, the insulating film is planarized by, e.g., polishing such as CMP, whereby the insulating film is buried in each of the trenched patterns 4a to form the trenched isolation regions 4a in stripes. Accordingly, each of the widths and spacings of the active regions 5a in the Y-direction is composed of, e.g., the minimum processing dimension F.

Figure 9:
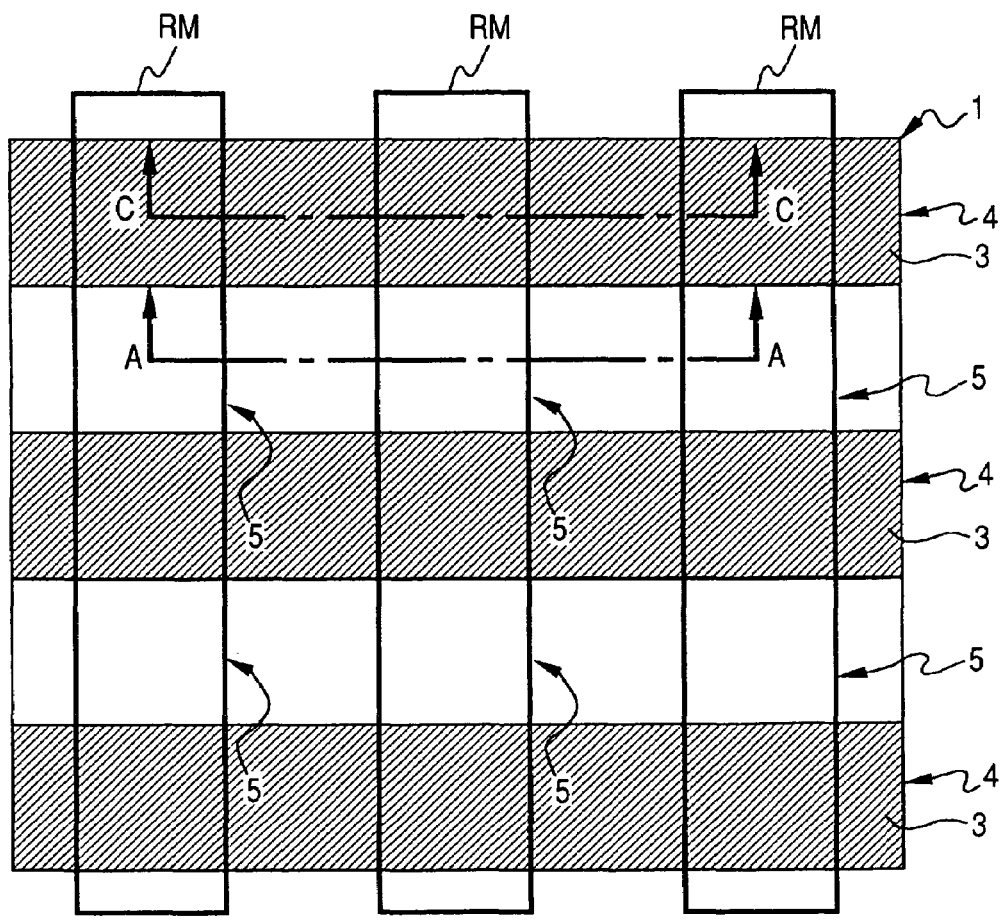
FIG. 9 is a diagrammatic plan view of the flash memory as seen in a manufacturing process step subsequent to that of FIG. 7.
Figure 10:
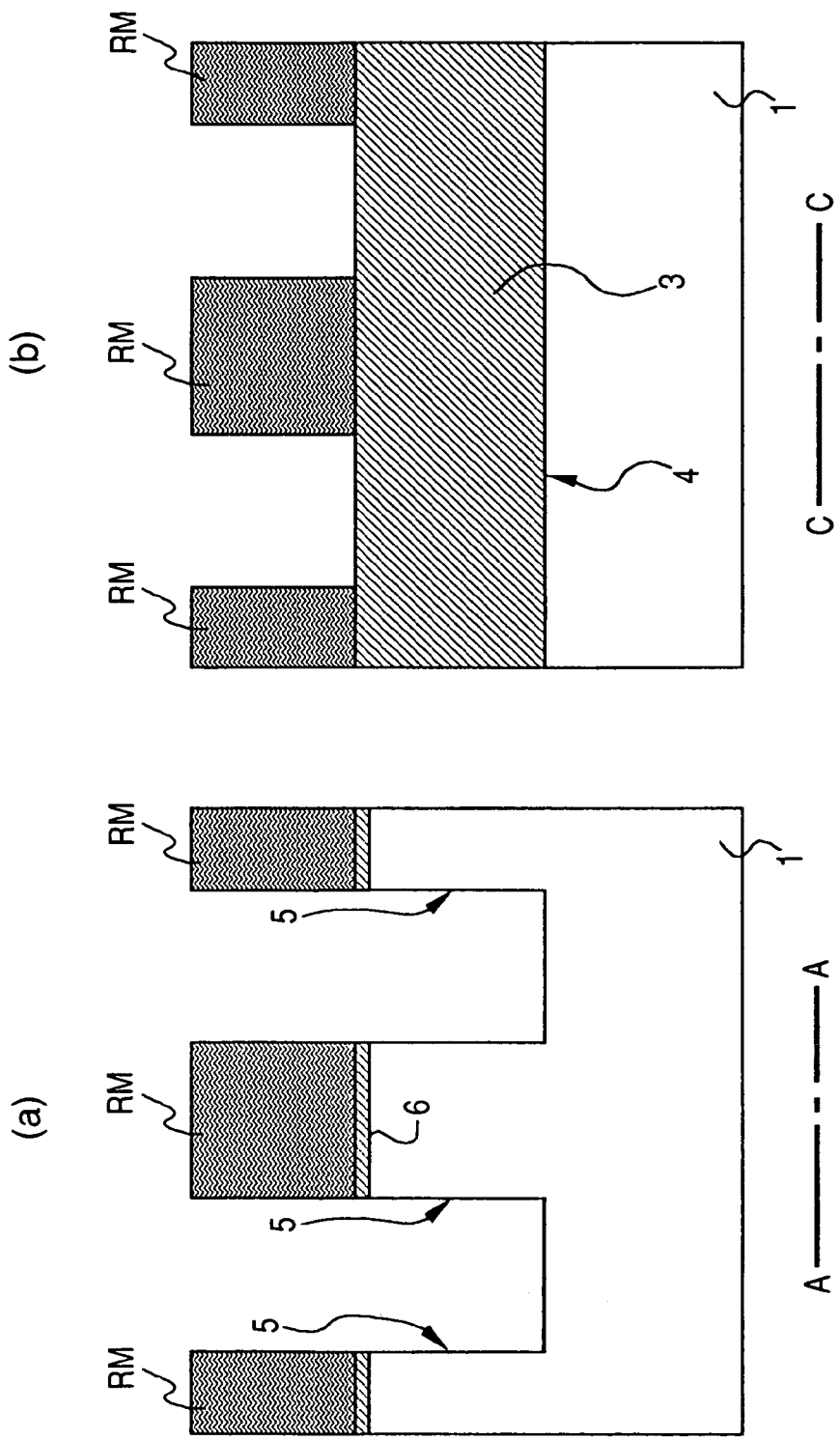
FIG. 10(a) is a diagrammatic cross-sectional view taken along the line A—A of FIG. 9.
FIG. 10(b) is a diagrammatic cross-sectional view taken along the line C—C of FIG. 9.
Figure 11:
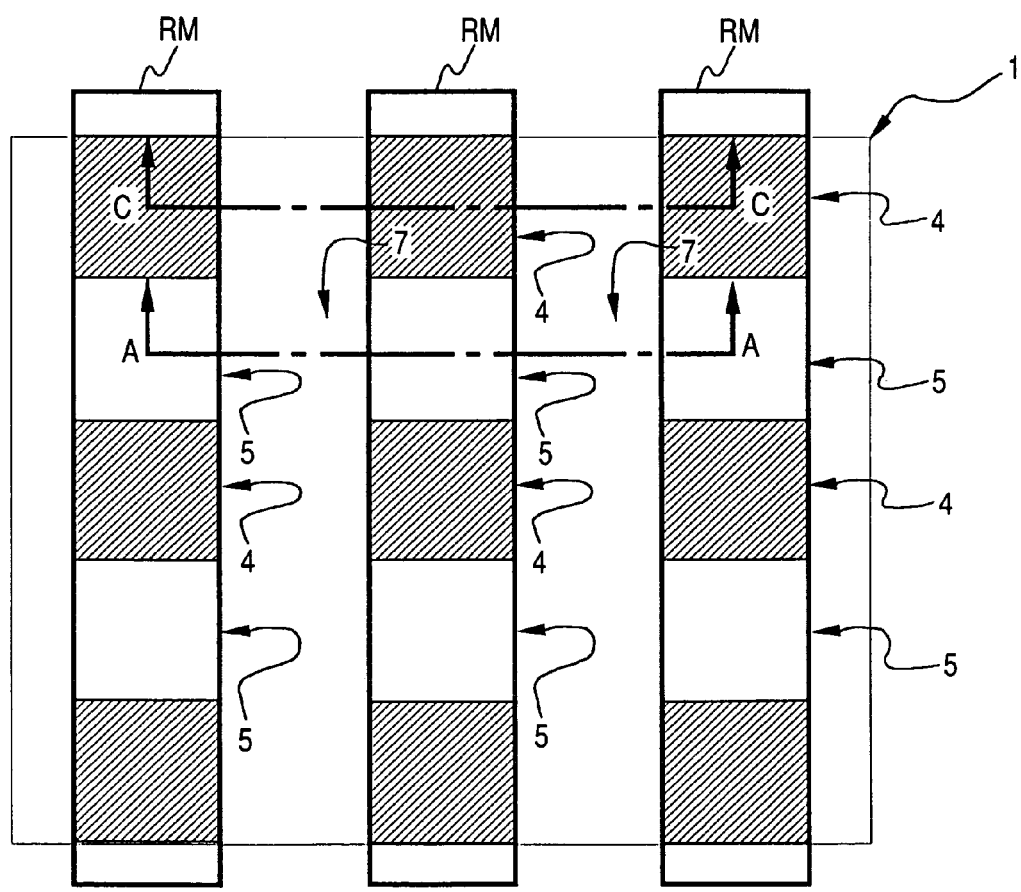
FIG. 11 is a diagrammatic plan view of the flash memory as seen in a manufacturing process step subsequent to that of FIG. 9.
Figure 12:
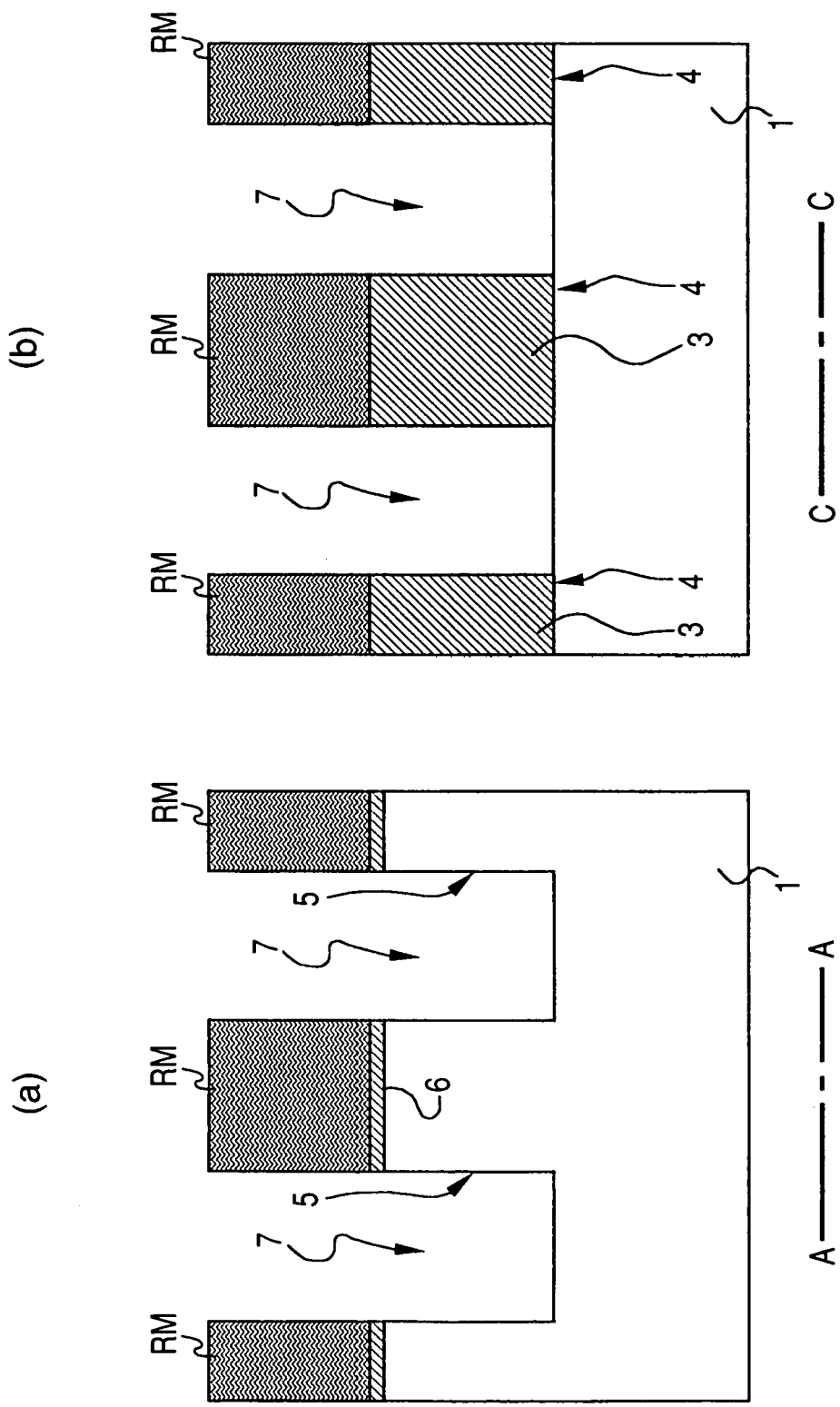
FIG. 12(a) is a diagrammatic cross-sectional view taken along the line A—A of FIG. 11.
FIG. 12(b) is a diagrammatic cross-sectional view taken along the line C—C of FIG. 11.

Next, as shown in FIGS. 9 and 10, resist patterns RM in stripes are formed in a direction orthogonal to the direction in which the active regions 5a are arranged. By using the resist patterns RM as a mask, the active regions 5a are etched selectively to form the rectangular-parallelepiped semiconductor pillars 5. Then, as shown in FIGS. 11 and 12, the trenched isolation regions 4a are etched by using the resist patterns RM as a mask to form the rectangular-parallelepiped insulator pillars 4. Each of the resist patterns RM has the widths and spacings of the minimum dimension F in, e.g., the X-direction. Accordingly, each of the semiconductor pillars 5 and the insulator pillars 4 has the width and spacing of the minimum dimension F in the X-direction and in the Y-direction.

Figure 13:
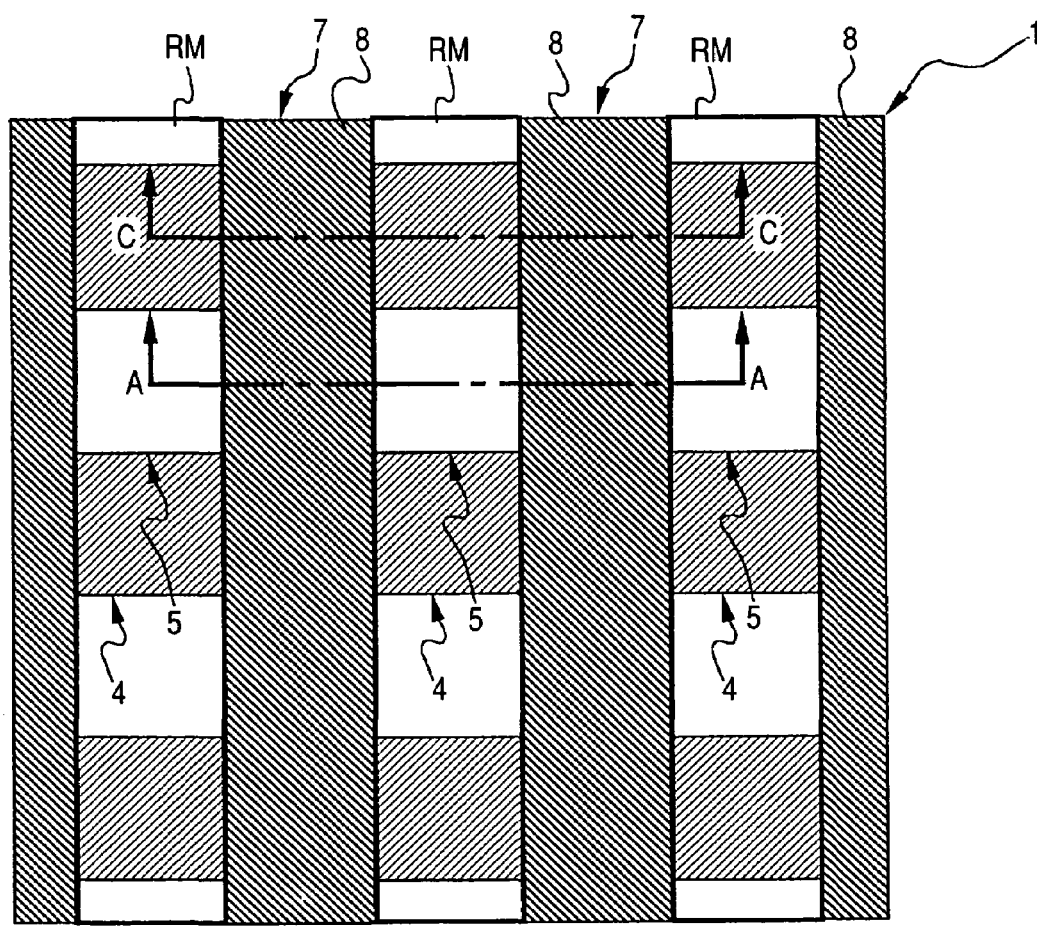
FIG. 13 is a diagrammatic plan view of the flash memory as seen in a manufacturing process step subsequent to that of FIG. 11.
Figure 14:
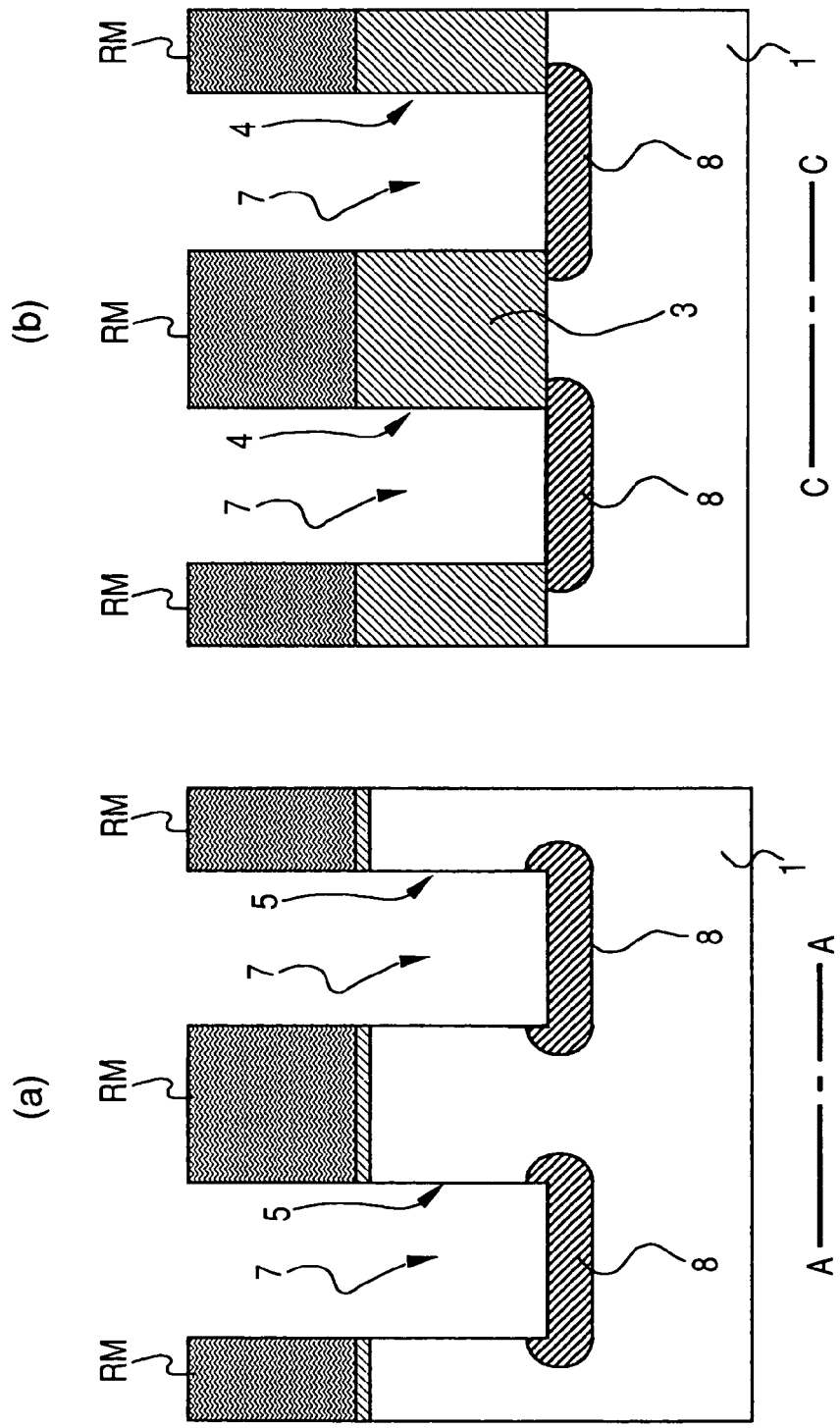
FIG. 14(a) is a diagrammatic cross-sectional view taken along the line A—A of FIG. 13.
FIG. 14(b) is a diagrammatic cross-sectional view taken along the line C—C of FIG. 13.

Next, as shown in FIGS. 13 and 14, the source regions composed of the n-type semiconductor regions 8 are formed by ion implantation of an impurity such as arsenic As or phosphorus P using the resist patterns RM as a mask.

Figure 15:
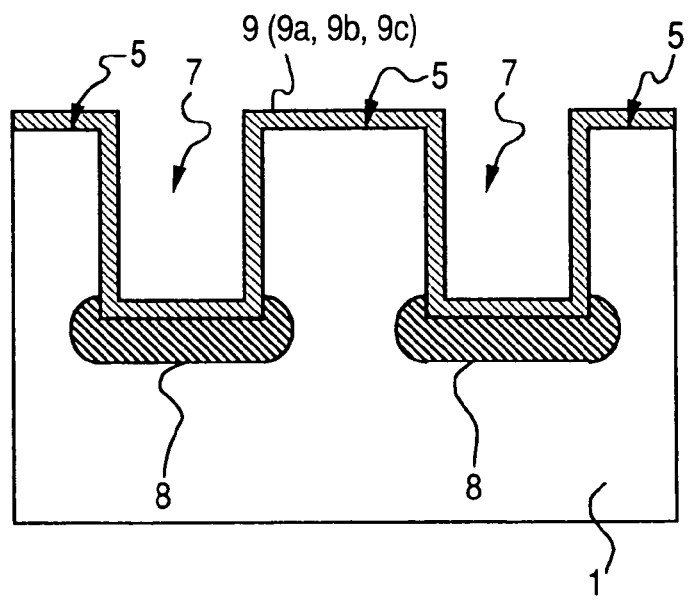
FIG. 15 is a diagrammatic cross-sectional view of the flash memory as seen in a manufacturing process step subsequent to that of FIG. 13.
Figure 16:
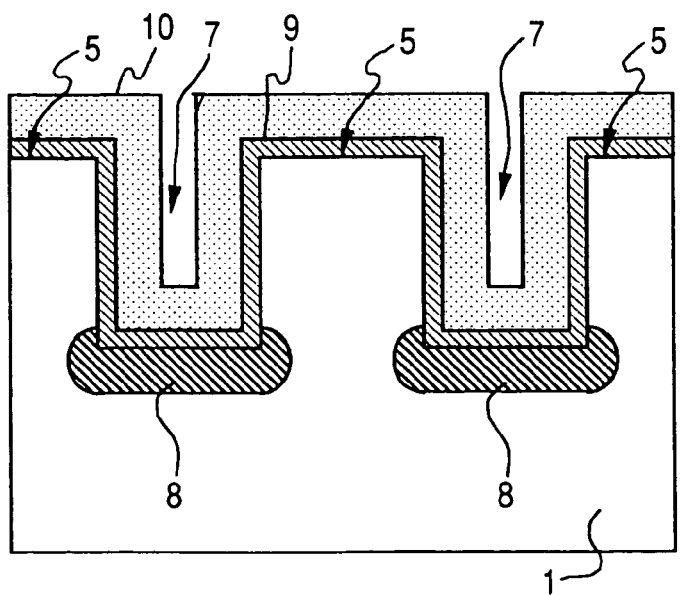
FIG. 16 is a diagrammatic cross-sectional view of the flash memory as seen in a manufacturing process step subsequent to that of FIG. 15.
Figure 17:
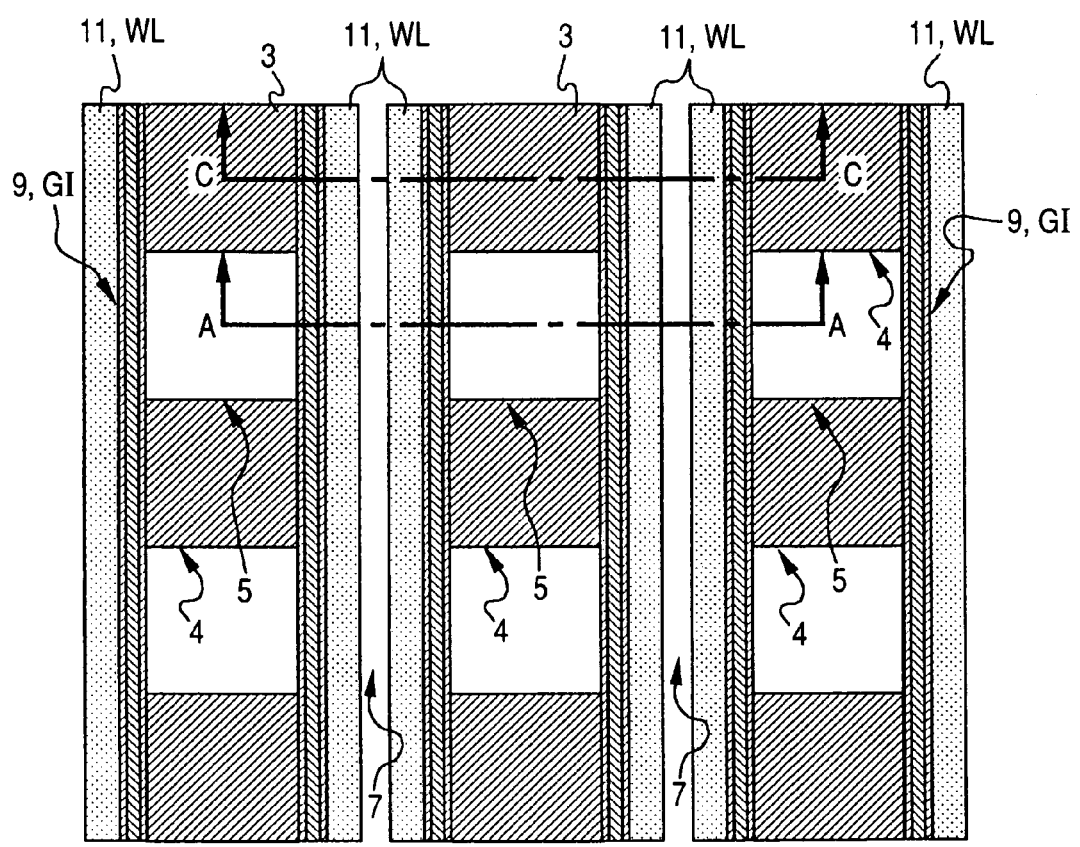
FIG. 17 is a diagrammatic plan view of the flash memory as seen in a manufacturing process step subsequent to that of FIG. 16.

Next, as shown in FIG. 15, the multilayer film 9 consisting of the silicon oxide film (first oxide film) 9a, the nitride film 9b, and the silicon oxide film (second oxide film) 9c is deposited on the side surface portions of the semiconductor pillars 5. Then, as shown in FIG. 16, a polysilicon film 10 is formed. Thereafter, anisotropic etching such as RIE is performed with respect to the polysilicon film 10 to form the control gate electrodes 11 (word lines WL) composed of the polysilicon films shaped like side spacers as shown in FIGS. 17 and 18.

Figure 18:
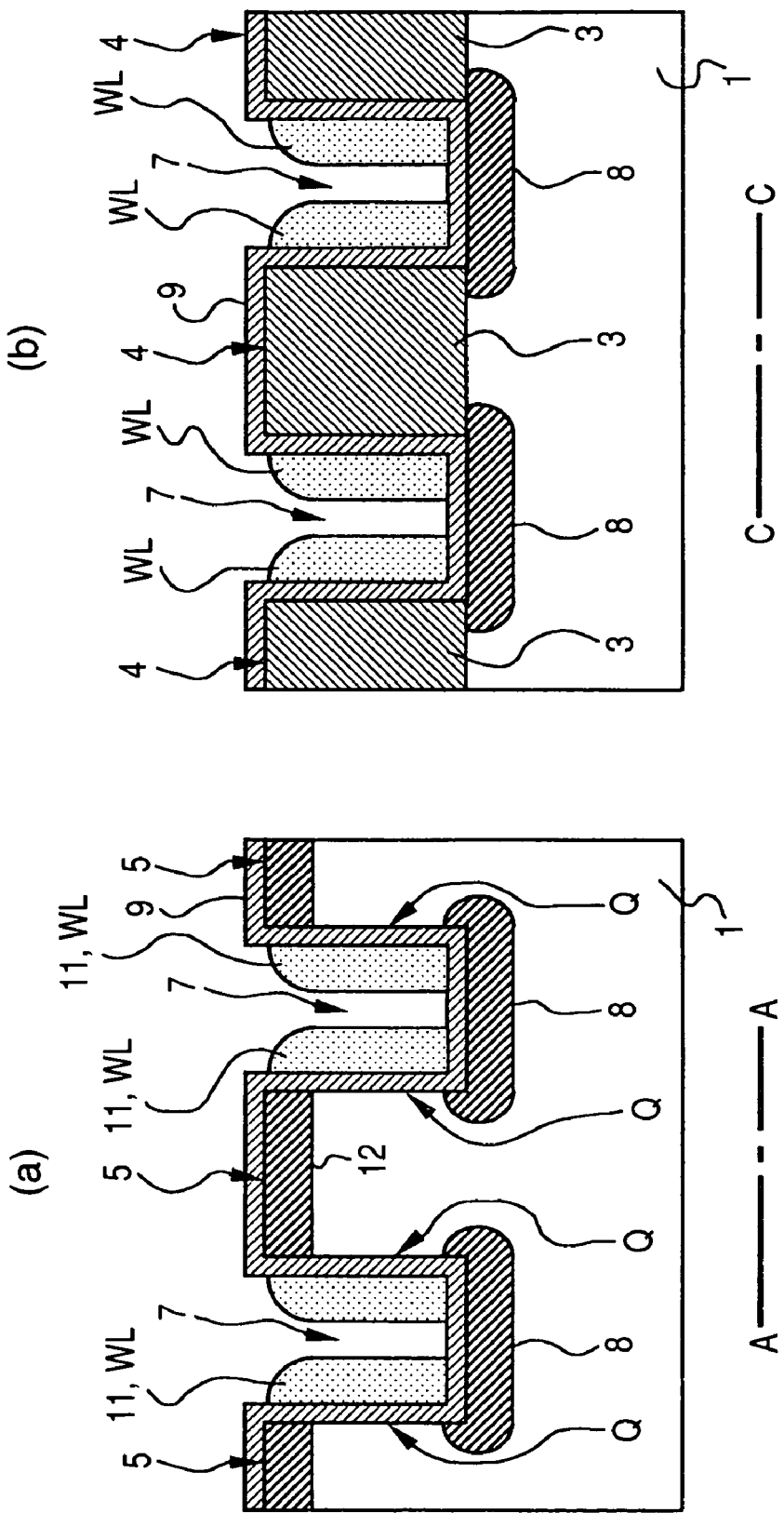
FIG. 18(a) is a diagrammatic cross-sectional view taken along the line A—A of FIG. 17.
FIG. 18(b) is a diagrammatic cross-sectional view taken along the line C—C of FIG. 17.

Next, an impurity is introduced by ion implantation into the upper portions of the semiconductor pillars 5 so that the drain regions composed of the n-type semiconductor regions 12 are formed, as shown in FIG. 18.

Figure 19:
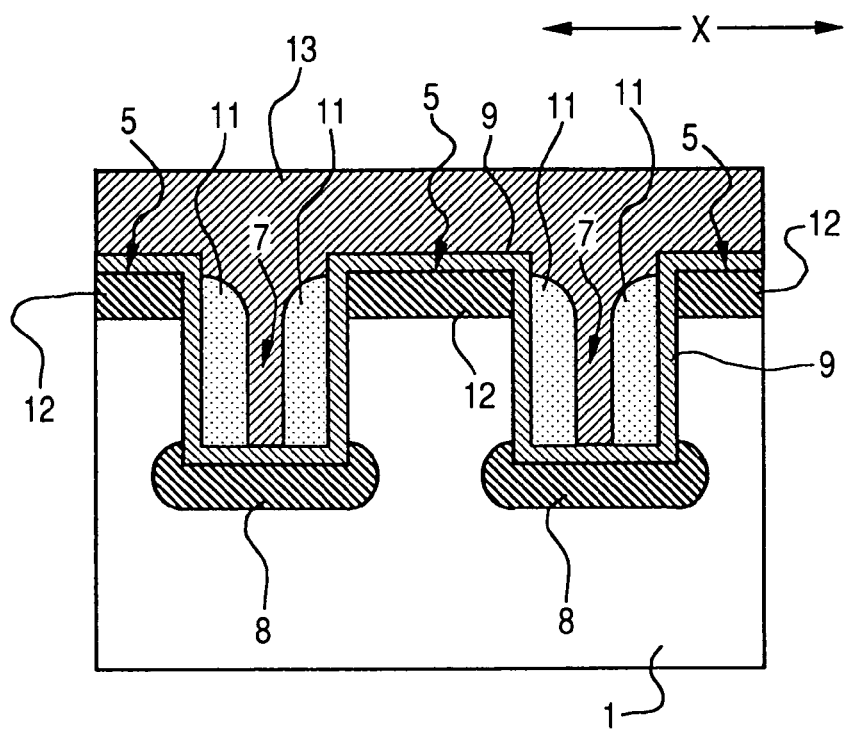
FIG. 19 is a diagrammatic cross-sectional view of the flash memory as seen in a manufacturing process step subsequent to that of FIG. 17.
Figure 20:
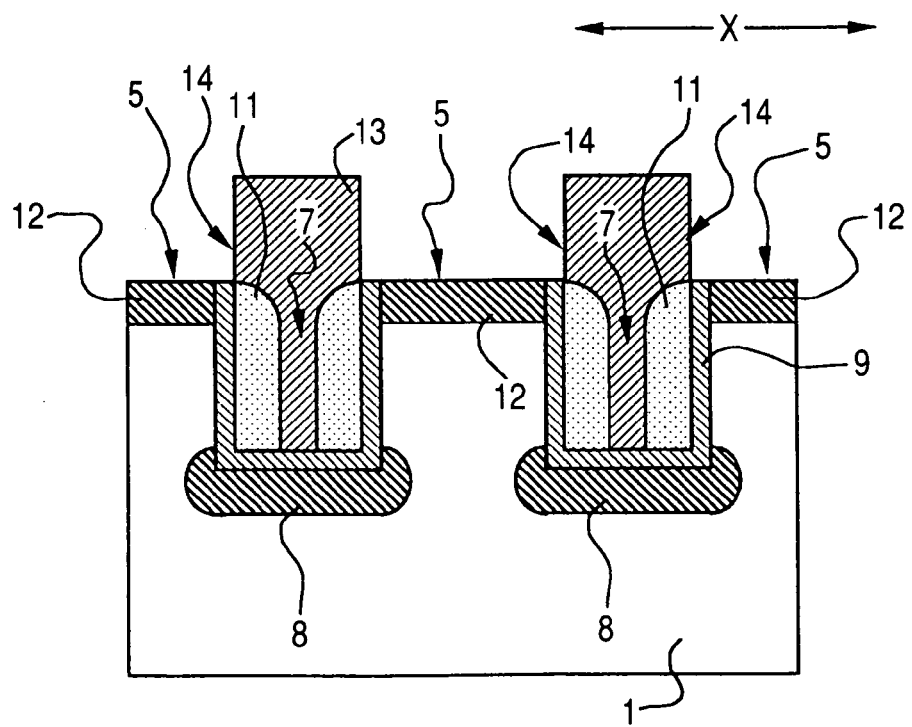
FIG. 20 is a diagrammatic cross-sectional view of the flash memory as seen in a manufacturing process step subsequent to that of FIG. 19.

Next, as shown in FIG. 19, the insulating film 13 is formed. Then, as shown in FIG. 20, the openings 14 for exposing the upper portions of the semiconductor pillars 5 are formed in the insulating film 13.

Figure 21:
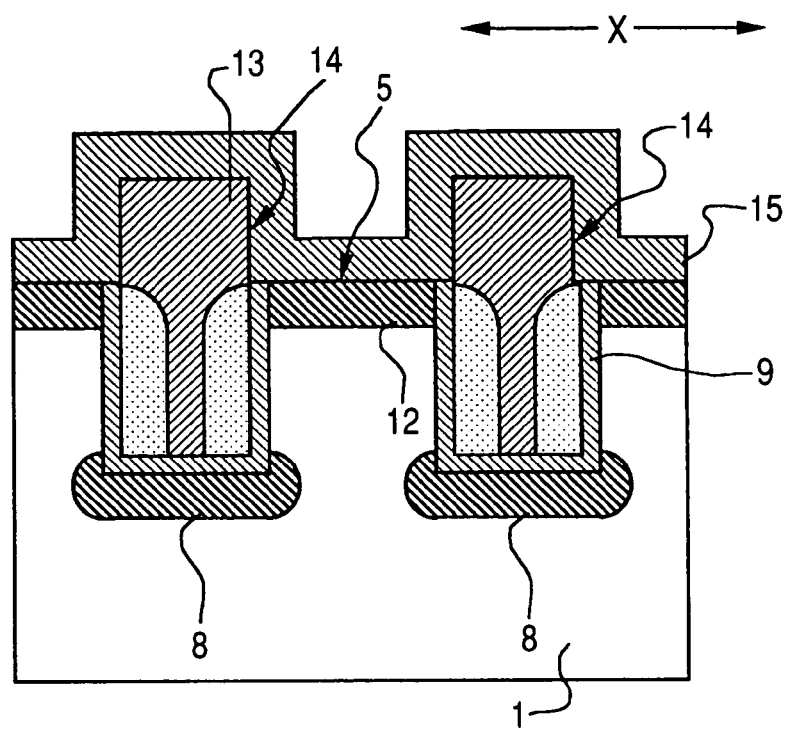
FIG. 21 is a diagrammatic cross-sectional view of the flash memory as seen in the manufacturing process step subsequent to that of FIG. 20.
Figure 22:
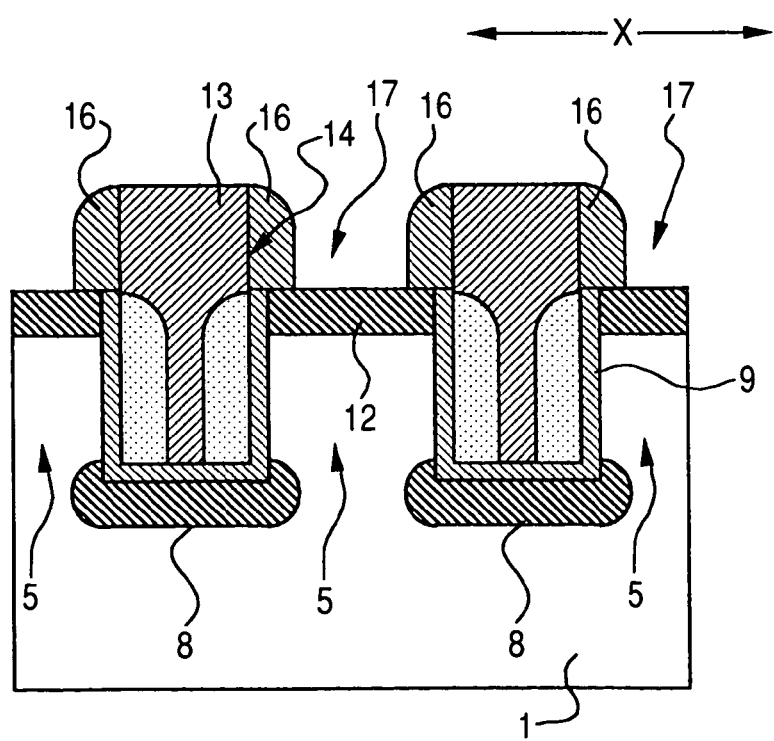
FIG. 22 is a diagrammatic cross-sectional view of the flash memory as seen in the manufacturing process step subsequent to that of FIG. 21.

Next, as shown in FIG. 21, an insulating film 15 is formed over the substrate including the inside of each of the openings 14. Thereafter, anisotropic etching such as RIE is performed with respect to the insulating film 15 to form the insulating films 16 shaped like side spacers (sidewall spacers) in the inner walls of the openings 14, as shown in FIG. 22.

Next, the contact plugs 18 to be connected to the drain regions are formed in the openings (connection holes) 17 defined by the sidewall spacers 16, i.e., on the upper surfaces of the semiconductor pillars 15. Thereafter, the bit lines BL are formed in a direction orthogonal to the direction in which the control gate electrodes 11 are arranged, whereby the state shown in FIGS. 1 to 6 are obtained.

In the process steps for manufacturing the memory cells according to the present invention, conventionally usable manufacturing techniques are used, which indicates that the memory cells according to the present invention can be manufactured by using such conventional techniques.

EMBODIMENT 2

Figure 23:
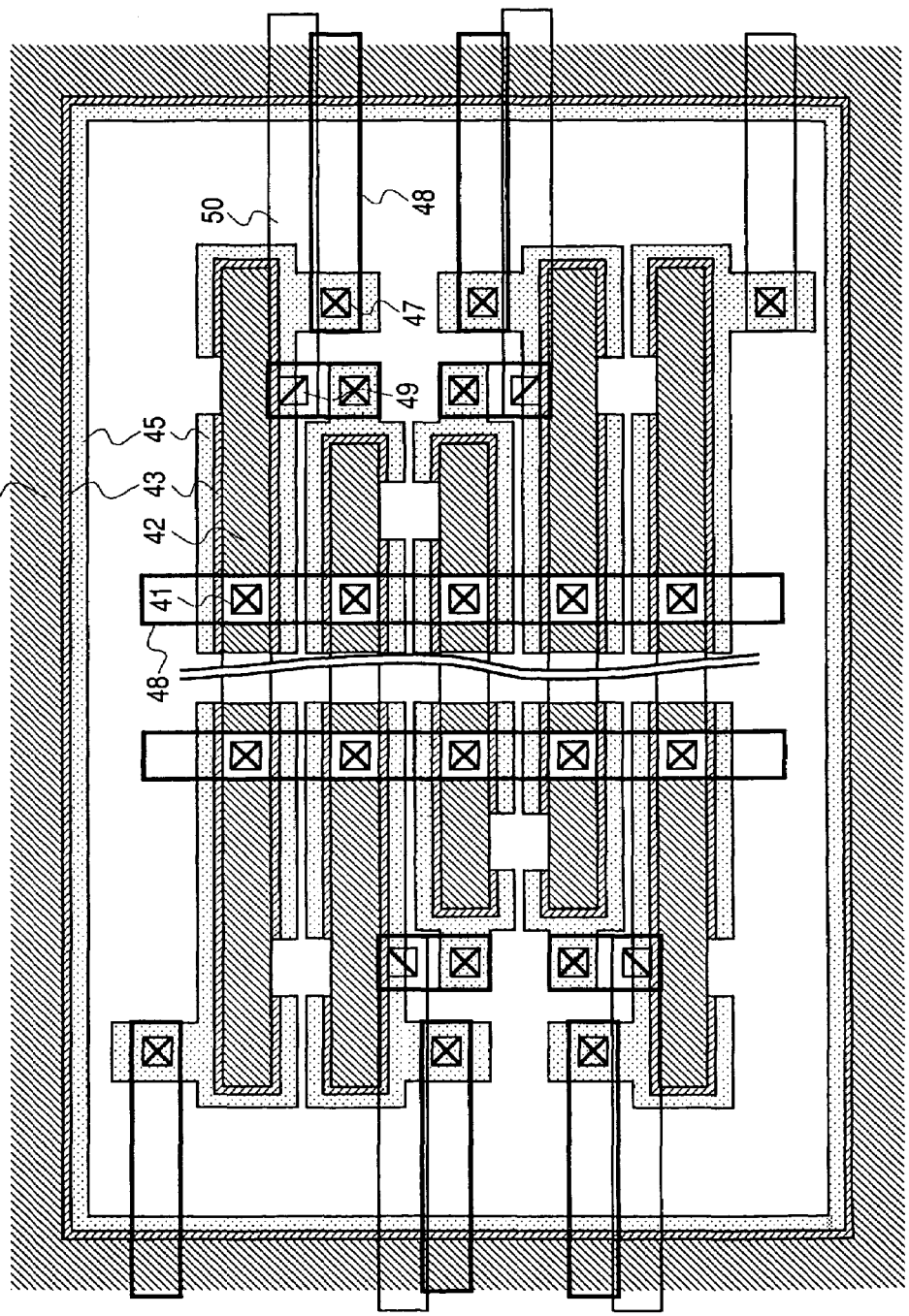
FIG. 23 is a diagrammatic plan view showing the structure of a peripheral region of a memory cell array portion in a flash memory representing Embodiment 2 of the present invention.
Figure 24:
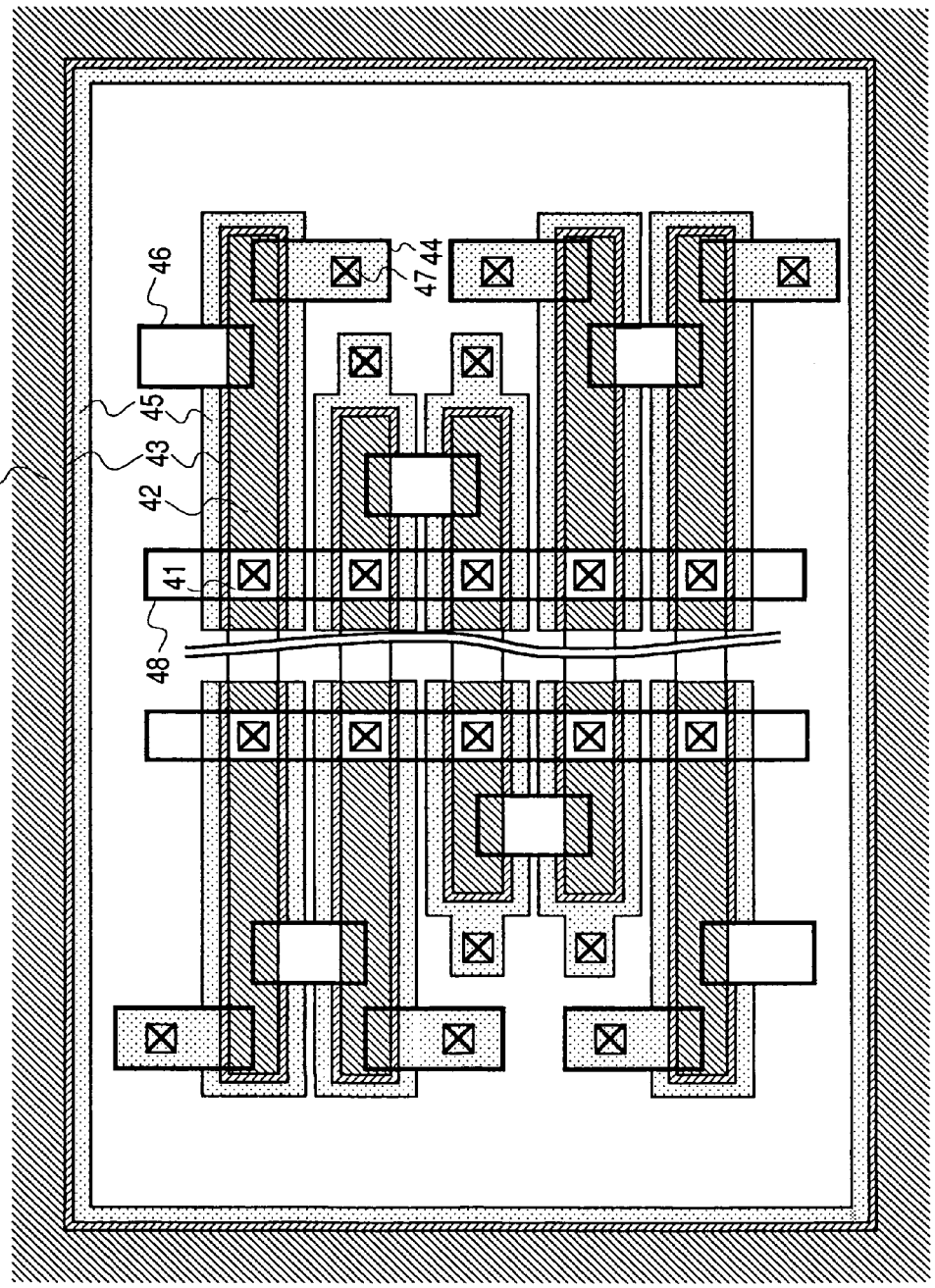
FIG. 24 is a diagrammatic plan view showing the state in which a part of FIG. 23 has been removed.

The present embodiment pertains to the connection of electrodes to the control gate electrodes formed as side spacers in the memory cells according to the present application. In FIGS. 23 and 24, plan views of the nonvolatile memory cells according to the present invention are shown schematically. In the drawings, an electrode connecting structure to the control gate electrodes at the edge portions of a memory array is shown, in which rectangular-parallelepiped semiconductor pillars 41 are arranged and trenched isolation regions (insulator pillars) 42 are formed such that every second of them is different in length at the edge portions of the memory array. In the processing of control gate electrodes 45 into side spacers, regions from which the control gate electrodes 45 are extracted are formed by using mask patterns 44 defining the gate electrode of a peripheral circuit and connected to first metal lines 48 via contact holes 47. The placement pitch of the control gate electrodes 45 shaped like side spacers is the minimum dimension F. Since connection is impossible by using only the first metal lines 48, second metal lines 50 are also used via first connection holes 49. The control gate electrodes 45 formed as side spacers on the peripheries of the trenched isolation regions 41 have been interrupted by mask patterns 46.

By the present embodiment, it has been shown that metal lines having a placement pitch of the minimum dimension 2F can be connected to the control gate electrodes 45 shaped like side spacers and having a placement pitch of the minimum dimension F.

Embodiment 2 will further be described in detail with reference to FIGS. 44 to 50. FIGS. 44 to 50 are diagrammatic plan views of the peripheral region of the memory cell array portion in the flash memory shown in FIGS. 23 and 24 showing the manufacturing process steps therefor.

Figure 44:
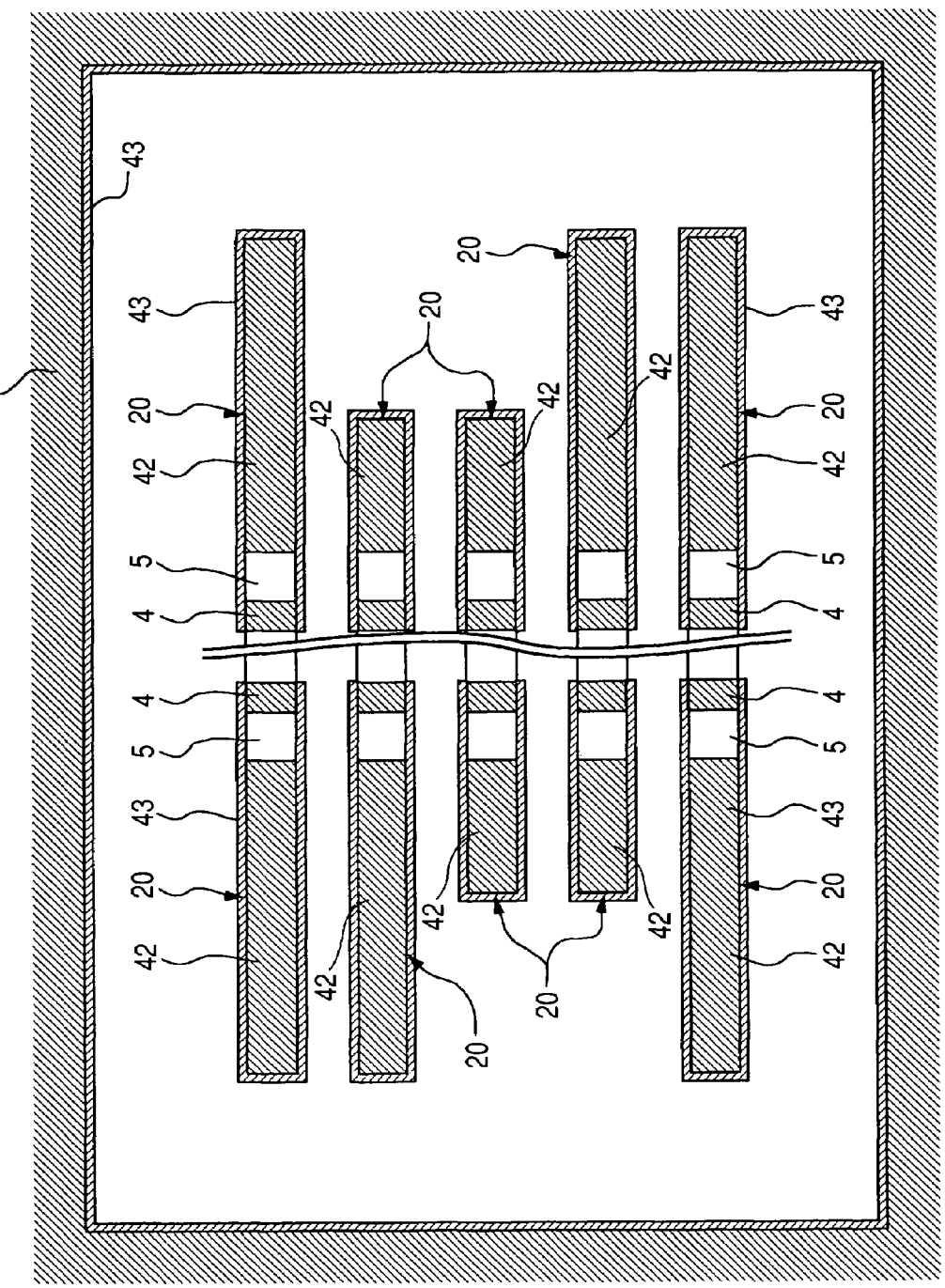
FIG. 44 is a diagrammatic plan view of the peripheral region of the memory cell array portion in the flash memory shown in FIGS. 23 and 24 as seen in a manufacturing process step therefor.

FIG. 44 shows a state in which insulating films 43 (multilayer films 9) used as the gate insulating films of the nonvolatile memory elements have been formed on the semiconductor substrate including the top surfaces of the rows of pillars 20. The insulating films 43 have been formed on the semiconductor substrate in such as manner as to cover the side surfaces of the rows of pillars 20. For the sake of clarity, the portions of the insulating films 43 that have been formed on the side surfaces of the rows of pillars 20 and on the side surface of the trenched isolation region 42 to surround the periphery of the memory cell array portion are depicted in FIG. 44. In FIGS. 23, 24, and 44 to 50, the directions in which the rows of pillars 20 extend are shown in a state 90° shifted relative to FIG. 1.

As shown in FIG. 44, each of the rows of pillars 20 is constructed to have the trenched isolation region 42 of a length along the direction in which the row of pillars 20 extends which is larger at the edge portion of the memory cell array than that of the insulator pillar 4 in the middle portion. The trenched isolation regions 42 of the individual rows of pillars 20 are formed such that every second of them is different in length.

Figure 45:
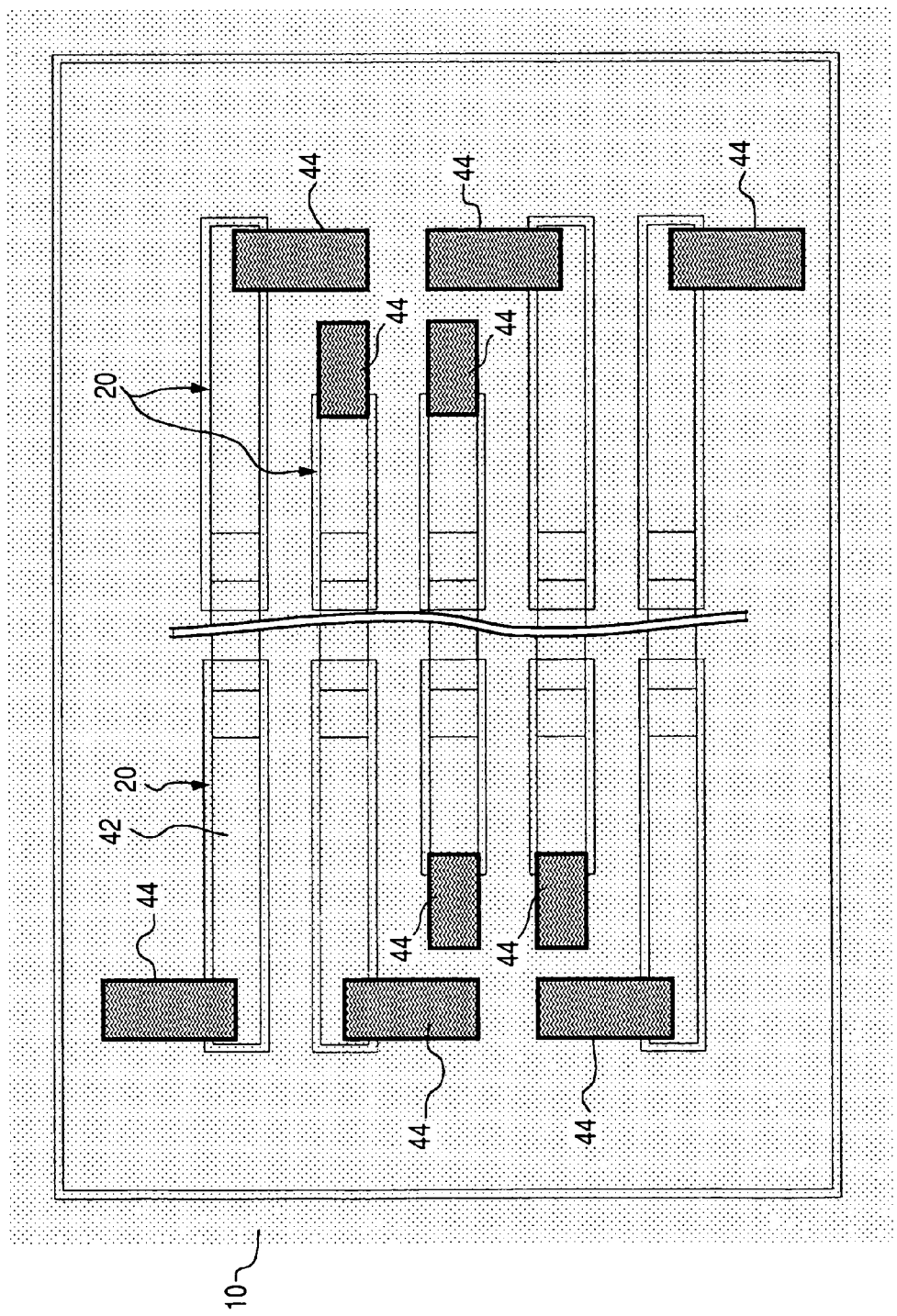
FIG. 45 is a diagrammatic plan view of the memory cell array portion as seen in a manufacturing process step subsequent to that of FIG. 44.

After the insulating film 43 shown in FIG. 44 is formed, a polysilicon film 10 is formed as a conductive film over the entire surface of the semiconductor substrate including the top surfaces of the rows of pillars 20, as shown in FIG. 45. Then, as shown in FIG. 45, the mask patterns 44 are formed on the polysilicon film 10. The mask patterns 44 have gate patterns for forming the gate electrode of a transistor for a peripheral circuit and extraction patterns (contact patterns) for forming the extracted regions (contact regions) of the word lines WL including the control gate electrodes 45 of the nonvolatile memory elements. In short, the word lines WL including the control gate electrodes 45 of the nonvolatile memory elements and extracted regions 45a are formed in the same process steps as the gate electrode of a MISFET composing the peripheral circuit.

Figure 46:
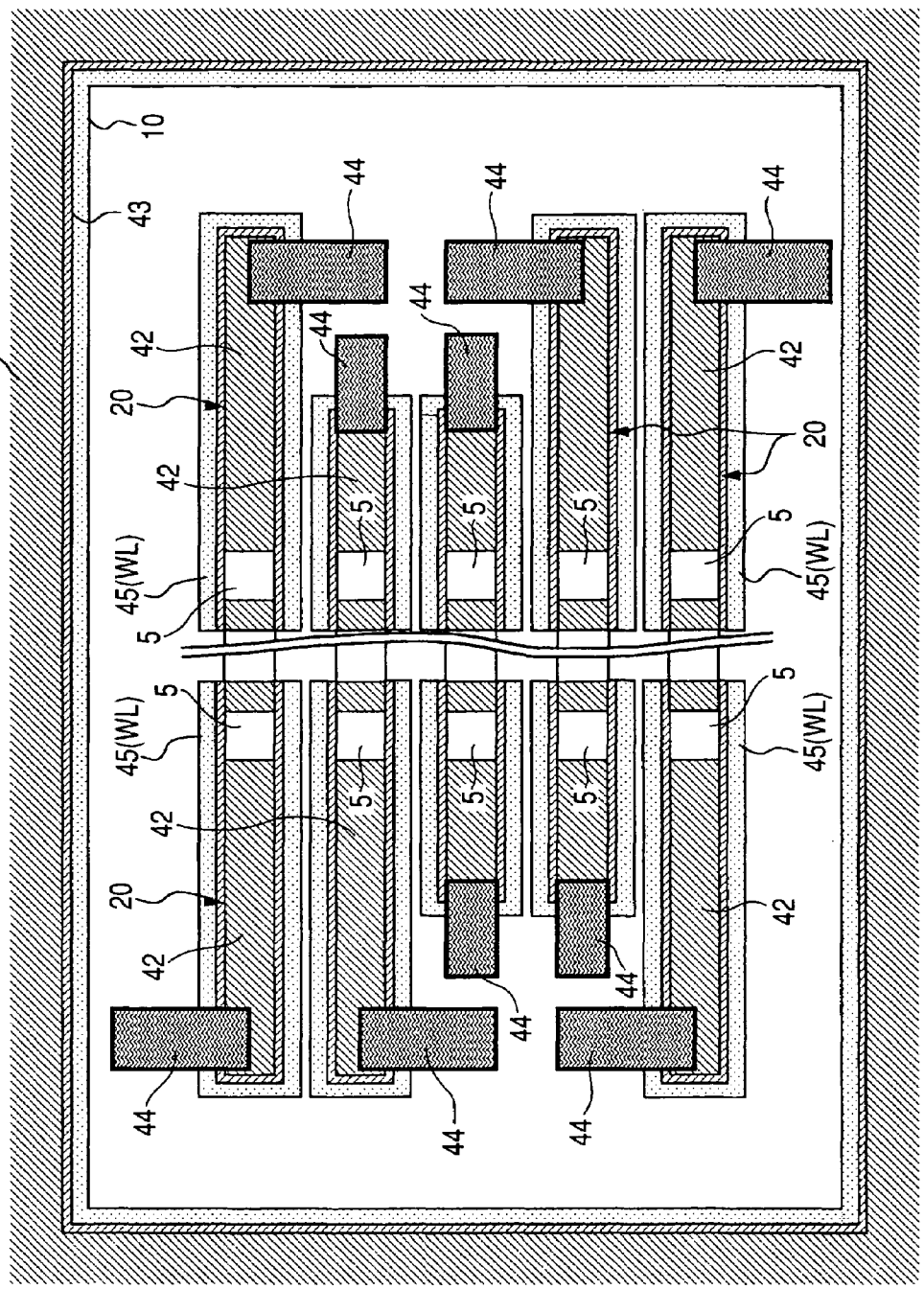
FIG. 46 is a diagrammatic plan view of the memory cell array portion as seen in the manufacturing process step subsequent to that of FIG. 45.
Figure 47:
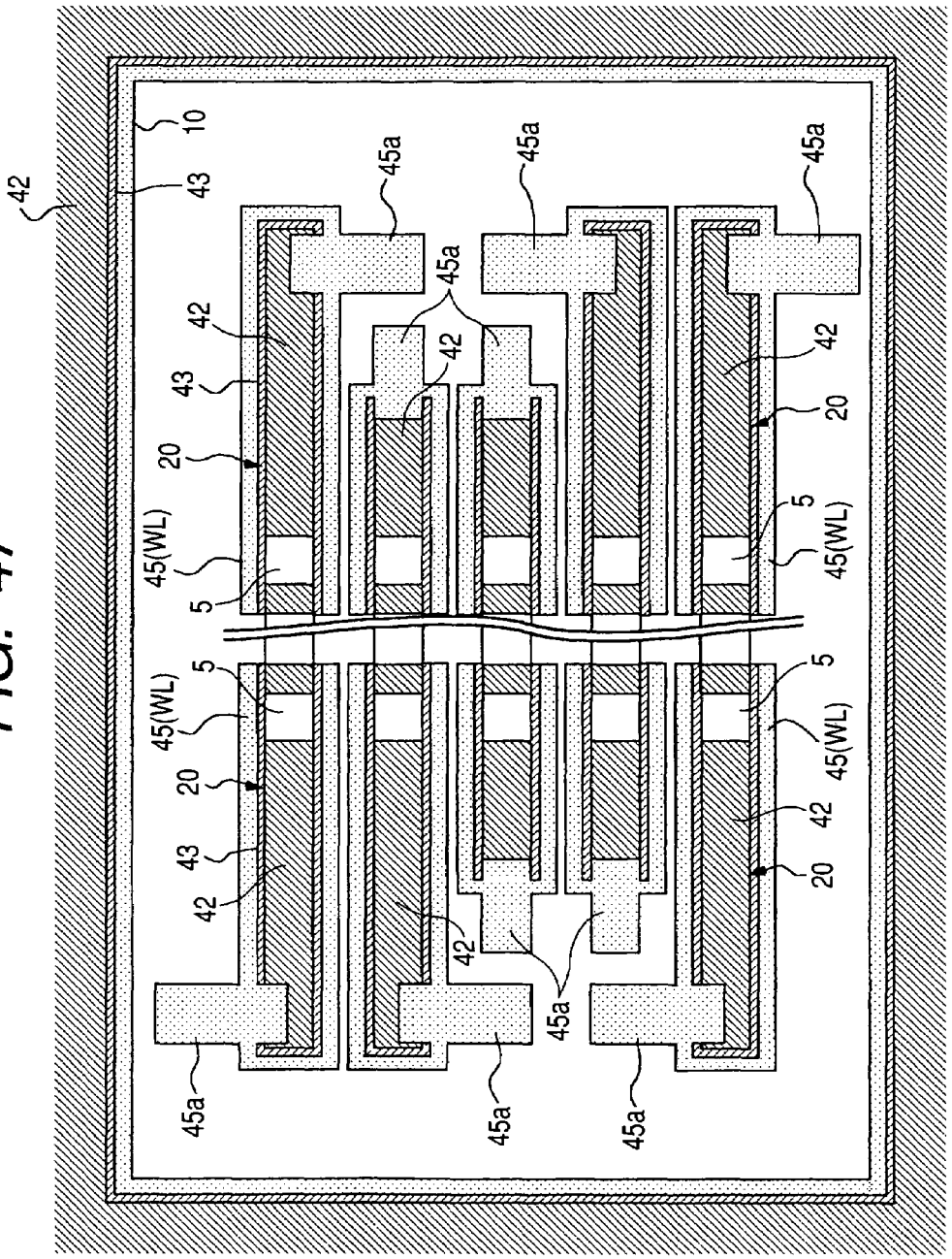
FIG. 47 is a diagrammatic plan view of the memory cell array portion as seen in the manufacturing process step subsequent to that of FIG. 46.

Next, anisotropic etching such as RIE is performed with respect to the polysilicon film 10 by using the mask patterns 44 as an etching mask, thereby forming the word lines WL shaped like side spacers and including the control gate electrodes 45 on the side surfaces of the rows of pillars 20 and simultaneously forming the extracted regions 45a integrated with the word lines WL (control gate electrodes 45), as shown in FIGS. 46 and 47 (drawings showing a state in which the mask patterns have been removed). In this process step, the gate electrode of the MISFET composing the peripheral circuit is also formed. As for the formation of the word lines WL, including the control gate electrodes 45 of the nonvolatile memory elements, the extracted regions 45a, the gate electrode of the MISFET composing the peripheral circuit, such formation will be described with reference to the process steps illustrated in FIGS. 29 and 30 according to Embodiment 3, which will be described later.

Next, after the mask patterns 44 are removed as shown in FIG. 47, the word lines WL formed continuously on the side surfaces of the rows of pillars 20 in such a manner as to surround the peripheries of the rows of pillars 20 are partially removed by using the mask patterns 46 having openings 46a. The partial removal of the word lines WL is performed under etching conditions for selectively removing the word lines WL.

Figure 49:
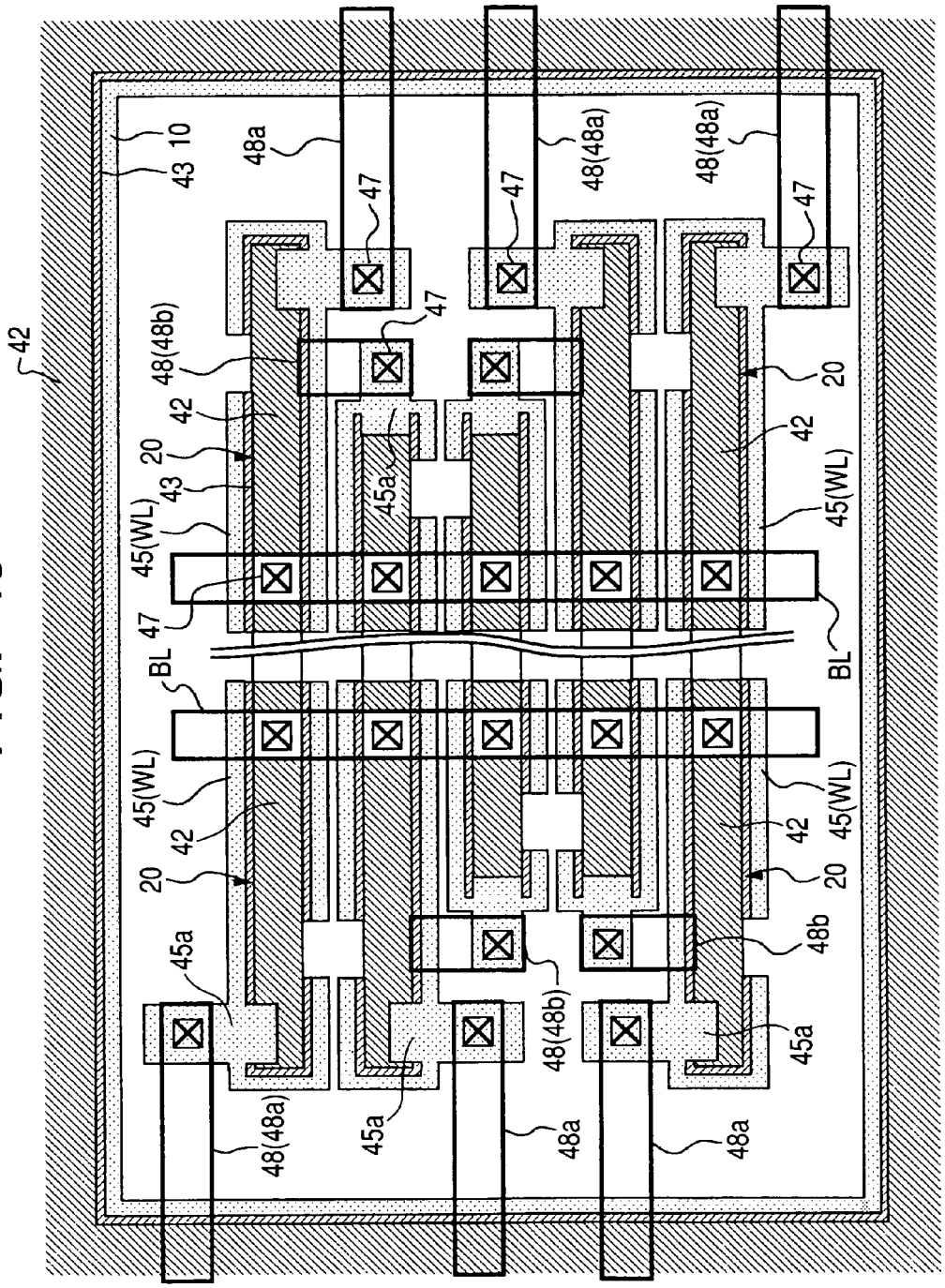
FIG. 49 is a diagrammatic plan view of the memory cell array portion as seen in the manufacturing process step subsequent to that of FIG. 48.

Next, after the mask patterns 44 are removed, an interlayer insulating film is formed over the entire surface of the semiconductor substrate including the top surfaces of the rows of pillars 20, though this is not depicted. Then, as shown in FIG. 49, the first metal lines 48 including the bit line BL, lines (48a, 48b), and the like are formed on the interlayer insulating film. The bit lines BL are connected electrically to the semiconductor regions (drain regions) provided on the surfaces of the semiconductor pillars 5 via the contact holes (connection holes) 47 formed in the interlayer insulating film. The lines (48a, 48b) are connected electrically to the extracted regions 45a formed integrally with the word lines WL via the contact holes (connection holes) 47 formed in the interlayer insulating film.

Figure 50:
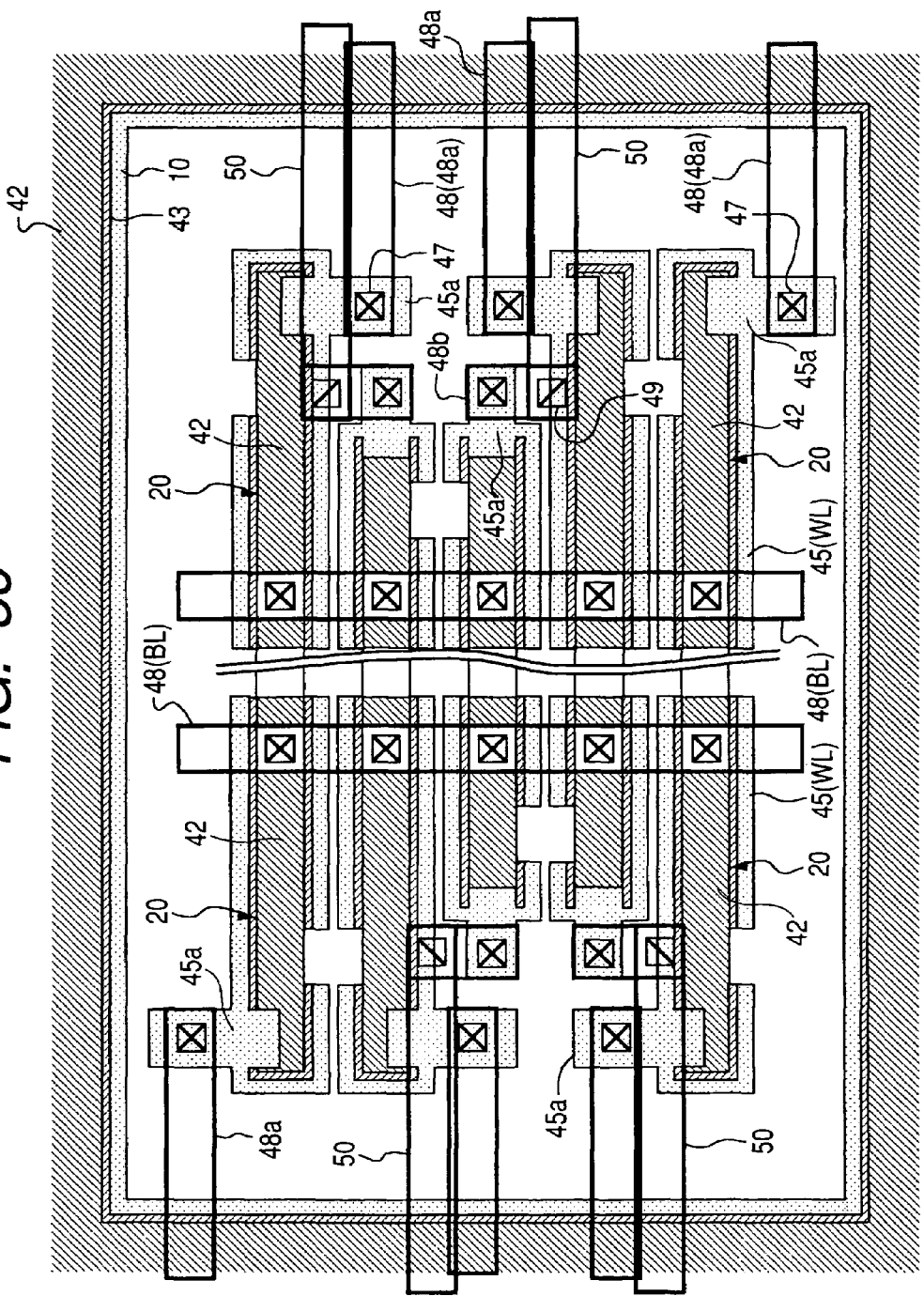
FIG. 50 is a diagrammatic plan view of the memory cell array portion as seen in the manufacturing process step subsequent to that of FIG. 49.

Next, an interlayer insulating film is formed over the entire surface of the semiconductor substrate including the top surfaces of the first metal lines 48, though this is not depicted. Then, as shown in FIG. 50, the second metal lines 50 are formed on the interlayer insulating film. The second metal lines 50 are connected electrically to the lines 48b via the first connection holes (connection holes) 49 formed in the interlayer insulating film.

In the present embodiment, the word lines WL including the control gate electrodes 45 of the nonvolatile memory elements are formed on the side surfaces of the rows of pillars 20, while the extracted regions 45a integrated with the word lines WL are formed by performing anisotropic etching with respect to the polysilicon film 10 in the state in which the polysilicon film 10 is partially masked. By thus forming the word lines WL and the extracted regions 45a, the extremely fine word lines WL and the extracted regions 45a integrated with the extremely fine word lines WL can be formed without an increase in the number of manufacturing process steps. In addition, the formation of the extracted regions 45a integrated with the extremely fine word lines WL allows easy electrical connection between the extremely fine word lines WL and lines in the upper layers.

In the present embodiment, the word lines WL including the control gate electrodes of the nonvolatile memory elements have been formed as side spacers on the side surfaces of the rows of pillars 20 as projecting island regions in stripes by performing anisotropic etching with respect to the polysilicon film 10. Thus, the word lines WL are formed continuously in such a manner as to surround the peripheries of the rows of pillars 20, resulting in a state in which the word line WL formed on one of the side surfaces of each of the rows of pillars 20 located on the opposite sides (which are the side surface along the direction in which the semiconductor pillars 5 are arranged and the side surface along the longitudinal direction of the row of pillars) and the word line WL formed on the other side surface are connected electrically to each other. The word line WL formed on one of the two side surfaces of each of the rows of pillars 20 includes the control gate electrodes 45 of the nonvolatile memory elements each using the one of the two side surfaces of the row of pillars 20 as the channel formation region, while the word line WL formed on the other side surface of the row of pillars 20 includes the control gate electrodes of the nonvolatile memory elements each using the other side surface of the row of pillars 20 as the channel formation region.

Figure 48:
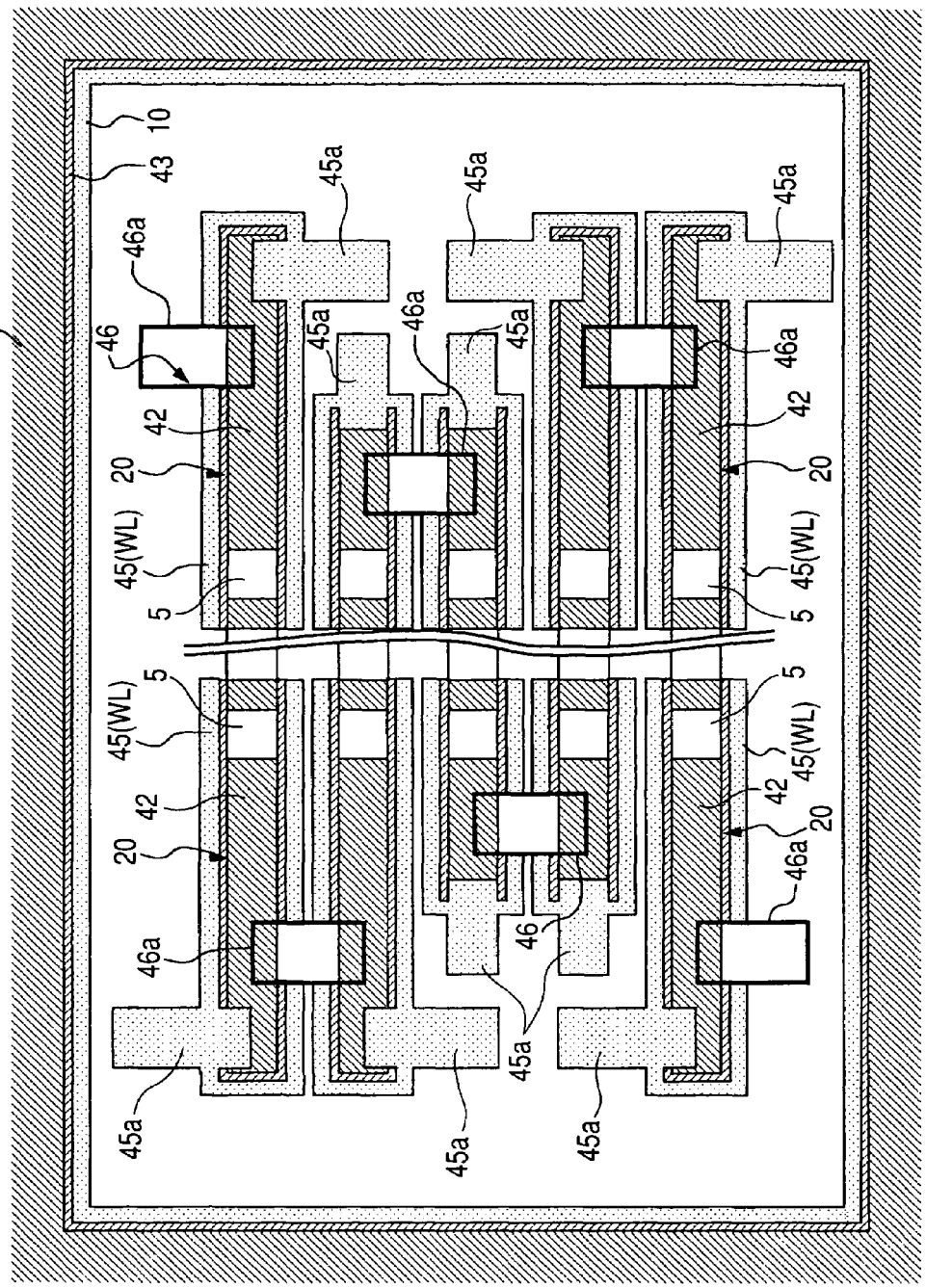
FIG. 48 is a diagrammatic plan view of the memory cell array portion as seen in the manufacturing process step subsequent to that of FIG. 47.

When the word lines WL including the control gate electrodes 45 of the nonvolatile memory elements are formed as side spacers on the side surfaces of the rows of pillars 20 composed of projecting island regions in stripes, each defined by the four side surfaces, it is necessary to partially remove the word lines WL after the formation thereof and thereby provide electrical isolation between the control gate electrodes of the nonvolatile memory elements using one of the side surfaces of each of the rows of pillars 20 as the channel formation regions and the control gate electrodes of the nonvolatile memory elements using the other side surface of the row of pillars 20 as the channel formation regions, as has been performed in the present embodiment. In the present embodiment, the word lines WL are partially removed from the trenched isolation regions 42 at the edge portions of the rows of pillars 20, as shown in FIG. 48.

EMBODIMENT 3

The present embodiment pertains to a method of manufacturing memory cells according to the present invention and the transistor for the peripheral circuit in the same manufacturing process steps, which will be described with reference to the cross-sectional views in the individual manufacturing process steps shown in FIGS. 25 to 33. Each of the cross-sectional views shows a cross section of a peripheral circuit portion and a memory cell portion.

Figure 25:
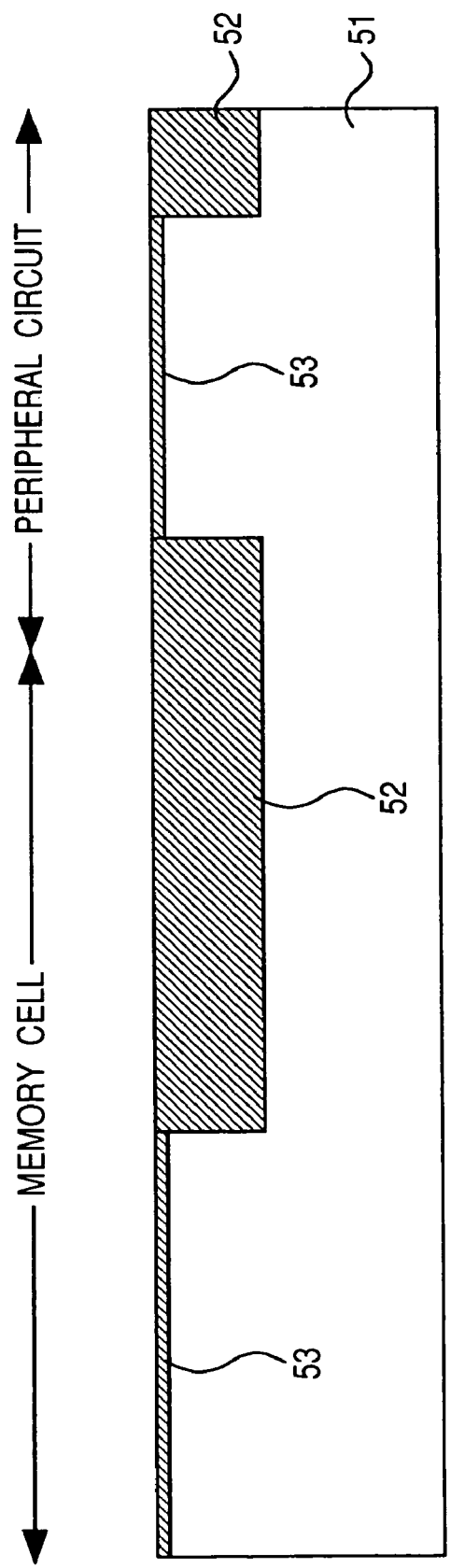
FIG. 25 is a diagrammatic cross-sectional view of a flash memory representing Embodiment 3 of the present invention as seen in a manufacturing process step therefor.

First, FIG. 25 shows a state in which a trenched isolation region 52 is formed by filling an oxide film in a trench at a depth of 250 nm in a surface region of a p-type semiconductor silicon substrate (hereinafter simply referred to as a silicon substrate) 51 with a resistivity of 10 Ωcm and planarizing it by CMP (Chemical Mechanical Polishing), and, then, a surface oxide film 53 with a thickness of 10 nm is formed. Through the surface oxide film 53, an n-type well region has been formed by implanting phosphorus ions at an acceleration energy of 1 MeV and an implant dose of $1 \times 10^{13}/cm^2$, implanting phosphorus ions at an acceleration energy of 500 keV and an implant dose of $3 \times 10^{12}/cm^2$, and implanting phosphorus ions at an acceleration energy of 150 keV and an implant dose of $1 \times 10^{12}/cm^2$, while a p-type well region has been formed by implanting boron ions at an acceleration energy of 500 keV and an implant dose of $1 \times 10^{13}/cm^2$, implanting boron ions at an acceleration energy of 150 keV and an implant dose of $5 \times 10^{12}/cm^2$, and implanting boron ions at an acceleration energy of 50 keV and an implant dose of $1 \times 10^{12}/cm^2$, though they are not depicted.

Figure 26:
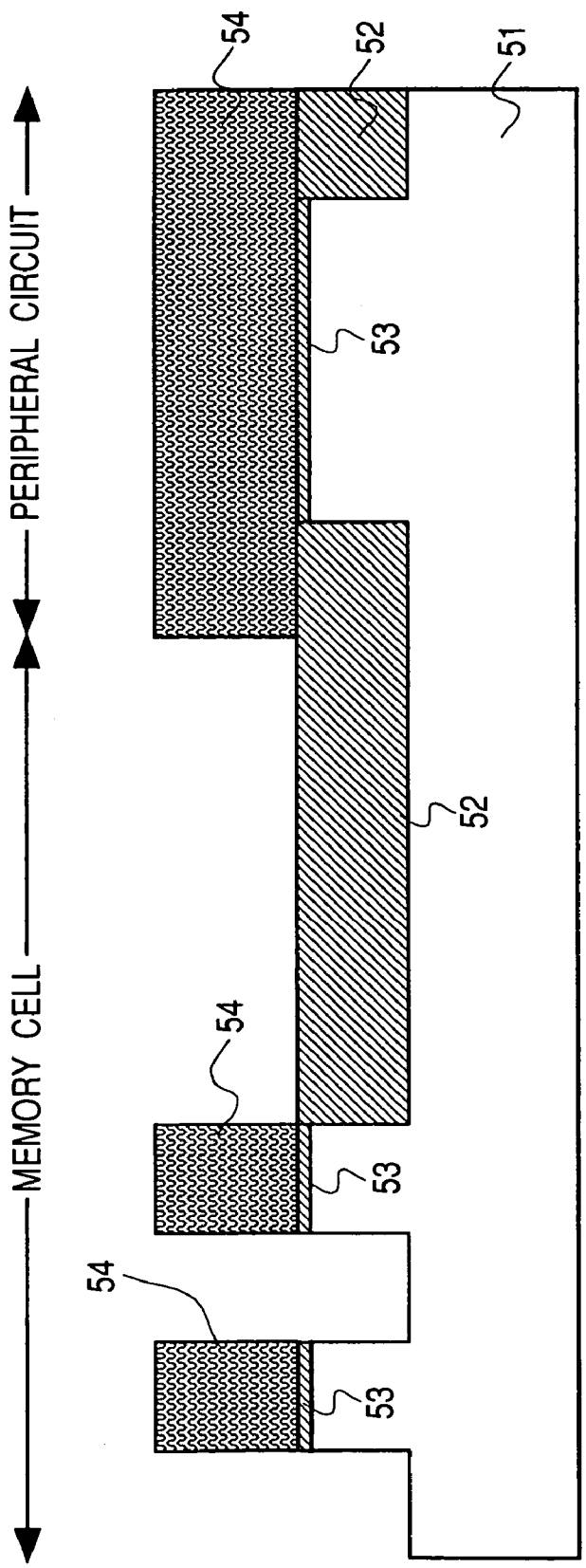
FIG. 26 is a diagrammatic cross-sectional view of the flash memory as seen in a manufacturing process step subsequent to that of FIG. 25.
Figure 27:
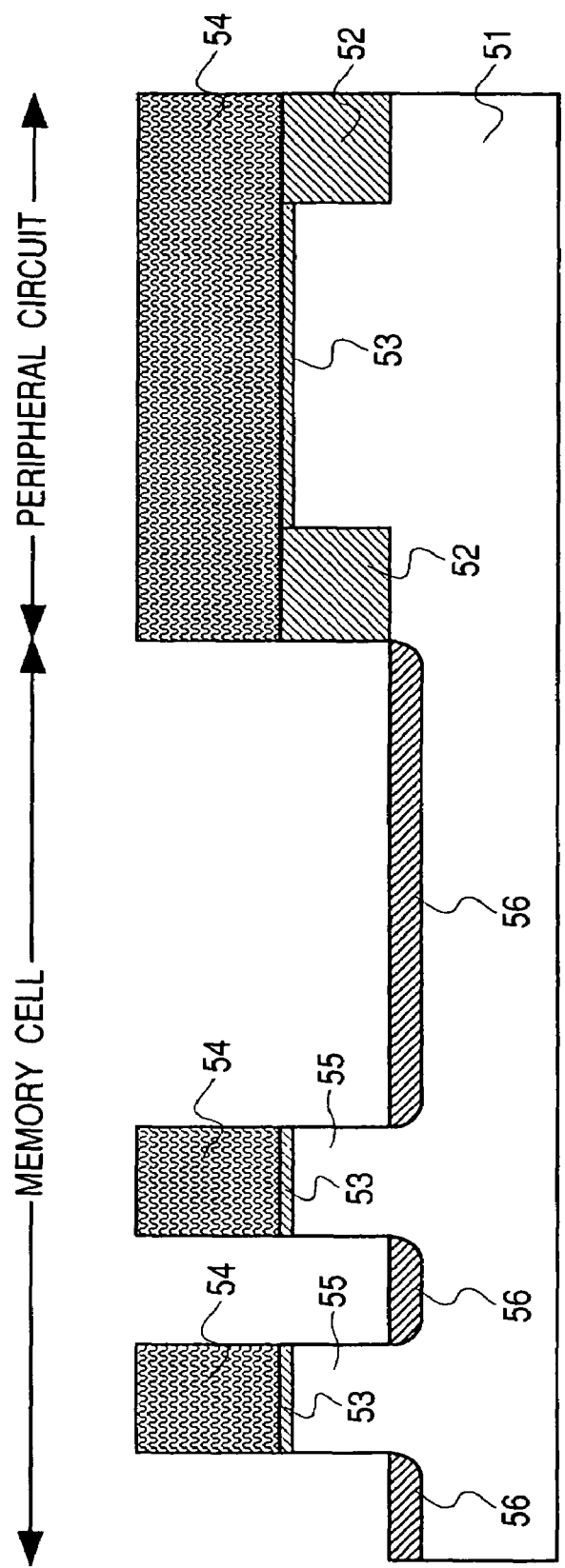
FIG. 27 is a diagrammatic cross-sectional view of the flash memory as seen in a manufacturing process step subsequent to that of FIG. 26.

Next, as shown in FIGS. 26 and 27, the portions of the silicon substrate 51 in the memory cell region are etched to a depth of 250 nm to form rectangular parallelepiped silicon pillars (semiconductor pillars) 55 by using resist patterns 54 as a mask and the portion of the oxide film in trenched isolation region 52 is etched subsequently. It is to be noted that the etching of the oxide film is performed under conditions under which silicon is less likely to be etched.

Since the portion of the oxide film in the trenched isolation region 52 has thus been etched after forming the silicon pillars 55 by etching silicon, the cutting away of the silicon substrate 51 under the trenched isolation region 52 can be prevented. In addition, source regions are formed by implanting phosphorus ions at an acceleration energy of 50 keV and an implant dose of $2 \times 10^{15}/cm^2$ by using the resist patterns 54 as a mask.

Figure 28:
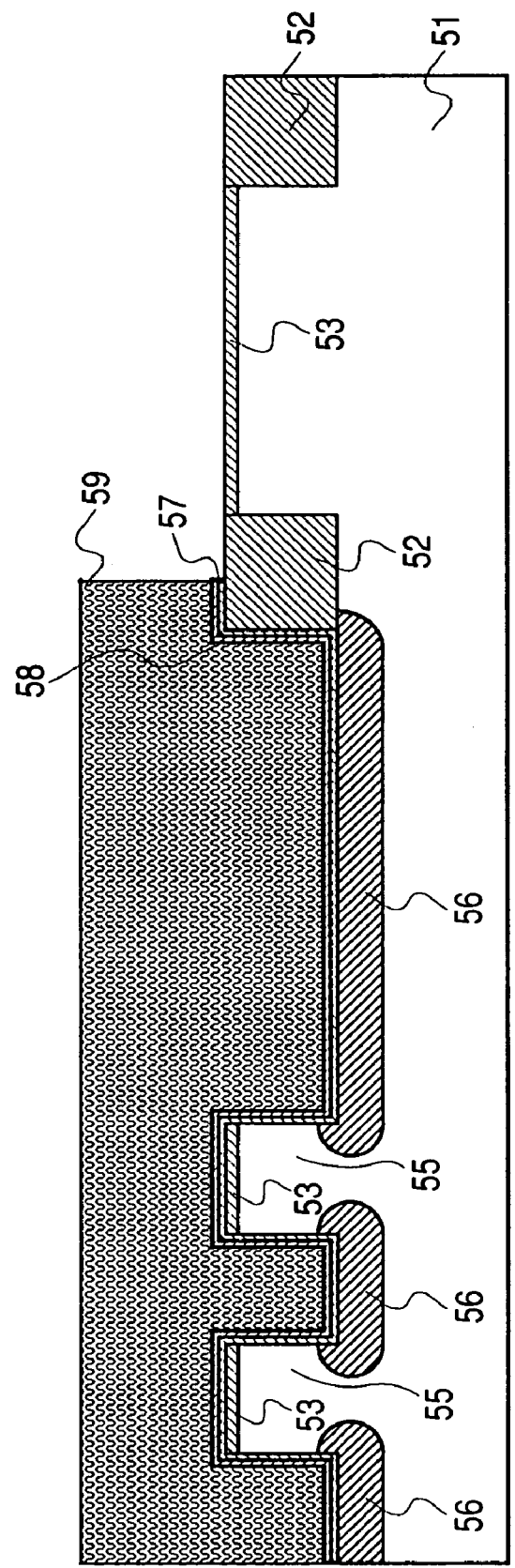
FIG. 28 is a diagrammatic cross-sectional view of the flash memory as seen in a manufacturing process step subsequent to that of FIG. 27.

FIG. 28 shows a state in which an oxide film 57 with a thickness of 5 nm and a nitride film 58 with a thickness of 10 nm have further been deposited by CVD after the removal of the resist patterns 54 and then the portions of the nitride film 58 and the oxide film 57 in the peripheral circuit region have been etched by using a resist pattern 59 covering the memory cell region as a mask.

Figure 29:
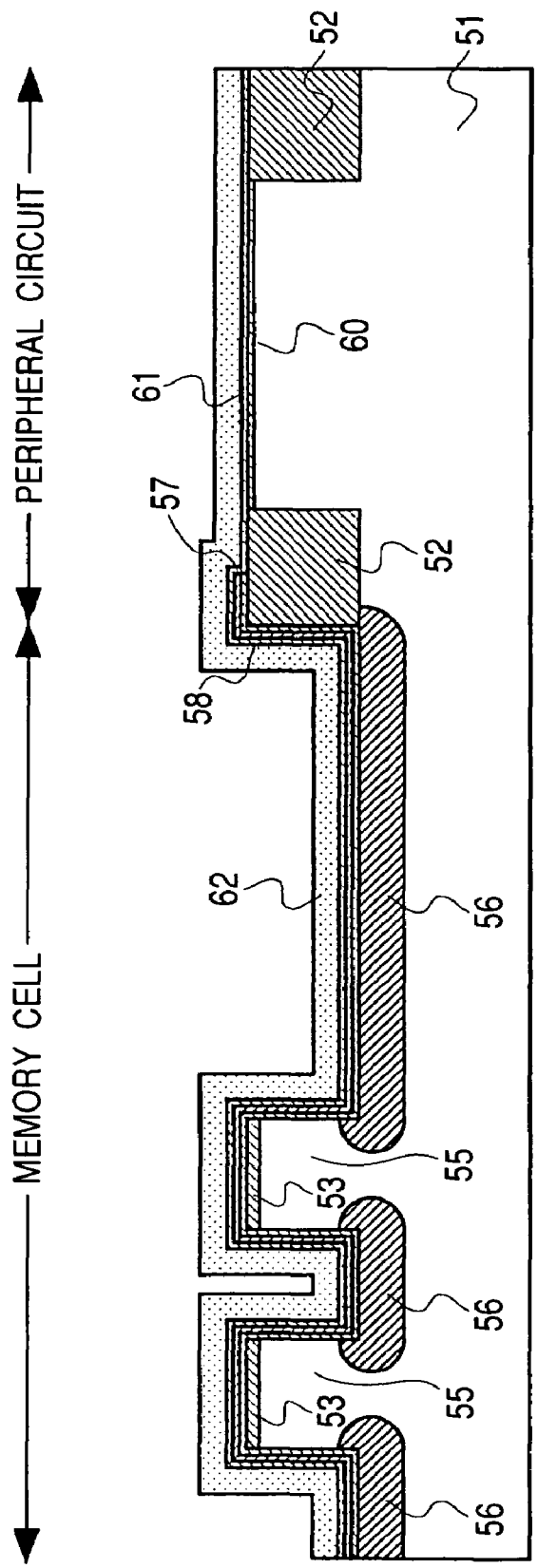
FIG. 29 is a diagrammatic cross-sectional view of the flash memory as seen in a manufacturing process step subsequent to that of FIG. 28.

Subsequently, the resist pattern 59 is removed and the surface oxide film 53 is removed by wet etching, as shown in FIG. 29. Then, gate oxidation for the transistor for the peripheral circuit is performed to grow a gate oxide film 60 with a thickness of 14 nm. Thereafter, an oxide film 61 with a thickness of 4 nm is deposited by CVD and a polysilicon film 62 doped with phosphorus at a concentration of 1×10$^{20}$/cm$^3$ and having a thickness of 80 nm is deposited subsequently.

Figure 30:
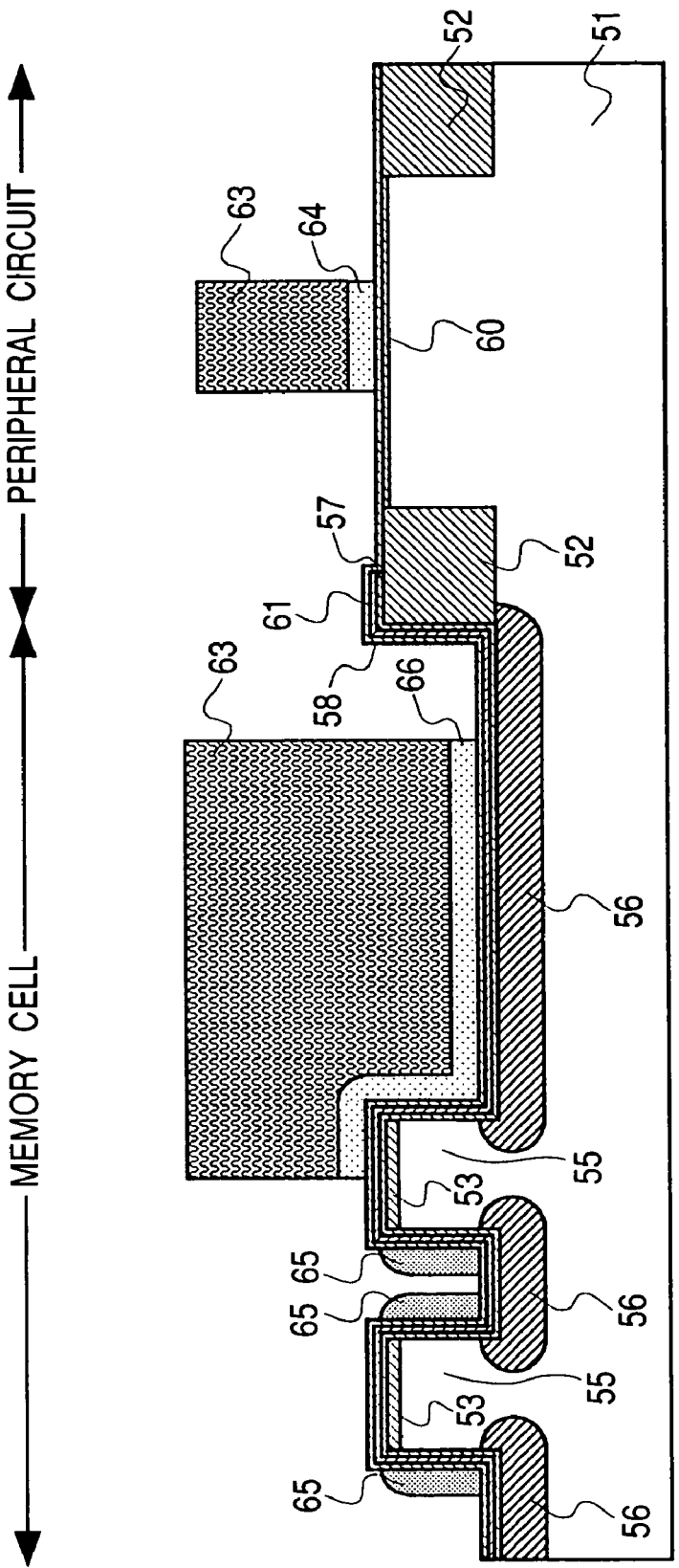
FIG. 30 is a diagrammatic cross-sectional view of the flash memory as seen in a manufacturing process step subsequent to that of FIG. 29.

Next, FIG. 30 shows a state in which processing for forming control gates 65 shaped like side spacers, a control gate connecting region 66, and a peripheral gate 64 has been performed by etching the polysilicon film 62 by using, as a mask, resist patterns 63 for defining the gate electrode of the transistor for the peripheral circuit.

Figure 31:
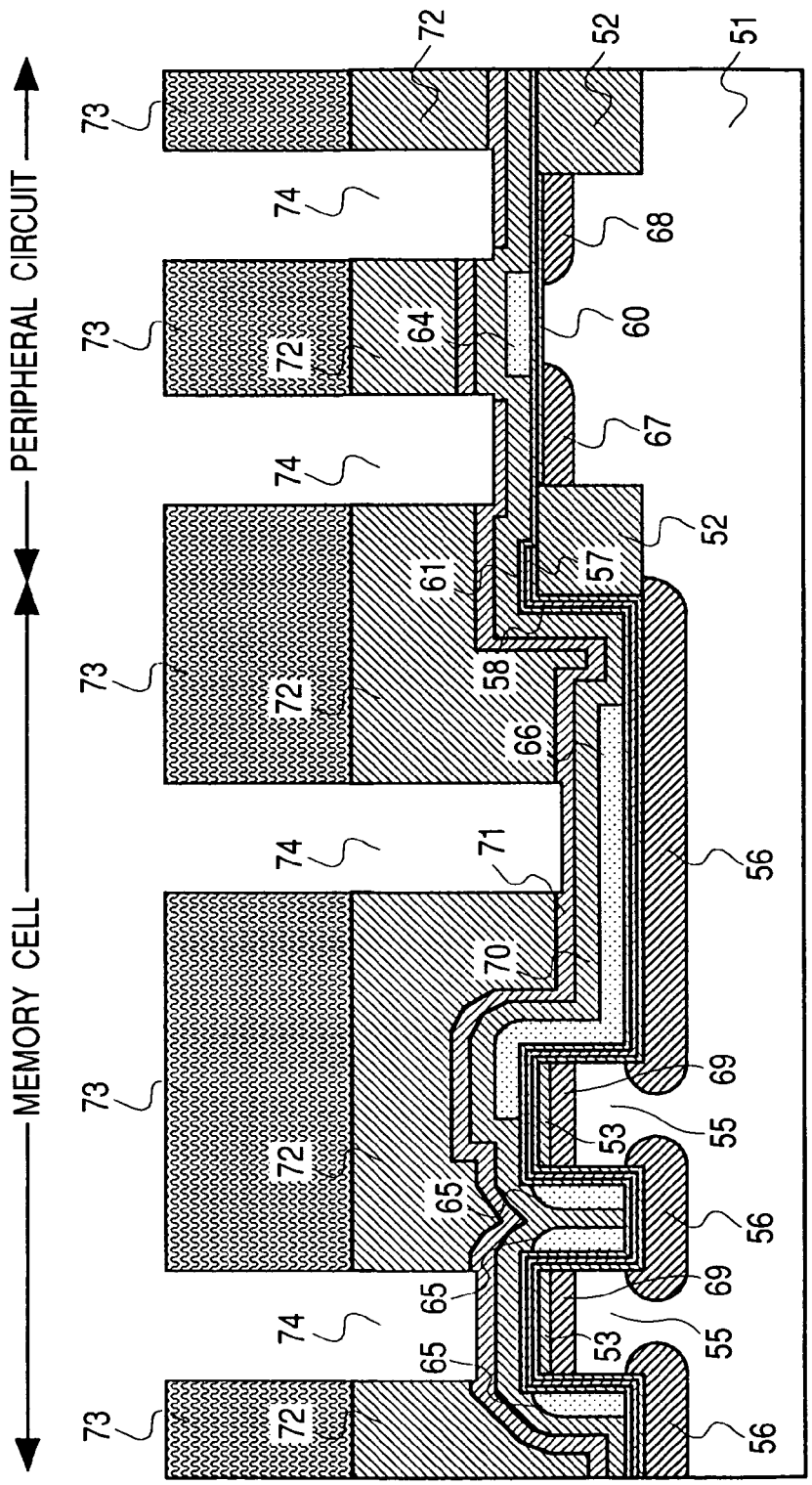
FIG. 31 is a diagrammatic cross-sectional view of the flash memory as seen in a manufacturing process step subsequent to that of FIG. 30.

Next, as shown in FIG. 31, the source and drain region 67 and 68 of the peripheral transistor and the drain regions 69 of the memory cells are formed by implanting arsenic ions at an acceleration energy of 30 keV and an implant dose of 2×10$^{15}$/cm$^2$. Then, an oxide film 70 with a thickness of 40 nm and a nitride film 71 with a thickness of 60 nm are deposited by CVD and an oxide film 72 is further deposited by CVD and planarized by CMP to a thickness of 700 nm. By using resist patterns 73 for forming contact holes as a mask, etching is performed with respect to the oxide film 72 under etching conditions having a selectivity to the nitride film, thereby forming contact holes 74 for the peripheral circuit and contact holes 75 for the memory cell regions.

Figure 32:
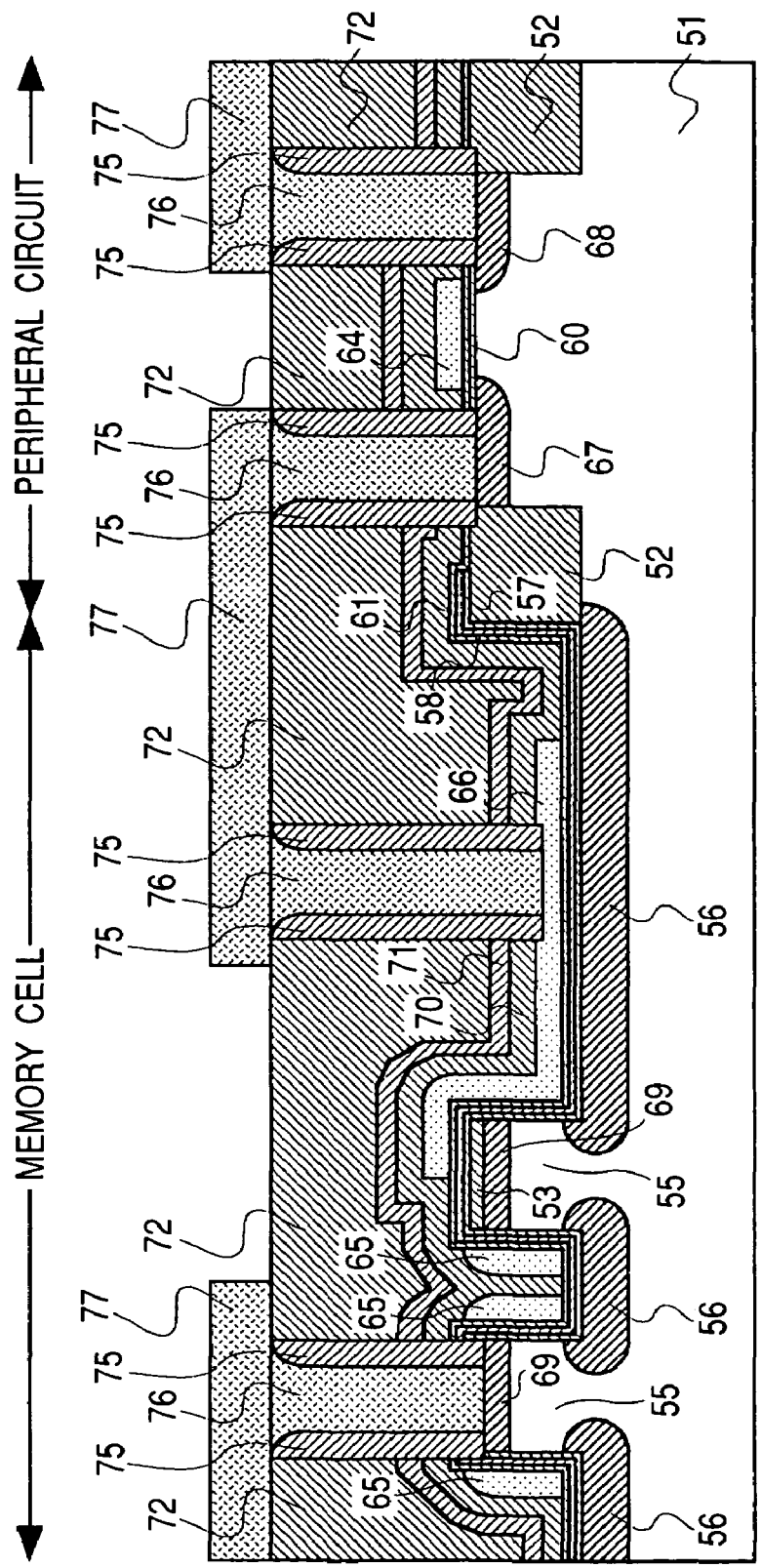
FIG. 32 is a diagrammatic cross-sectional view of the flash memory as seen in a manufacturing process step subsequent to that of FIG. 31.

FIG. 32 shows a subsequent state in which the resist patterns 73 are removed after etching the portions of the nitride film 71 and the oxide film 70 at the bottom portions of the contact holes 74 and 75, the contact holes 74 and 75 are filled with tungsten plugs 76 formed by sputtering and CVD and planarized by CMP, and first metal lines 77 each composed of a tungsten film with a thickness of 300 nm are formed.

Figure 33:
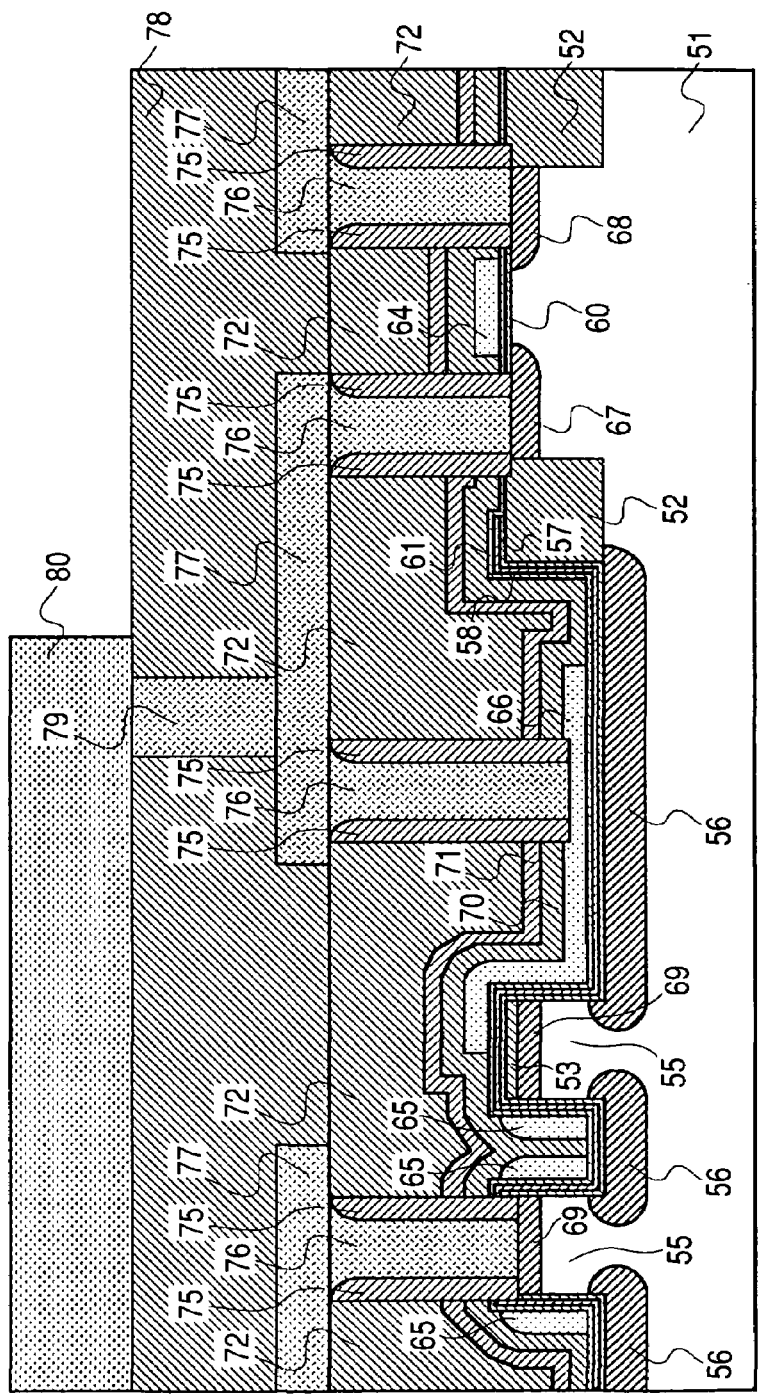
FIG. 33 is a diagrammatic cross-sectional view of the flash memory as seen in a manufacturing process step subsequent to that of FIG. 32.

Finally, as shown in FIG. 33, a first interlayer oxide film 78 with a thickness of 500 nm is deposited by CVD, a first connection plug 79 is formed, and then a second metal line 80 composed of an aluminum film with a thickness of 500 nm is formed. Further, the process steps of depositing a second interlayer insulating film, forming a second connection plug, forming a third metal line, depositing a passivation film, and forming an opening in a bonding pad portion are performed, though they are not depicted, whereby the manufacturing process for the flash memory according to the present embodiment is completed.

Each of the nonvolatile memory cells according to the present embodiment has been designed to have a minimum dimension of F=0.25 µm and a cell area of 2F$^2$=0.125 µm$^2$.

A write operation to the nonvolatile memory cell according to the present embodiment was performed by applying 5 V to the bit line and applying a pulse voltage of 8 V to the control gate electrode with a pulse width of 1 µs and the threshold voltage was raised from 2 V to 4 V. On the other hand, an erase operation was performed by applying 6 V to the bit line and applying a pulse voltage of −8 V to the control gate electrode with a pulse width of 50 ms in the state in which the potential at the source region is open and the threshold voltage was lowered successfully from 4 V to 2 V. After performing 100,000 rewrite operations under the write/erase voltage conditions described above, variations in threshold voltage after writing and erasing were 0.4 V or less. Variations caused by rewriting in the properties of the memory cell were suppressed successfully to a 1.2-fold increase in write time, a 3-fold increase in erase time, and a 0.8-fold reduction in read current. In a read operation involving the application of 1 V to the bit line and 3 V to the control gate, a read current having a sufficiently large value of 25 µA was obtained successfully, which proved the effectiveness of the present invention.

EMBODIMENT 4

Figure 34:
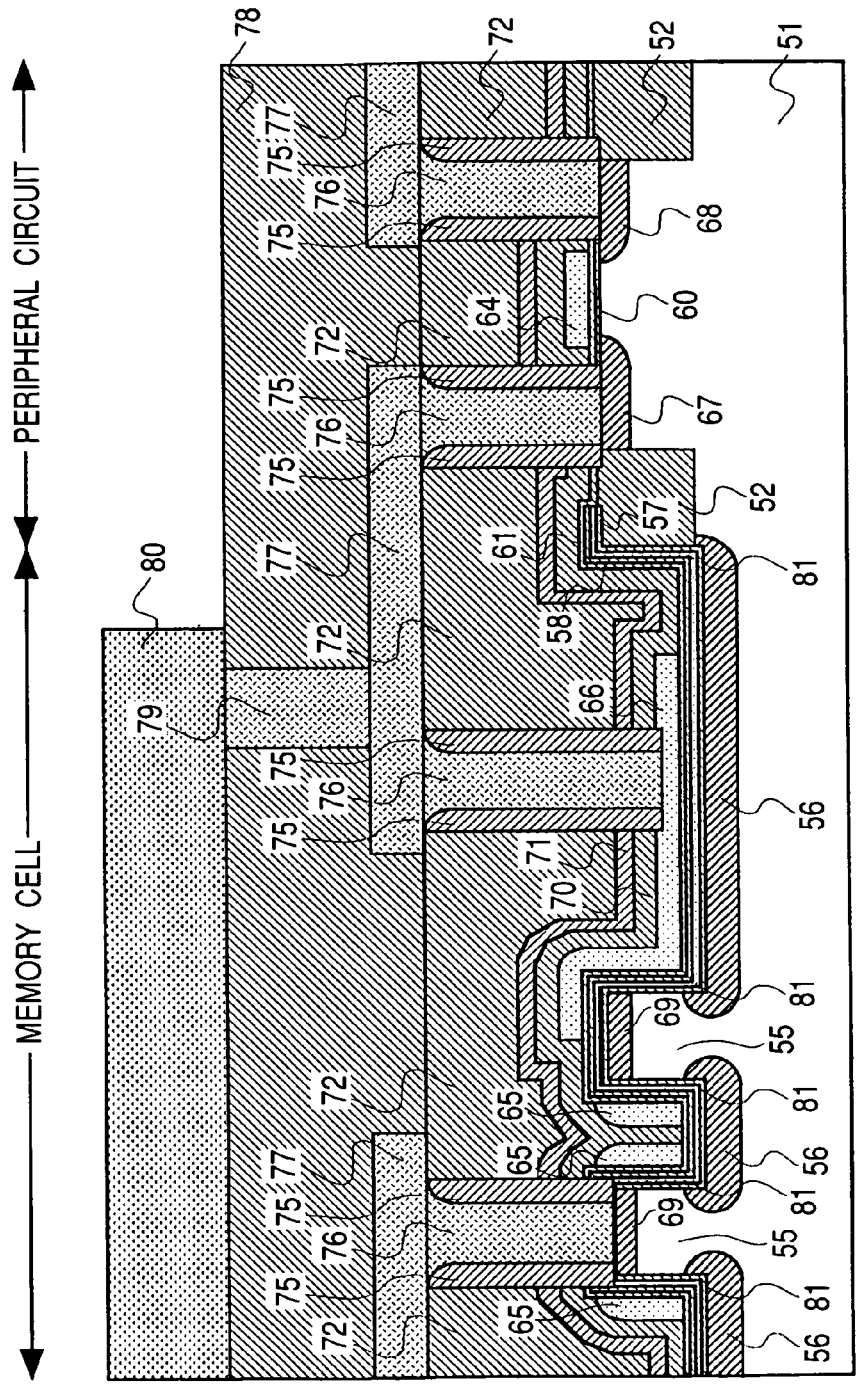
FIG. 34 is a diagrammatic cross-sectional view of the flash memory as seen in a manufacturing process step subsequent to that of FIG. 33.

In the present embodiment, the multilayer film composing the gate insulating film of the memory cell in Embodiment 3 described above and consisting of the oxide film 57 with a thickness of 5 nm, the nitride film 58 with a thickness of 10 nm, and the oxide film 61 with a thickness of 5 nm was changed to an oxide film 57 with a thickness of 4 nm, a non-doped polysilicon film 81 with a thickness of 3 nm, a nitride film 58 with a thickness of 5 nm, and an oxide film 61 with a thickness of 5 nm, as shown in the cross-sectional view of FIG. 34. In contrast to the first embodiment in which the electron trap region is in the nitride film 58 with a thickness of 10 nm, the present embodiment primarily uses an interfacial trap between the non-doped polysilicon film 81 with a thickness of 3 nm and the nitride film 58 with a thickness of 5 nm as the charge accumulation region.

Figure 35:
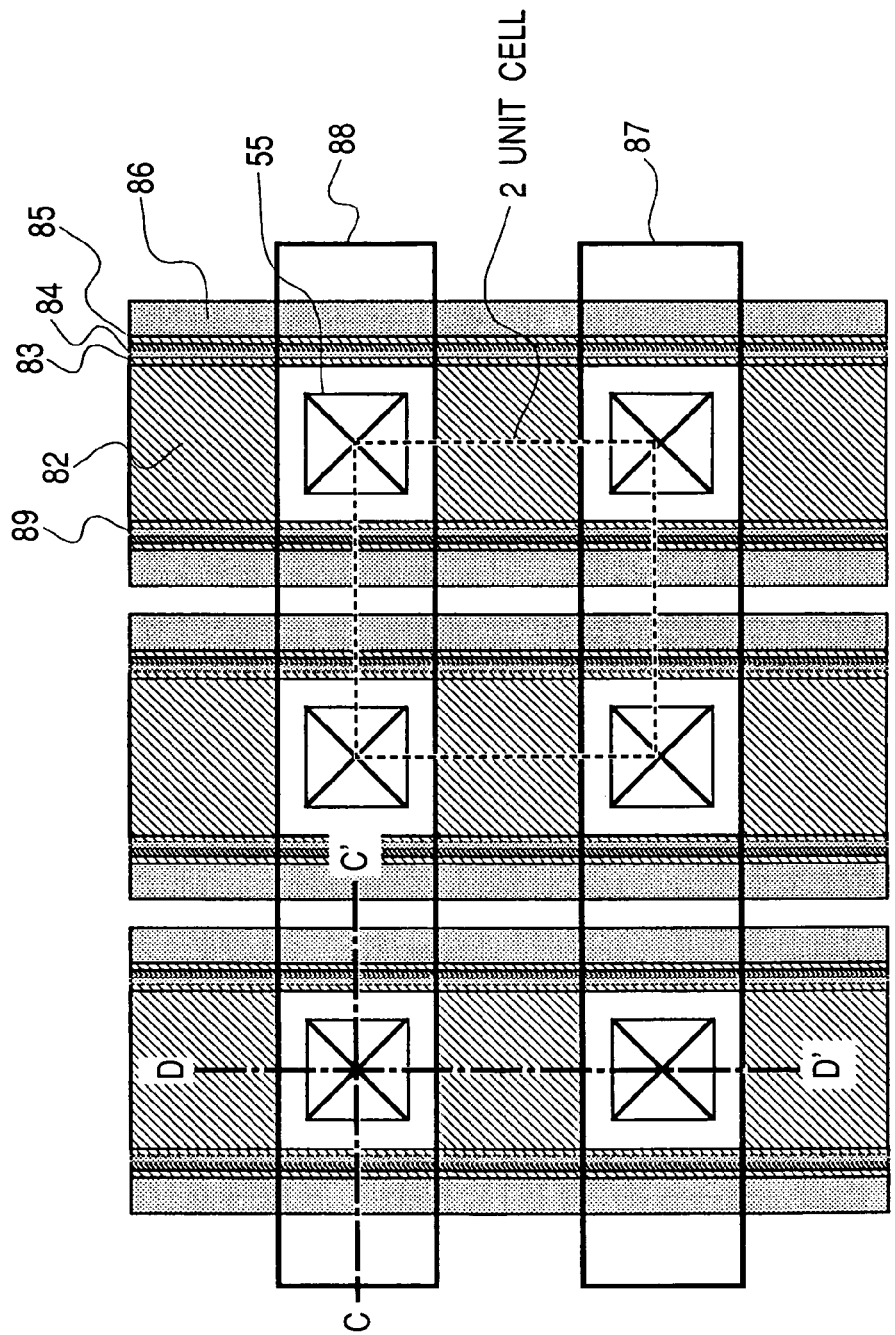
FIG. 35 is a diagrammatic plan view showing the structure of a memory cell array portion in a flash memory representing Embodiment 4 of the present invention.

A plan view of memory cells according to the present embodiment is shown in FIG. 35, in which channel regions, oxide films 83 (57) each having a thickness of 4 nm, the non-doped polysilicon films 81 each having a thickness of 3 nm, nitride films 84 (58) each having a thickness of 5 nm, and oxide films 85 (61) each having a thickness of 5 nm are stacked in layers on the side surface portions of the rectangular-parallelepiped semiconductor pillars 55 which are dielectrically isolated from each other by rectangular parallelepiped trenched isolation regions (insulator pillars) 82, control gates 86 each composed of a polysilicon film with a thickness of 70 nm are disposed as side spacers, and contact holes 87 to the drain regions and bit lines 88 are disposed on the upper surface regions of the rectangular-parallelepiped semiconductor pillars 55.

Cross sections along the C–C' and D–D' directions shown in FIG. 35 are shown in FIGS. 36(a) and 36(b), respectively. In the cross section along the C–C' direction, oxide films 94 (83) each having a thickness of 4 nm, non-doped polysilicon films 102 (81) each having a thickness of 3 nm, nitride films 95 (84) each having a thickness of 5 nm, and oxide films 96 (85) each having a thickness of 5 nm are stacked in layers over the surface region of a p-type semiconductor substrate 91 (51) with a resistivity of 10 Ωcm and the side surface portions of a semiconductor pillar 101 (55) configured as a rectangular parallelepiped of 0.25 µm, followed by control gates 97 (86) each composed of a polysilicon film with a thickness of 70 nm and disposed as side spacers such that the outer circumference is covered successively therewith, while source regions 92 (56) are disposed in the lower portions of the rectangular-parallelepiped semiconductor pillars 101 (55) and a drain region 93 (69) is disposed in the upper portion thereof. In the cross section along the D–D' direction, the rectangular-parallelepiped semiconductor pillars 101 are isolated by insulating films 98 and the drain region 93 is connected to bit lines 100 with line widths and line spacings of 0.25 µm via contact plugs 99.

Each of the nonvolatile memory cells according to the present embodiment has been designed to have a minimum dimension of F=0.25 µm and a cell area of 2F$^2$=0.125 µm$^2$.

In a write operation to the nonvolatile memory cell according to the present embodiment, hot electrons were injected by applying 5 V to the bit line and applying a pulse voltage of 8 V to the control gate electrode with a pulse width of 1 µs to be trapped in the interface between the non-doped polysilicon film 102 and the nitride film 95 so that the threshold voltage was raised from 2 V to 4 V. On the other hand, an erase operation was performed by applying 5 V to the semiconductor substrate 91 and applying a pulse voltage of −8 V to the control gate electrode with a pulse width of 10 ms in the state in which the potential at the source region is open so that the trapped electrons are detrapped into the non-doped polysilicon film 102 and then extracted to the semiconductor substrate 91 by using a tunnel current flowing in the oxide film 94.

After performing 100,000 rewrite operations to the nonvolatile memory cell according to the present embodiment under the write/erase voltage conditions described above, variations in threshold voltage after writing and erasing were as excellent as 0.2 V or less. Variations caused by rewriting in the properties of the memory cell were suppressed successfully to a 1.2-fold increase in write time, a 3-fold increase in erase time, and a 0.9-fold reduction in read current. In a read operation involving the application of 1 V to the bit line and 3 V to the control gate, a read current having a sufficiently large value of 25 μA was obtained successfully, which proved the effectiveness of the present invention.

EMBODIMENT 5

Figure 37:
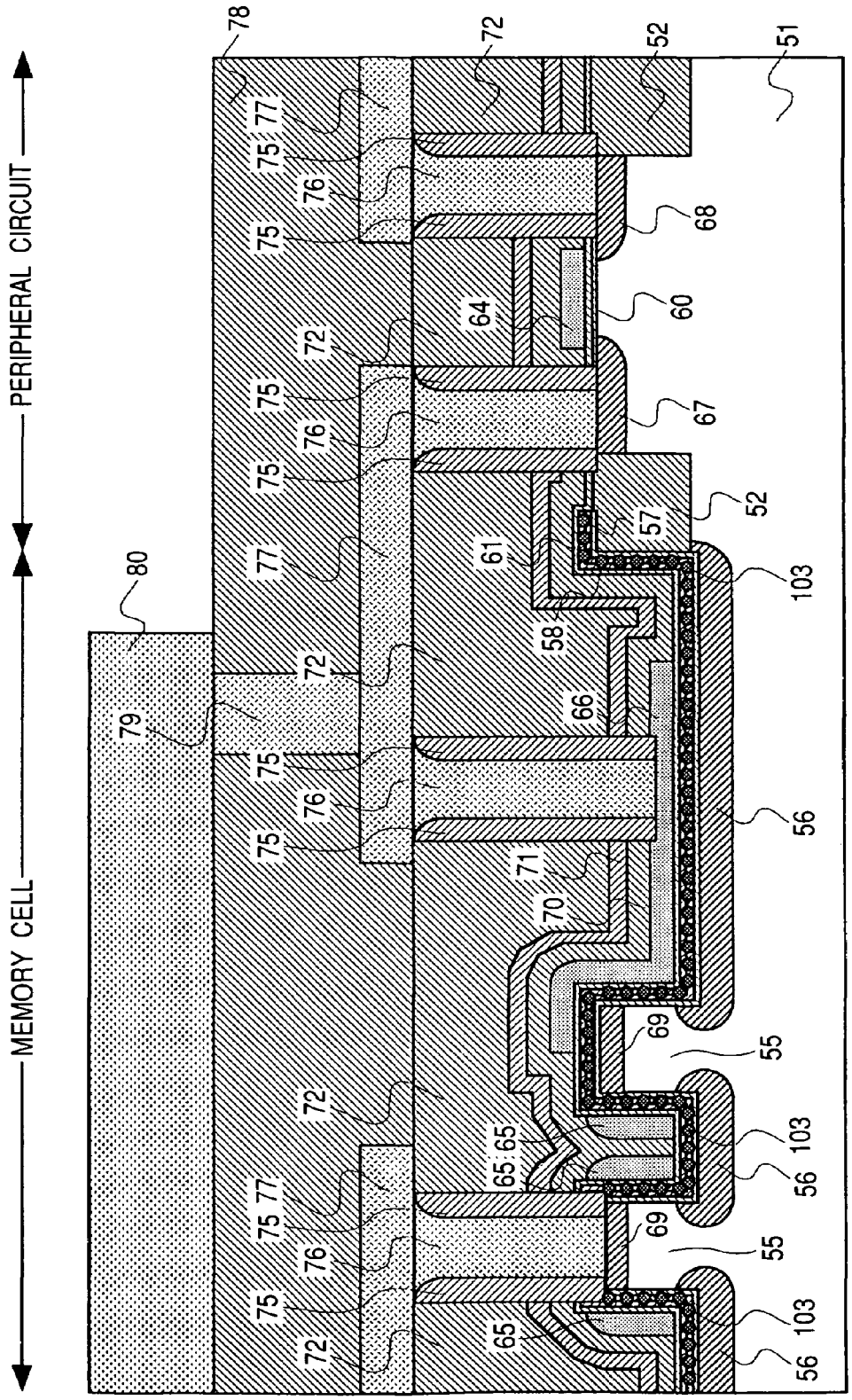
FIG. 37 is a diagrammatic plan view showing the structure of a flash memory representing Embodiment 5 of the present invention.

Of the oxide film 57 with a thickness of 4 nm, the non-doped polysilicon film 81 with a thickness of 3 nm, the nitride film 58 with a thickness of 5 nm, and the oxide film 61 with a thickness of 5 nm composing the gate insulating film of the memory cell in Embodiment 3, the non-doped polysilicon film 102 with a thickness of 3 nm was changed to non-doped polysilicon grains 103 each having a diameter of 4 nm in the present embodiment, as shown in FIG. 37. The average diameter of the non-doped polysilicon grains 103 was 4 nm, the average spacing thereof was 5 nm, and the effective surface density thereof was $1.2 \times 10^{12}$ cm$^{-2}$.

In a write operation to the nonvolatile memory cell according to the present embodiment, hot electrons were injected by applying 5 V to the drain region 69 and applying a pulse voltage of 8 V to the control gate electrode 65 with a pulse width of 1 μs to be trapped in the interface between each of the non-doped polysilicon grains 103 and the nitride film 58 so that the threshold voltage was raised from 2 V to 5 V, in the same manner as in the case of Embodiment 3. On the other hand, an erase operation was performed by applying 5 V to the semiconductor silicon substrate (semiconductor substrate) 51 and applying a pulse voltage of 8 V to the control gate electrode 65 with a pulse width of 50 ms in the state in which the potential at the source region 56 is open so that the trapped electrons are detrapped into the non-doped polysilicon grains 103 and then extracted to the semiconductor substrate 51 by using a tunnel current flowing in the oxide film 57.

EMBODIMENT 6

Figure 38:
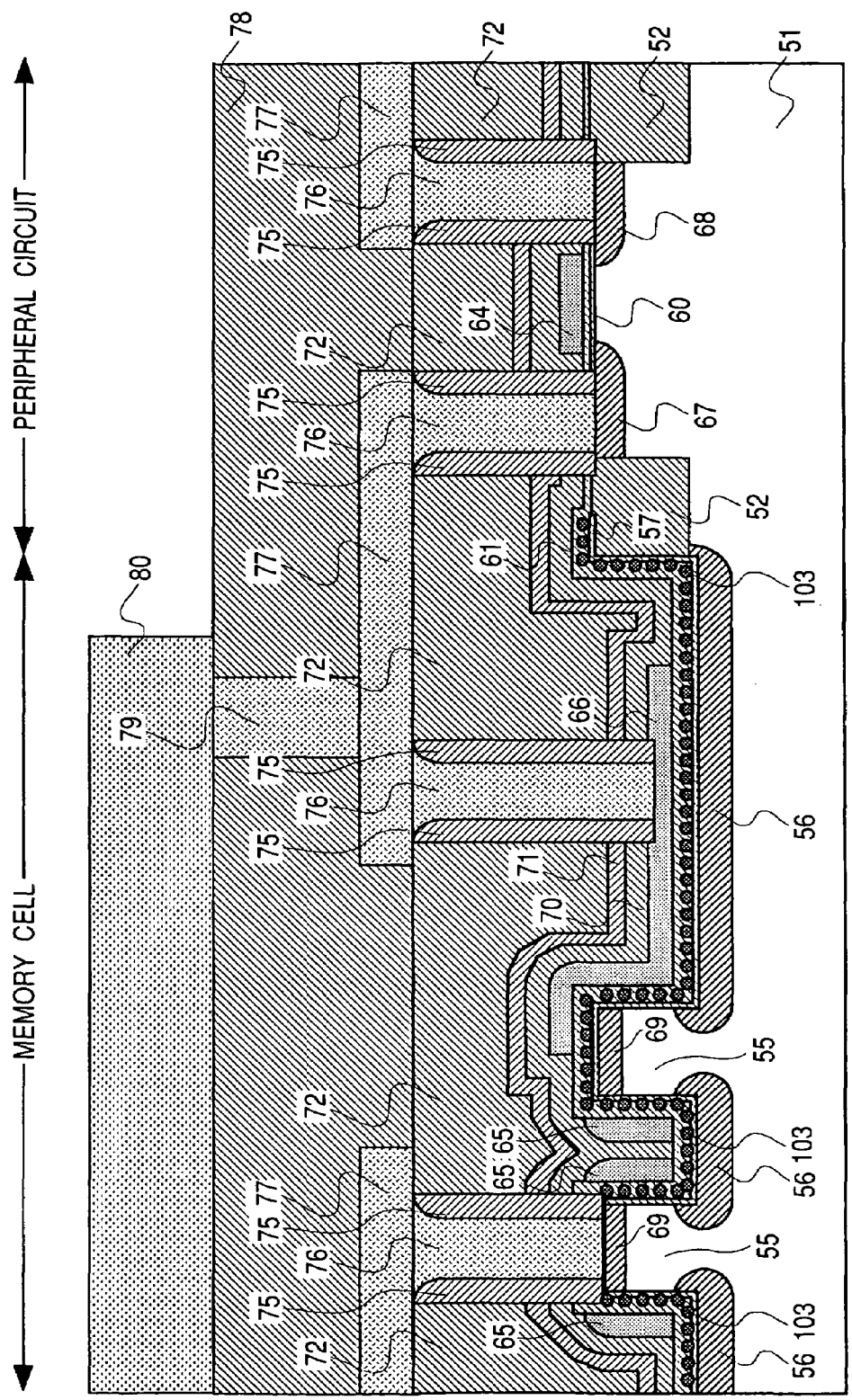
FIG. 38 is a diagrammatic plan view showing the structure of a flash memory representing Embodiment 6 of the present invention.
Figure 39:
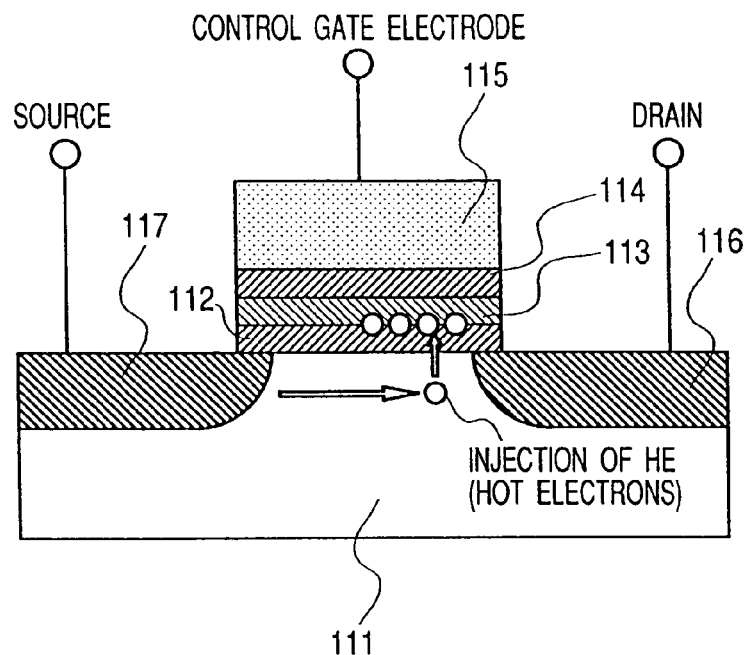
FIG. 39 is a diagrammatic cross-sectional view showing the structure of a first cell representing conventional technology.
Figure 40:
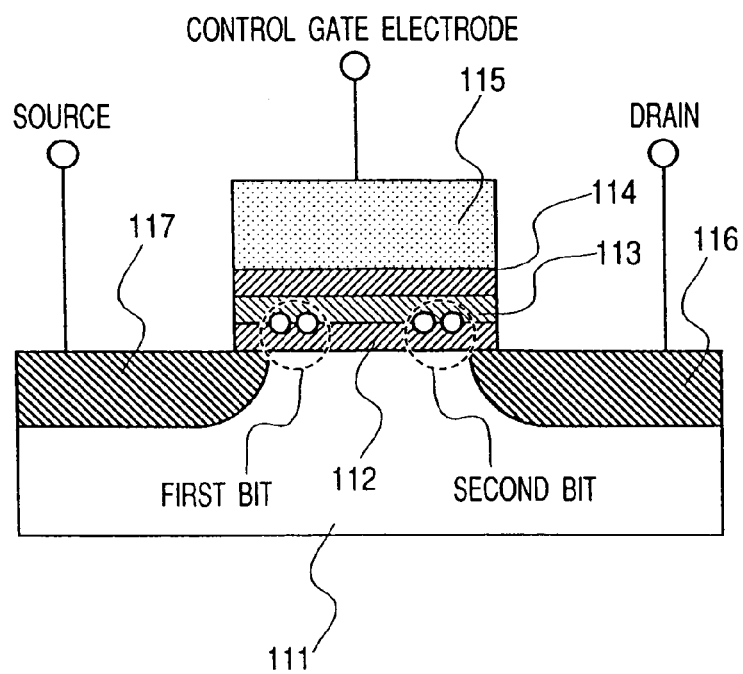
FIG. 40 is a diagrammatic cross-sectional view showing the structure of a second cell representing conventional technology.
Figure 41:
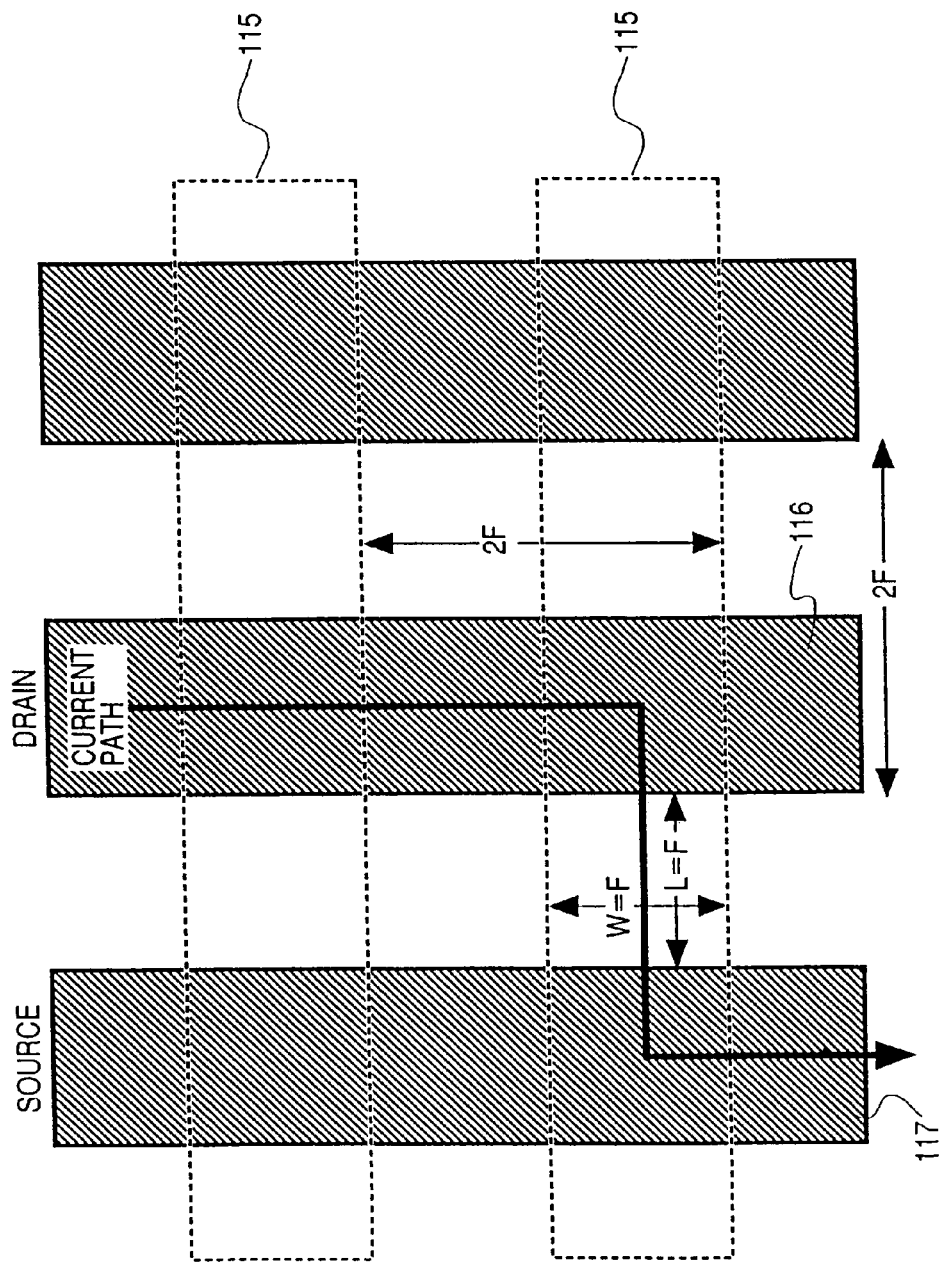
FIG. 41 is a diagrammatic plan view showing the structure of a third cell representing conventional technology.
Figure 42:
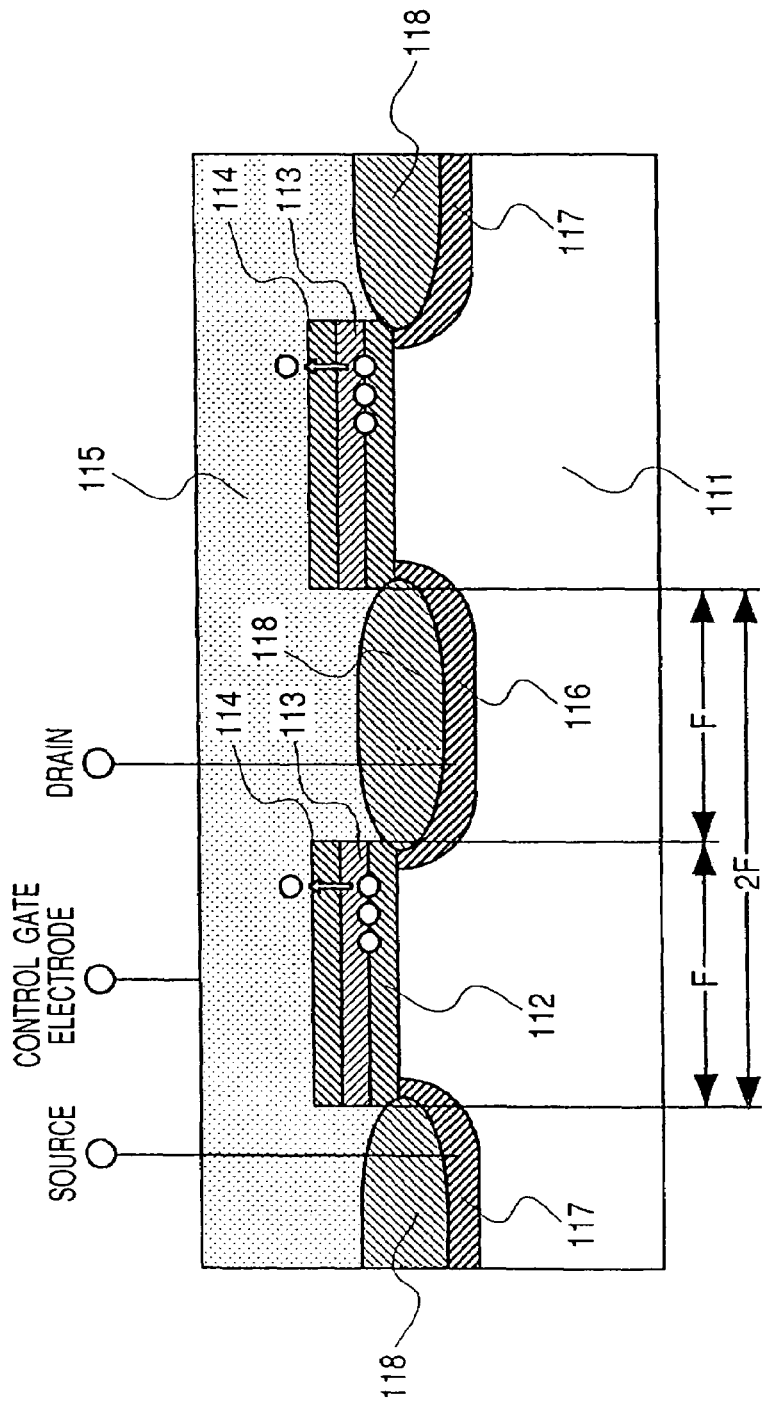
FIG. 42 is a diagrammatic cross-sectional view taken along the direction of the gate length of the third cell shown in FIG. 41.
Figure 43:
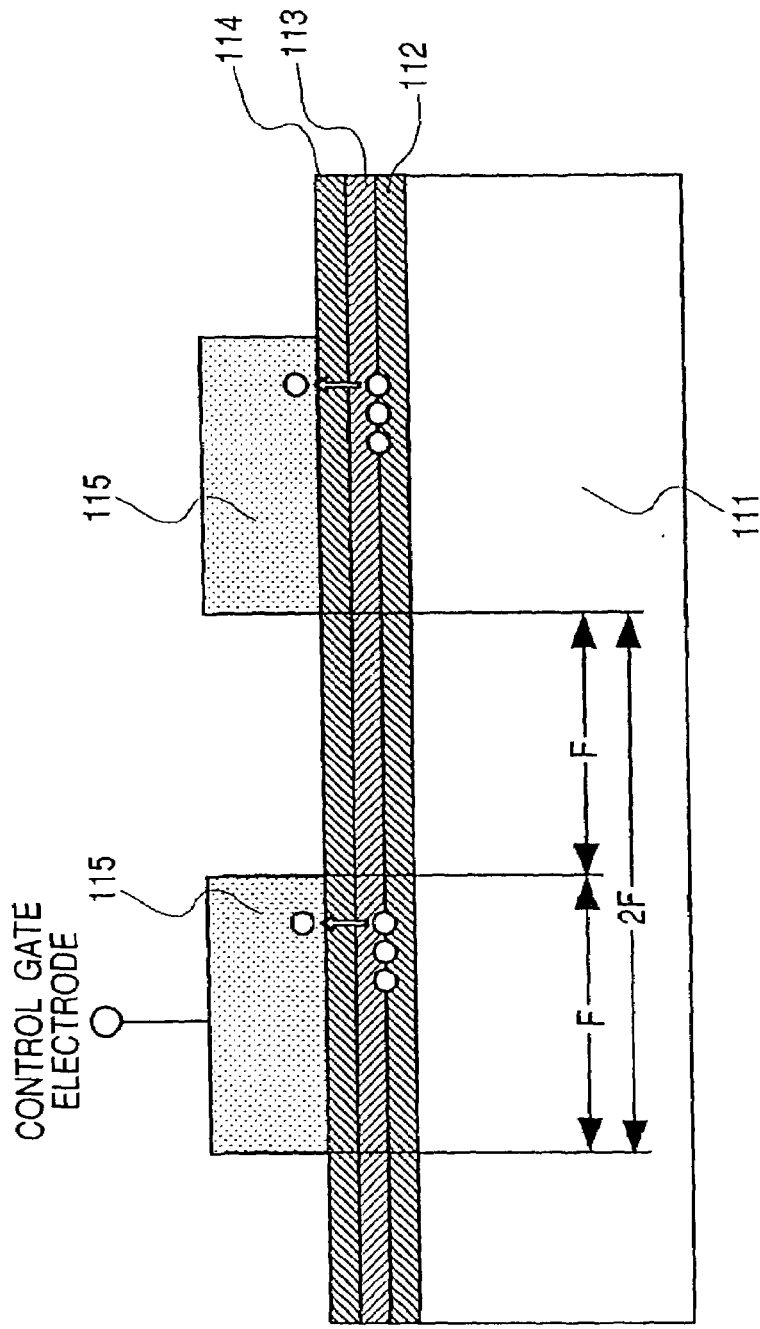
FIG. 43 is a diagrammatic cross-sectional view taken along the direction of the gate width of the third cell shown in FIG. 41.

In a structure according to the present embodiment, the nitride film 58 composing the gate insulating film of the memory cell in Embodiment 5 is not provided as shown in FIG. 38.

EMBODIMENT 7

Of the oxide film 57 with a thickness of 5 nm, the nitride film 58 with a thickness of 10 nm, and the oxide film 61 with a thickness of 5 nm composing the gate insulating film of the memory cell in Embodiment 3 described above, the nitride film 58 was replaced with a metal oxide film in the present embodiment. As the metal oxide film, ditantalum pentaoxide ($Ta_2O_5$), alumina ($Al_2O_3$), titanium oxide ($Ti_2$), zirconium oxide ($ZrO_2$), hafnium oxide ($HfO_2$), or the like can be used provided that the film thickness is optimized depending on the individual dielectric constants thereof.

Although the invention achieved by the present inventor has been described specifically based on various embodiments thereof, the present invention is not limited thereto. It will easily be appreciated that various changes and modifications can be made in the invention without departing from the gist thereof.

The following is a brief description of effects achievable by a representative aspects of the invention disclosed in the present application.

In accordance with the present invention, a read current for a nonvolatile memory using a nonconductive charge trap film as a charge accumulation region can be improved significantly and there can be provided a semiconductor integrated circuit device capable of eliminating a read failure due to data inversion caused by read disturb.

In accordance with the present invention, there can be provided a device structure which allows easy reduction of the cell area of the nonvolatile memory using the nonconductive charge trap film as the charge accumulation region.

In accordance with the present invention, a semiconductor integrated circuit device having nonvolatile memory elements to which electrical writing and erasing of data can be performed can be improved in electric reliability.

Thus, the semiconductor integrated circuit device according to the present invention is useful as a semiconductor product to be incorporated into electronic equipment and is particularly useful as a semiconductor memory to be incorporated into mobile electronic equipment such as a memory card or mobile phone.

The invention claimed is:

1. A semiconductor integrated circuit device comprising electrically writable nonvolatile memory elements each including, in a semiconductor region:

a source region;

a drain region;

a channel formation region interposed between said source region and said drain region; and a control gate electrode, wherein two of said channel formation regions are disposed independently over respective opposing side surfaces of each of rectangular-parallelepiped semiconductor pillars, said drain region connected to said two channel formation regions is formed in an upper portion of said rectangular-parallelepiped semiconductor pillar, each of a plurality of insulator pillars is disposed between adjacent ones of said semiconductor pillars to form a row such that said channel forming regions are not faced toward side surfaces of said insulators pillars, a first insulating film is provided between each of said channel formation regions and said control gate electrode, a nonconductive charge trap film is provided over said first insulating film, and a second insulating film is provided over said nonconductive charge trap film.

2. A semiconductor integrated circuit device according to claim 1, wherein writing is performed by placing said source region at a ground potential, giving a proper positive potential to each of said drain region and said control gate electrode to turn ON said channel formation regions, and injecting hot electrons generated in the vicinity of said drain region such that the electrons are trapped in said nonconductive charge trap film, and wherein erasing is performed by giving a proper negative potential and a proper positive potential to said control gate electrode and said drain region, respectively, and thereby extracting the electrons trapped in said nonconductive charge trap film to said semiconductor region by using a tunnel current flowing in said first insulating film.

3. A semiconductor integrated circuit device according to claim 1, wherein said first insulating film is a silicon oxide film, said nonconductive charge trap film is a silicon nitride film, and said second insulating film is a silicon oxide film.

4. A semiconductor integrated circuit device according to claim 1, wherein said first insulating film is a silicon oxide film, said nonconductive charge trap film is a metal oxide film, and said second insulating film is a silicon oxide film.

5. A semiconductor integrated circuit device comprising electrically writable nonvolatile memory elements each including, in a semiconductor region:
   a source region;
   a drain region;
   a channel formation region interposed between said source region and said drain region; and
   a control gate electrode,
   wherein two of said channel formation regions are disposed independently over respective opposing side surfaces of each of rectangular-parallelepiped semiconductor pillars, said drain region connected to said two channel formation regions is formed in an upper portion of said rectangular-parallelepiped semiconductor pillar, each of a plurality of insulator pillars is disposed between adjacent ones of said semiconductor pillars to form a row such that said channel forming regions are not faced toward side surfaces of said insulators pillars, a first insulating film is provided between each of said channel formation regions and said control gate electrode, a semiconductor film is provided over said first insulating film, a nonconductive charge trap film is provided over said first insulating film, a second insulating film is provided over said nonconductive charge trap film, and electrons are trapped primarily in a charge trap level at an interface between said semiconductor film and the nonconductive charge trap film.

6. A semiconductor integrated circuit device according to claim 5,
   wherein writing is performed by placing said source region at a ground potential, giving a proper positive potential to each of said drain region and said control gate electrode to turn ON said channel formation regions, and injecting hot electrons generated in the vicinity of said drain region such that the electrons are trapped primarily in a charge trap level at an interface between said semiconductor film and said nonconductive charge trap film, and
   wherein erasing is performed by giving a proper negative potential and a proper positive potential to said control gate electrode and said drain region, respectively, and thereby extracting the trapped electrons to said semiconductor region by using a tunnel current flowing in said semiconductor film and the first insulating film.

7. A semiconductor integrated circuit device according to claim 5, wherein said first insulating film is a silicon oxide film, said semiconductor film is a polysilicon film, said nonconductive charge trap film is a silicon nitride film, and said second insulating film is a silicon oxide film.

8. A semiconductor integrated circuit device according to claim 5, wherein said first insulating film is a silicon oxide film, said semiconductor film is a polysilicon film, said nonconductive charge trap film is a metal oxide film, and said second insulating film is a silicon oxide film.

9. A method for manufacturing a semiconductor integrated circuit device, comprising at least the steps of:
   alternately forming, over a semiconductor substrate, trenched isolation regions, each comprised of insulator material, and semiconductor active regions, each comprised of a semiconductor material, in stripes, performing etching with respect to said semiconductor active regions and said trenched isolation regions in stripes in directions orthogonal to said trenched isolation regions and semiconductor active regions in stripes to form rectangular-parallelepiped semiconductor pillars and rectangular-parallelepiped insulator pillars such that each of insulator pillars is disposed between adjacent ones of said semiconductor pillars to form a row;
   forming channel formation regions in respective side surface portions of each of said rectangular-parallelepiped semiconductor pillars, depositing a multilayer film comprised of a first oxide film, a nitride film, and a second oxide film over each of said channel formation regions, and forming word lines comprised of side spacers each made of a conductive film; and
   forming a drain region in an upper portion of each of said rectangular-parallelepiped semiconductor pillars.

10. A method for manufacturing a semiconductor integrated circuit device, comprising at least the steps of:
    alternately forming, over a semiconductor substrate, trenched isolation regions, each comprised of insulator material, and semiconductor active regions, each comprised of a semiconductor material, in stripes, performing etching with respect to said semiconductor active regions and said trenched isolation regions in stripes in directions orthogonal to said trenched isolation regions and semiconductor active regions in stripes to form rectangular-parallelepiped semiconductor pillars and rectangular-parallelepiped insulator pillars, such that each of said insulator pillars is disposed between adjacent ones of said semiconductor pillars to form a row;
    forming channel formation regions in respective side surface portions of each of said rectangular-parallelepiped semiconductor pillars, depositing a multilayer film comprised of a first oxide film, a polysilicon film, a nitride film, and a second oxide film over each of said channel formation regions, and forming word lines comprised of side spacers each made of a conductive film; and
    forming a drain region in an upper portion of each of said rectangular-parallelepiped semiconductor pillars.

11. A method of manufacturing a semiconductor integrated circuit device, comprising steps of:
    forming a conductive film covering projecting island regions which are formed in stripes and regions adjacent to said projecting island regions, wherein an insulating film is formed between said projecting island regions and said conductive film; and
    performing anisotropic etching to said conductive film by using a mask covering contact regions to be formed from said conductive film so as to form conductive lines on side surfaces of said projecting island regions and said contact regions integrated with said conductive lines.

12. A method of manufacturing a semiconductor integrated circuit device according to claim 11, wherein said anisotropic etching is performed so as to form an electrode of a peripheral circuit element in a peripheral circuit forming region by using said mask.

13. A method of manufacturing a semiconductor integrated circuit device according to claim 11, wherein said insulating film includes a film for discretely accumulating charge therein, and
wherein each said conductive line serves as a gate electrode of a nonvolatile memory element and has a shape of a side wall spacer formed in self-alignment to said side surface of a corresponding one of said projecting island regions.

14. A method of manufacturing a semiconductor integrated circuit device, comprising steps of:
forming a conductive film covering projecting island regions which are formed in stripes and regions adjacent to said projecting island regions; wherein an insulating film is formed between said projecting island regions and said conductive film; and
performing anisotropic etching to said conductive film by using a mask covering contact regions to be formed from said conductive film so as to form conductive lines on side surfaces of said projecting island regions and said contact regions integrated with said conductive lines,
wherein said anisotropic etching is performed so as to form an electrode of a peripheral circuit element in a peripheral circuit forming region by using said mask,
wherein said insulating film includes a film for discretely accumulating charge therein, and
wherein each of said conductive lines serves as a gate electrode of a nonvolatile memory element and has a shape of a side wall spacer formed in self-alignment to said side surface of a corresponding one of said projecting island regions.

15. A method of manufacturing a semiconductor integrated circuit device, comprising steps of:
forming a conductive film covering projecting island regions each extending in a first direction such that an insulating film is formed between said projecting island regions and said conductive film;
performing anisotropic etching to said conductive film so as to form conductive lines on side surfaces of said projecting island regions such that each of said conductive lines serves as a gate electrode of an element and has a shape of a side wall spacer formed in self-alignment to said side surface of a corresponding one of said projecting island regions; and
after said anisotropic etching step, partially removing said conductive lines adjacent in a second direction crossing to said first direction by using a mask extending over said projecting island regions adjacent in said second direction.

16. A method of manufacturing a semiconductor integrated circuit device according to claim 15, wherein said insulating film includes a film for discretely accumulating charge therein, and
wherein said elements are nonvolatile memory elements.

17. A method of manufacturing a semiconductor integrated circuit device according to claim 15, wherein said conductive film is also formed to cover regions adjacent to said projecting island regions and said anisotropic etching is performed by using a mask covering contact regions to be formed from said conductive film so as to form conductive lines on side surfaces of said projecting island regions and said contact regions integrated with said conductive lines.

18. A method of manufacturing a semiconductor integrated circuit device according to claim 15, wherein said anisotropic etching is performed so as to form an electrode of a peripheral circuit element in a peripheral circuit forming region by using said mask.

19. A method of manufacturing a semiconductor integrated circuit device according to claim 11, further comprising, after said anisotropic etching step, partially removing said conductive lines adjacent in a direction crossing to said stripes by using a mask extending over said projecting island regions in said direction.

20. A method of manufacturing a semiconductor integrated circuit device according to claim 11, wherein said mask is formed to over a region covering said contact region and a part of said conductive line such that said contact region is integrated with said conductive line.

21. A method of manufacturing a semiconductor integrated circuit device according to claim 11, further comprising the steps of:
forming an insulated film over said conductive lines and said contact regions,
forming openings in said insulating film, and
forming plugs in said openings such that plugs are electrically connected to said contact regions.

22. A method of manufacturing a semiconductor integrated circuit device according to claim 11, wherein said conductive line serves as a word line and has a shape of a side wall spacer formed in self-alignment to said side surface of said projecting island region.

23. A method of manufacturing a semiconductor integrated circuit device according to claim 14, wherein said mask is formed to over a region covering said contact region and a part of said conductive line such that said contact region is integrated with said conductive line.

24. A method of manufacturing a semiconductor integrated circuit device according to claim 15, wherein said mask is formed to over a region covering said contact region and a part of said conductive line such that said contact region is integrated with said conductive line.

25. A method of manufacturing a semiconductor integrated circuit device according to claim 15, further comprising the steps of:
forming an insulating film over said conductive lines and said contact regions,
forming openings in said insulating film, and
forming plugs in said opening such that said plugs are electrically connected to said contact regions said contact regions.

26. A method of manufacturing a semiconductor integrated circuit device according to claim 15, further comprising the steps of:
forming an insulating film over said conductive lines and said contact regions,
forming openings in said insulating film, and
forming plugs in said openings such that said plugs are electrically connected to said contact said contact regions.

* * * * *